US012302715B2

(12) United States Patent
Oh et al.

(10) Patent No.: US 12,302,715 B2
(45) Date of Patent: May 13, 2025

(54) ELECTRONIC DEVICE AND DISPLAY PANEL HAVING IMPROVED TRANSMITTANCE IN A PARTIAL AREA ABOVE AN ELECTRONIC MODULE

(71) Applicant: Samsung Display Co., Ltd., Yongin-Si (KR)

(72) Inventors: Sanghoon Oh, Seoul (KR); Donghyeok Lee, Yongin-si (KR); Jongseok Kim, Gyeonggi-do (KR); Jingoo Jung, Seongnam-si (KR); Yunsik Joo, Goyang-si (KR); Kyung Hyun Choi, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 432 days.

(21) Appl. No.: 17/678,286

(22) Filed: Feb. 23, 2022

(65) Prior Publication Data

US 2023/0005998 A1 Jan. 5, 2023

(30) Foreign Application Priority Data

Jul. 2, 2021 (KR) ........................ 10-2021-0087319

(51) Int. Cl.
*H10K 59/126* (2023.01)
*H10K 59/121* (2023.01)
(Continued)

(52) U.S. Cl.
CPC ......... *H10K 59/126* (2023.02); *H10K 59/121* (2023.02); *H10K 59/131* (2023.02);
(Continued)

(58) Field of Classification Search
CPC .... H10K 59/121; H10K 50/86; H10K 59/122; H10K 59/126; H10K 59/40; H10K 59/65;
(Continued)

(56) References Cited

U.S. PATENT DOCUMENTS 10,171,636 B2  1/2019  Yeo et al.
10,366,272 B2  7/2019  Song et al.
(Continued)

FOREIGN PATENT DOCUMENTS

KR  10-2020-0102580 A  9/2020
KR  10-2021-0028296 A  3/2021
KR  10-2021-0052724 A  5/2021

*Primary Examiner* — Ratisha Mehta
*Assistant Examiner* — Brad A Knudson
(74) *Attorney, Agent, or Firm* — Innovation Counsel LLP

(57) ABSTRACT

An electronic device includes a display panel including a first area having a transmissive area and an element area and a second area disposed adjacent to the first area, and an electronic module disposed below the first area, wherein the display panel includes a substrate, a light blocking layer which is disposed on the substrate and has a first opening defining the transmissive area, pixel circuits disposed on the light blocking layer, and light emitting elements respectively connected to the pixel circuits, wherein the pixel circuits include outermost conductive patterns disposed adjacent to the transmissive area, the light blocking layer includes target portions each having a straight-line shaped edge in a plan view, and a minimum distance between an edge of each of the target portions and an edge of a corresponding one of the outermost conductive patterns is about 5 micrometers to about 20 micrometers.

24 Claims, 21 Drawing Sheets

(51) Int. Cl.
*H10K 59/131* (2023.01)
*H10K 59/65* (2023.01)
*H10K 59/122* (2023.01)
*H10K 59/123* (2023.01)
*H10K 59/38* (2023.01)
*H10K 59/40* (2023.01)
*H10K 59/80* (2023.01)

(52) U.S. Cl.
CPC ........... *H10K 59/65* (2023.02); *H10K 59/122* (2023.02); *H10K 59/123* (2023.02); *H10K 59/38* (2023.02); *H10K 59/40* (2023.02); *H10K 59/8792* (2023.02)

(58) Field of Classification Search
CPC .... H10K 59/8792; H10K 59/60; H01L 27/14; H01L 27/144; H01L 27/146
See application file for complete search history.

(56) References Cited

U.S. PATENT DOCUMENTS

| | | | |
|---|---|---|---|
| 10,756,136 B1* | 8/2020 | Ma | H10K 59/60 |
| 10,840,317 B2 | 11/2020 | Oh et al. | |
| 2020/0185643 A1* | 6/2020 | Moon | G02F 1/133528 |
| 2020/0365674 A1 | 11/2020 | Jeon et al. | |
| 2021/0066648 A1 | 3/2021 | Chung et al. | |
| 2021/0134932 A1 | 5/2021 | Chae et al. | |
| 2021/0175303 A1 | 6/2021 | Bang et al. | |
| 2021/0193741 A1* | 6/2021 | Chen | H10K 59/38 |
| 2021/0313415 A1* | 10/2021 | Ma | H10K 59/353 |
| 2022/0199731 A1* | 6/2022 | Jeong | H10K 59/60 |

* cited by examiner

ELECTRONIC DEVICE AND DISPLAY PANEL HAVING IMPROVED TRANSMITTANCE IN A PARTIAL AREA ABOVE AN ELECTRONIC MODULE

CROSS-REFERENCE TO RELATED APPLICATION

This U.S. non-provisional patent application claims priority under 35 U.S.C. § 119 to Korean Patent Application No. 10-2021-0087319, filed on Jul. 2, 2021, the entire contents of which are hereby incorporated by reference.

BACKGROUND

The present disclosure herein relates to an electronic device having improved transmittance of a partial area and having enhanced reliability by preventing the occurrence of defects, and a display panel included therein.

An electronic device may be a device constituted of various electronic parts such as a display panel and an electronic module. The electronic module may include a camera, an infrared sensor, a proximity sensor, or the like. The electronic module may be disposed below the display panel. Transmittance of a partial area of the display panel may be higher than that of another partial area of the display panel. The electronic module may receive an external input or provide an output through the partial area of the display panel.

SUMMARY

The present disclosure provides an electronic device having improved transmittance of a partial area and having enhanced reliability by preventing the occurrence of defects such as an electrode defect.

In addition, the present disclosure provides a display panel providing a high-quality image and preventing the occurrence of defects that may occur in a manufacturing process.

An embodiment of the inventive concept provides an electronic device including: a display panel including a first area having a transmissive area and an element area and a second area disposed adjacent to the first area; and an electronic module disposed below the first area of the display panel, wherein the display panel includes: a substrate; a light blocking layer which is disposed on the substrate and has a first opening defining the transmissive area; a plurality of pixel circuits disposed on the light blocking layer; and a plurality of light emitting elements electrically connected to the plurality of pixel circuits, respectively, wherein the plurality of pixel circuits include outermost conductive patterns disposed adjacent to the transmissive area, the light blocking layer includes target portions each having a straight-line shaped edge in a plan view, and a minimum distance from an edge of each of the target portions to an edge of a corresponding one of the outermost conductive patterns is about 5 micrometers to about 20 micrometers.

In an embodiment, each of the plurality of pixel circuits may further include a thin film transistor connected to a corresponding light emitting element among the plurality of light emitting elements, and each of the outermost conductive patterns is disposed closer to the transmissive area than an active of the transistor.

In an embodiment, the display panel may further include a plurality of inorganic insulating layers disposed on the light blocking layer, wherein each of the outermost conductive patterns is disposed on any one layer of the plurality of inorganic insulating layers.

In an embodiment, the display panel may further include a plurality of organic insulating layers disposed on the plurality of inorganic insulating layers, wherein a second opening overlapping the transmissive area is defined in at least some inorganic insulating layers among the plurality of inorganic insulating layers, and at least one of the plurality of organic insulating layers cover the second opening.

In an embodiment, the plurality of organic insulating layers may include: a first organic insulating layer configured to cover the second opening; and a second organic insulating layer which is disposed on the first organic insulating layer and including a third opening which overlaps the transmissive area, wherein a minimum width of the third opening is greater than a minimum width of the first opening.

In an embodiment, the outermost conductive pattern may be disposed closer to the transmissive area than an edge of the second organic insulating layer.

In an embodiment, the display panel may further include: a pixel defining film disposed on the plurality of organic insulating layers; and a spacer disposed on the pixel defining film.

In an embodiment, the display panel may include: a plurality of first pixel groups disposed in the element area; and a plurality of signal lines connected to the plurality of first pixel groups, wherein each of the outermost conductive patterns is disposed at an area where each of the plurality of first pixel groups is connected to an adjacent one of the first pixel groups through the plurality of signal lines.

In an embodiment, each of the target portions may be disposed at an area where a first light blocking pattern, which overlaps any one of the plurality of first pixel groups in a plan view, is connected to a light blocking connection part disposed adjacent to the first light blocking pattern.

In an embodiment, the plurality of first pixel groups may include: first connector pixel groups disposed adjacent to the second area among the plurality of first pixel groups; and first central pixel groups disposed to be spaced apart from the second area with the first connector pixel groups interposed between the first connector pixel groups and the first central pixel groups, wherein a planar shape of each of first light blocking patterns, which are respectively disposed in the first central pixel groups is different from a planar shape of each of second light blocking patterns which are respectively disposed in the first connector pixel groups.

In an embodiment, the first connector pixel groups may include: 1-$1^{st}$ connector pixel groups disposed in a corner portion of the first area; and 1-$2^{nd}$ connector pixel groups disposed in a side portion of the first area, and the second light blocking patterns may include: 2-$1^{st}$ light blocking patterns respectively overlapping the 1-$1^{st}$ connector pixel groups; and 2-$2^{nd}$ light blocking patterns respectively overlapping the 1-$2^{nd}$ connector pixel groups, wherein, in each of the 2-$1^{st}$ light blocking patterns, protrusion patterns which protrude toward the transmissive area are disposed in one quadrant disposed close to the transmissive area and protrusion patterns are not disposed in remaining three quadrants, and in each of the 2-$2^{nd}$ light blocking patterns, protrusion patterns which protrude toward a transmissive area are disposed in two quadrants disposed close to the transmissive area and protrusion patterns are not disposed in remaining two quadrants.

In an embodiment, the signal lines may include outer signal lines at least one of which extend along an edge of each of the first pixel groups, wherein the outermost conductive patterns are included in the outer signal lines.

In an embodiment, the outer signal lines may include: an 1-1st outer signal line extending in a horizontal direction and bypassing the pixel circuits over an upper side of the pixel circuits; a 1-2nd outer signal line extending in the horizontal direction and bypassing the pixel circuits under a lower side of the pixel circuits; 2-1st outer signal lines extending in a vertical direction and bypassing the pixel circuits on a left side of the pixel circuits; and 2-2nd outer signal lines extending in the vertical direction and bypassing the pixel circuits on a right side of the pixel circuits, wherein an outermost conductive pattern included in the 1-1st outer signal line is disposed on the same layer as an outermost conductive pattern included in the 2-2nd outer signal lines, an outermost conductive pattern included in the 1-2nd outer signal line is disposed on the same layer as an outermost conductive pattern included in the 2-1st outer signal lines, and the outermost conductive pattern included in the 1-1st outer signal line and the outermost conductive pattern included in the 1-2nd outer signal line are disposed on different layers.

In an embodiment, a voltage line may be connected to at least a portion of the light blocking layer and a driving voltage may be applied to the light blocking layer through the voltage line.

In an embodiment, the display panel may further include: an encapsulation layer configured to cover the plurality of light emitting elements; and a sensor layer disposed on the encapsulation layer, wherein the sensor layer includes a sensor base layer disposed on the encapsulation layer, a first sensor conductive layer disposed on the sensor base layer, a sensor insulating layer disposed on the first sensor conductive layer, a second sensor conductive layer disposed on the sensor insulating layer, and a sensor cover layer configured to cover the second sensor conductive layer, wherein the sensor base layer, the sensor insulating layer, and the sensor cover layer cover an area overlapping the first opening.

In an embodiment, the display panel may further include an anti-reflection layer disposed on the sensor layer, wherein the anti-reflection layer includes a division layer in which a plurality of division openings respectively overlapping the plurality of light emitting elements are defined, and a plurality of color filters disposed to respectively correspond to the plurality of division openings.

In an embodiment, a transmissive opening overlapping the first opening may be defined in the division layer, and an edge of the transmissive opening may be substantially aligned with an edge of the first opening.

In an embodiment, the light blocking layer may include a first protrusion pattern protruding toward the transmissive area and the division layer may include a second protrusion pattern protruding toward the transmissive area, wherein an outer contour of the first protrusion pattern and an outer contour of the second protrusion pattern are substantially the same.

In an embodiment, each of the plurality of light emitting elements may include a pixel electrode, a light emitting layer disposed on the pixel electrode, and a common electrode disposed on the light emitting layer, wherein the common electrode includes an electrode opening overlapping the first opening in a plan view, and a minimum width of the electrode opening is greater than a minimum width of the first opening.

In an embodiment, each of the plurality of light emitting elements may further include a first functional layer disposed between the pixel electrode and the light emitting layer and a second functional layer disposed between the light emitting layer and the common electrode, wherein the first functional layer and the second functional layer cover an area overlapping the first opening.

In an embodiment, the pixel electrode of each of the plurality of light emitting elements may be disposed in the element area or the second area.

In an embodiment of the inventive concept, an electronic device includes: a display panel including a first area having a transmissive area and an element area, and a second area disposed adjacent to the first area; and an electronic module disposed below the first area of the display panel, wherein the display panel includes: a substrate; a light blocking layer which is disposed on the substrate and has a first opening defining the transmissive area; a plurality of light emitting elements disposed on the light blocking layer; and an anti-reflection layer disposed on the plurality of light emitting elements, wherein the anti-reflection layer includes: a division layer in which a plurality of division openings respectively overlapping the plurality of light emitting elements are defined; and a plurality of color filters disposed to respectively correspond to the plurality of division openings, wherein the division layer includes a transmissive opening overlapping the first opening, and an edge of the transmissive opening is substantially aligned with an edge of the first opening in a plan view.

In an embodiment of the inventive concept, a display panel includes a first area including a transmissive area and an element area, and a second area disposed adjacent to the first area. The display panel includes: a substrate; a light blocking layer which is disposed on the substrate and includes a first opening; a circuit layer which is disposed on the light blocking layer and includes a plurality of insulating layers and a plurality of conductive patterns; a light emitting element layer which is disposed on the circuit layer and includes a plurality of light emitting layers disposed in an area spaced apart from the first opening in a plan view; and an encapsulation layer configured to cover the light emitting element layer, wherein the plurality of conductive patterns include outermost conductive patterns disposed adjacent to the transmissive area, the light blocking layer includes target portions each having a straight-line shaped edge in a plan view, and a minimum distance from an edge of each of the target portions to an edge of a corresponding one of the outermost conductive patterns is about 5 micrometers to about 20 micrometers.

In an embodiment, each of the target portions is disposed at an area where a first light blocking pattern, which overlaps any one of a plurality of first pixel groups in a plan view, is connected to a light blocking connection part disposed adjacent to the first light blocking pattern

BRIEF DESCRIPTION OF DRAWINGS

The accompanying drawings are included to provide a further understanding of the inventive concept, and are incorporated in and constitute a part of this specification. The drawings illustrate embodiments of the inventive concept and, together with the description, serve to describe principles of the inventive concept. In the drawings.

DETAILED DESCRIPTION

Figure 1A:
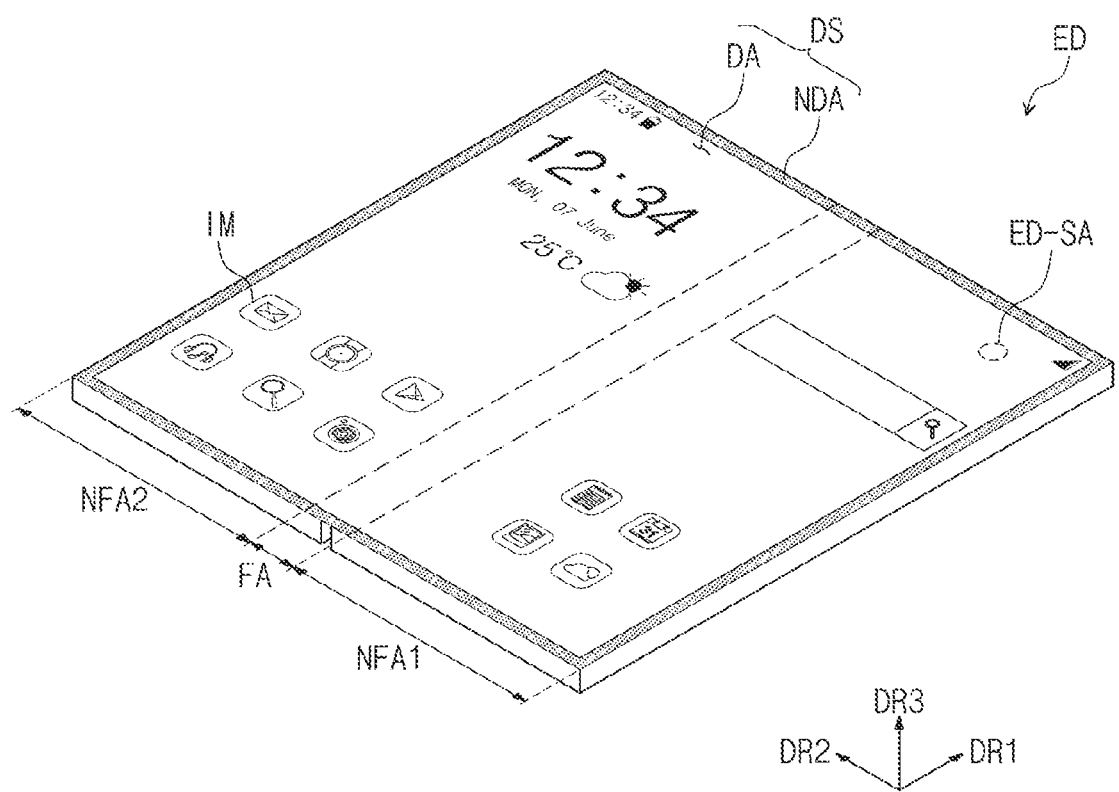
FIG. 1A and FIG. 1B are perspective views of an electronic device according to an embodiment of the inventive concept.

It will be understood that when an element or layer is referred to as being "on", "connected to", or "coupled to" another element or layer, it can be directly on, connected to, or coupled to the other element or layer, or intervening elements or layers may be present.

Like reference numerals refer to like elements throughout this specification. In the figures, the thicknesses, ratios, and dimensions of elements are exaggerated for effective description of the technical contents. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention. As used herein, the singular forms, "a", "an", and "the" are intended to include the plural forms as well, unless the context clearly indicates otherwise.

Spatially relative terms, such as "beneath", "below", "lower", "above", and "upper" may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "include" or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having meaning that is consistent with their meaning in the context of the relevant art and should not be interpreted in an overly idealized or overly formal sense unless expressly so defined herein.

Hereinafter, the present invention will be explained in detail with reference to the accompanying drawings.

Figure 1B:
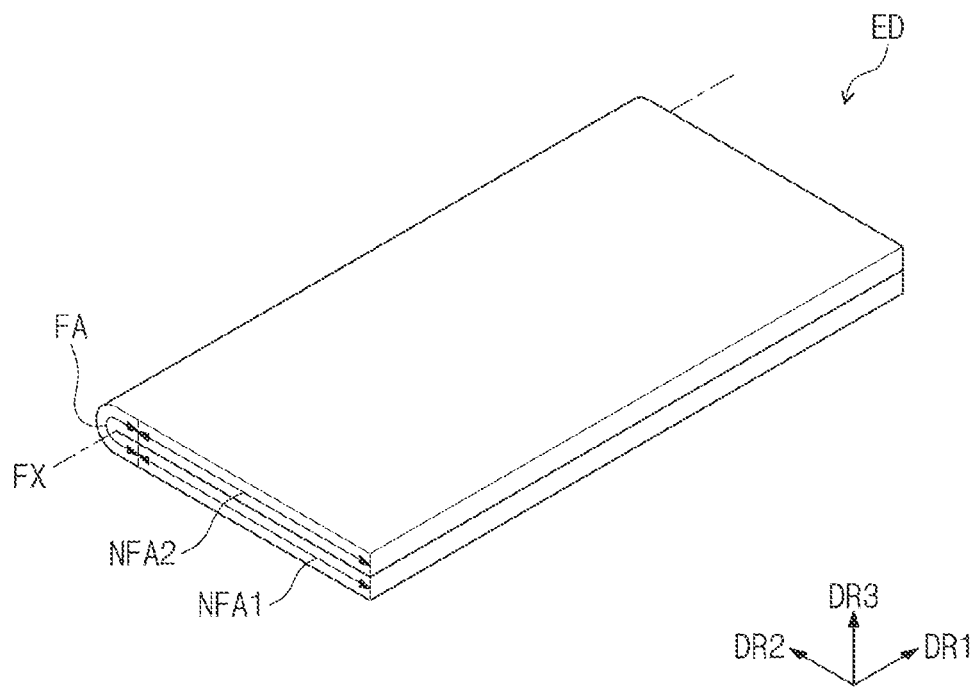

FIG. 1A and FIG. 1B are perspective views of an electronic device ED according to an embodiment of the inventive concept. FIG. 1A illustrates an unfolded state of the electronic device ED, and FIG. 1B illustrates a folded state of the electronic device ED.

Referring to FIG. 1A and FIG. 1B, the electronic device ED according to an embodiment of the inventive concept may include a display surface DS defined by a first direction DR1 and a second direction DR2 crossing the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, an embodiment of the inventive concept is not limited thereto, and shapes of the display area DA and the non-display area NDA may be changed.

Hereinafter, a direction substantially perpendicular to a plane defined by the first direction DR1 and the second direction DR2 is defined as a third direction DR3. In addition, "in a plan view" may be defined in this specification as a state of being viewed in the third direction DR3.

A sensing area ED-SA may be defined in the display area DA of the electronic device ED. Although one sensing area ED-SA is exemplarily illustrated in FIG. 1A, the number of sensing areas ED-SA is not limited thereto. The sensing area ED-SA may be a portion of the display area DA. Accordingly, the electronic device ED may display an image through the sensing area ED-SA.

An electronic module may be disposed in an area overlapping the sensing area ED-SA. The electronic module may receive an external input transmitted through the sensing area ED-SA or provide an output through the sensing area ED-SA. For example, the electronic module may be a camera module, a sensor measuring distance, such as a proximity sensor, a sensor identifying a part of a user's body (e.g., a fingerprint, an iris, or a face), or a small lamp outputting light, but the electronic module is not particularly limited thereto. Hereinafter, the electronic module overlapping the sensing area ED-SA is described as a camera module as an example.

The electronic device ED may include a folding area FA and a plurality of non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2. The folding area FA may be referred to as a foldable area, and the first and second non-folding areas NFA1 and NFA2 may be respectively referred to as first and second non-foldable areas.

As illustrated in FIG. 1B, the folding area FA may be folded about a folding axis FX which extends parallel to the first direction DR1. In a state in which the electronic device ED is folded, the folding area FA has a predetermined curvature and a predetermined radius of curvature. The electronic device ED may be inner-folded so that the first non-folding area NFA1 and the second non-folding area NFA2 face each other, and the display surface DS is not exposed to the outside.

In an embodiment of the inventive concept, the electronic device ED may be outer-folded so that the display surface DS is exposed to the outside. Although, in an embodiment of the inventive concept, the electronic device ED may be configured so that an inner-folding operation, an outer-folding operation and an unfolding operation are repeated, an embodiment is not limited thereto. In an embodiment of the inventive concept, the electronic device ED may be configured so that any one of the unfolding operation, the inner-folding operation, and the outer-folding operation is selected.

Although the foldable electronic device ED is described as an example in FIG. 1A and FIG. 1B, the application of an embodiment of the inventive concept is not limited to the foldable electronic device ED. For example, an embodiment of the inventive concept may be applied to a rigid electronic device, for example, an electronic device that does not include the folding area FA.

Figure 2A:
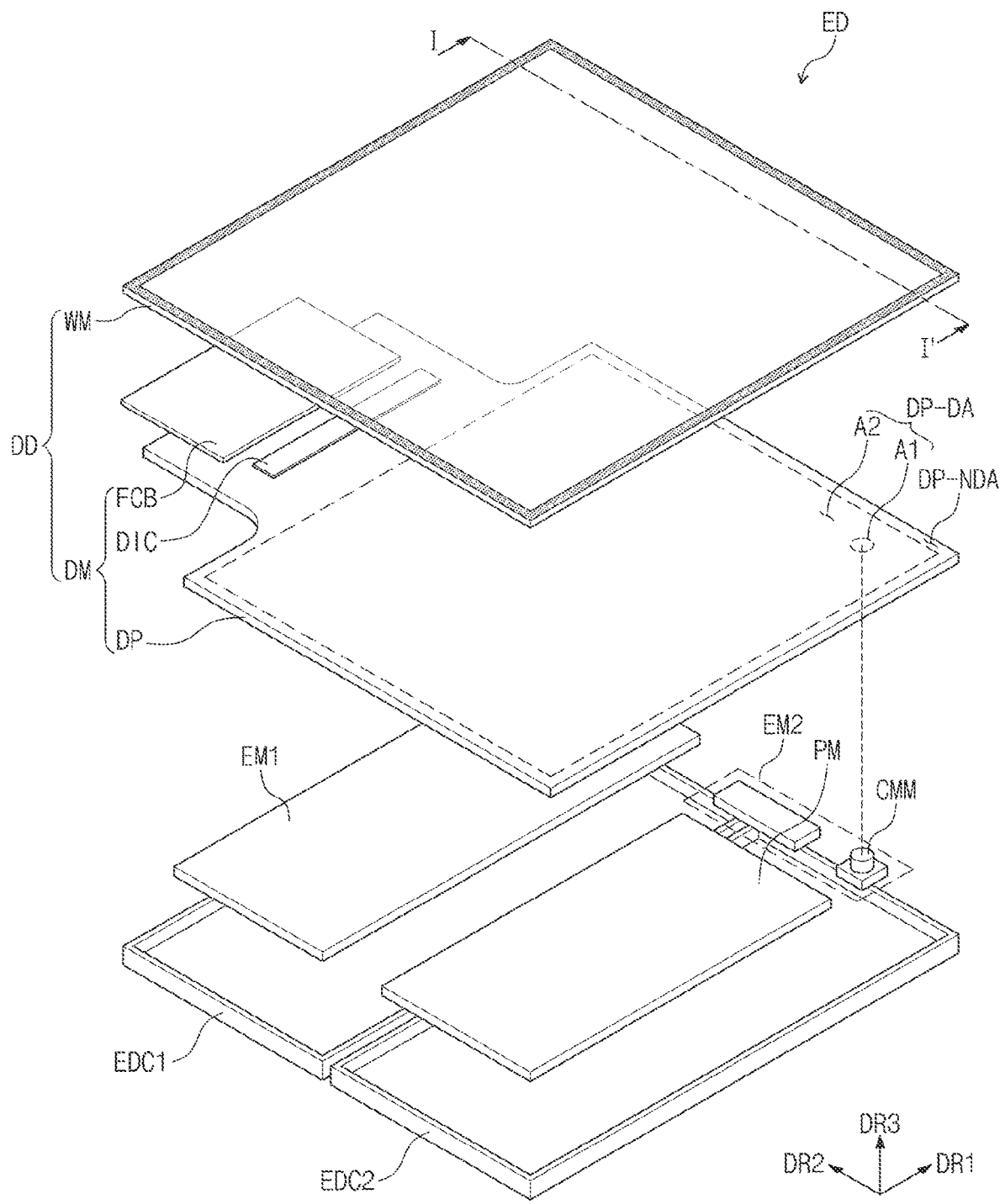
FIG. 2A is an exploded perspective view of an electronic device according to an embodiment of the inventive concept.
Figure 2B:
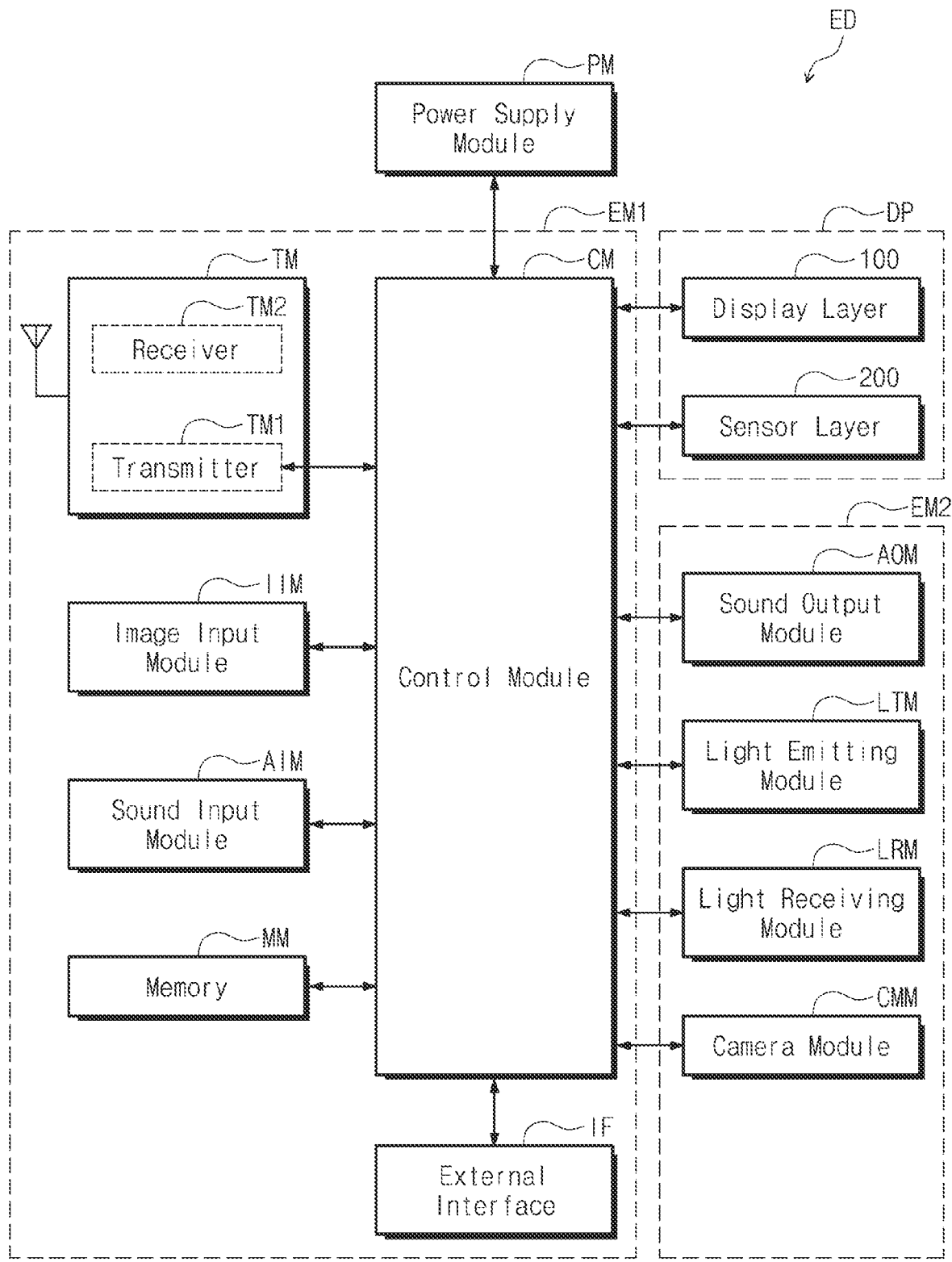
FIG. 2B is a block diagram of an electronic device according to an embodiment of the inventive concept.

FIG. 2A is an exploded perspective view of the electronic device ED according to an embodiment of the inventive concept. FIG. 2B is a block diagram of the electronic device ED according to an embodiment of the inventive concept.

Referring to FIG. 2A and FIG. 2B, the electronic device ED may include a display device DD, a first electronic module EM1, a second electronic module EM2, a power supply module PM, and housings EDC1 and EDC2. Although not illustrated separately, a mechanical structure for controlling a folding operation of the display device DD may be further included in the electronic device ED.

The display device DD includes a window module WM and a display module DM. The window module WM provides a front surface of the electronic device ED. The display module DM may include at least a display panel DP. The display module DM generates an image and senses an external input.

Although the display module DM is illustrated in FIG. 2A as being the same as the display panel DP, the display module DM may be substantially a laminated structure in which a plurality of components including the display panel DP are laminated. A detailed description of the laminated structure of the display module DM will be given later.

The display panel DP includes a display area DP-DA and a non-display area DP-NDA respectively corresponding to the display area DA (see FIG. 1A) and the non-display area NDA (see FIG. 1A) of the electronic device ED. In this specification, "an area/portion corresponds to another area/portion" means that the areas/portions overlap each other, but the areas/portions are not limited to having the same surface area.

The display area DP-DA may include a first area A1 and a second area A2. The first area A1 may overlap or correspond to the sensing area ED-SA (see FIG. 1A) of the electronic device ED. Although the first area A1 is illustrated as a circular shape in this embodiment, the first area A1 may have various shapes such as a polygon, an ellipse, a figure having at least one curved side, and an atypical shape, and is not limited to any one embodiment. The first area A1 may be referred to as a component area, and the second area A2 may be referred to as a main display area or a general display area.

The first area A1 may have a higher transmittance than the second area A2. In addition, the resolution of the first area A1 may be lower than that of the second area A2. The first area A1 may overlap a camera module CMM to be described later.

The display panel DP may include a display layer 100 and a sensor layer 200.

The display layer 100 may be a component that substantially generates an image. The display layer 100 may be a light emitting display layer and may be, for example, an organic light emitting display layer, an inorganic light emitting display layer, an organic-inorganic light emitting display layer, a quantum dot display layer, a micro-LED display layer, or a nano-LED display layer.

The sensor layer 200 may sense an external input applied from the outside. The external input may be a user's input. The user's input may include various types of external inputs, such as a part of the user's body, light, heat, a pen, and pressure.

The display module DM may include a display panel DP, a driving chip DIC disposed in the non-display area DP-NDA. The display module DM may further include a flexible circuit film FCB coupled to the non-display area DP-NDA.

The driving chip DIC may include driving elements for driving pixels of the display panel DP, e.g., a data driving circuit. Although FIG. 2A illustrates a structure in which the driving chip DIC is mounted on the display panel DP, an embodiment of the inventive concept is not limited thereto. For example, the driving chip DIC may be mounted on the flexible circuit film FCB.

The power supply module PM supplies power required for an overall operation of the electronic device ED. The power supply module PM may include a typical battery module.

The first electronic module EM1 and the second electronic module EM2 include various functional modules for operating the electronic device ED. Each of the first electronic module EM1 and the second electronic module EM2 may be directly mounted on a motherboard electrically connected to the display panel DP or may be mounted on a separate board to be electrically connected to the motherboard through a connector (not illustrated) and the like.

The first electronic module EM1 may include a control module CM, a wireless communication module TM, an image input module IIM, a sound input module AIM, memory MM, and an external interface IF.

The control module CM controls the overall operation of the electronic device ED. The control module CM may be a microprocessor. For example, the control module CM activates or deactivates the display panel DP. The control module CM may control other modules such as the image input module IIM and the sound input module AIM in response to a touch signal received from the display panel DP.

The wireless communication module TM may communicate with an external electronic device through a first network (e.g., a short-range communication network such as Bluetooth, WiFi direct, and infrared data association (IrDA)) or a second network (e.g., a telecommunication network such as a cellular network, the Internet, and a computer network (e.g., LAN or WAN)). Communication modules included in the wireless communication module TM may be integrated into one component (e.g., a single chip) or implemented as a plurality of components (e.g., a plurality of chips) separated from each other. The wireless communication module TM may transmit/receive a voice signal using a general communication line. The wireless communication module TM may include a transmitter TM1 for modulating and transmitting a signal to be transmitted, and a receiver TM2 for demodulating a received signal.

The image input module IIM processes an image signal and converts the processed image signal into image data that may be displayed on the display panel DP. The sound input module AIM receives an external sound signal by using a microphone in a recording mode, a voice recognition mode, and the like, and converts the received external sound signal into electrical voice data.

The external interface IF may include a connector capable of physically connecting the electronic device ED to an external electronic device. For example, the external interface IF serves as an interface which is connected to an external charger, a wired/wireless data port, a card socket (e.g., a memory card and a SIM/UIM card), and the like.

The second electronic module EM2 may include a sound output module AOM, a light emitting module LTM, a light receiving module LRM, the camera module CMM, and the like. The sound output module AOM converts sound data received from the wireless communication module TM or sound data stored in the memory MM and outputs the converted sound data to the outside.

The light emitting module LTM generates and outputs light. The light emitting module LTM may output infrared rays. The light emitting module LTM may include an LED element. The light receiving module LRM may sense infrared rays. The light receiving module LRM may be activated when infrared rays having a predetermined level or higher are sensed. The light receiving module LRM may include a CMOS image sensor. After infrared rays generated by the light emitting module LTM are outputted, the infrared rays may be reflected by an external object (e.g., a user's finger or face), and the reflected infrared rays may be incident on the light receiving module LRM.

The camera module CMM may capture a still image and a moving image. The camera module CMM may be provided in plurality. Some of the camera modules CMM may overlap the first area A1. An external input (e.g., light) may be provided to the camera module CMM through the first area A1. For example, the camera module CMM may receive natural light through the first area A1 to capture an external image.

The housings EDC1 and EDC2 accommodate the display module DM, the first and second electronic modules EM1 and EM2, and the power supply module PM. The housings EDC1 and EDC2 protect the components accommodated in the housings EDC1 and EDC2, such as the display module DM, the first and second electronic modules EM1 and EM2, and the power supply module PM. Although FIG. 2A exemplarily illustrates two housings EDC1 and EDC2 separated from each other, an embodiment is not limited thereto. Although not illustrated, a hinge structure for connecting the two housings EDC1 and EDC2 may be further included in the electronic device ED. The housings EDC1 and EDC2 may be coupled to the window module WM.

Figure 3:
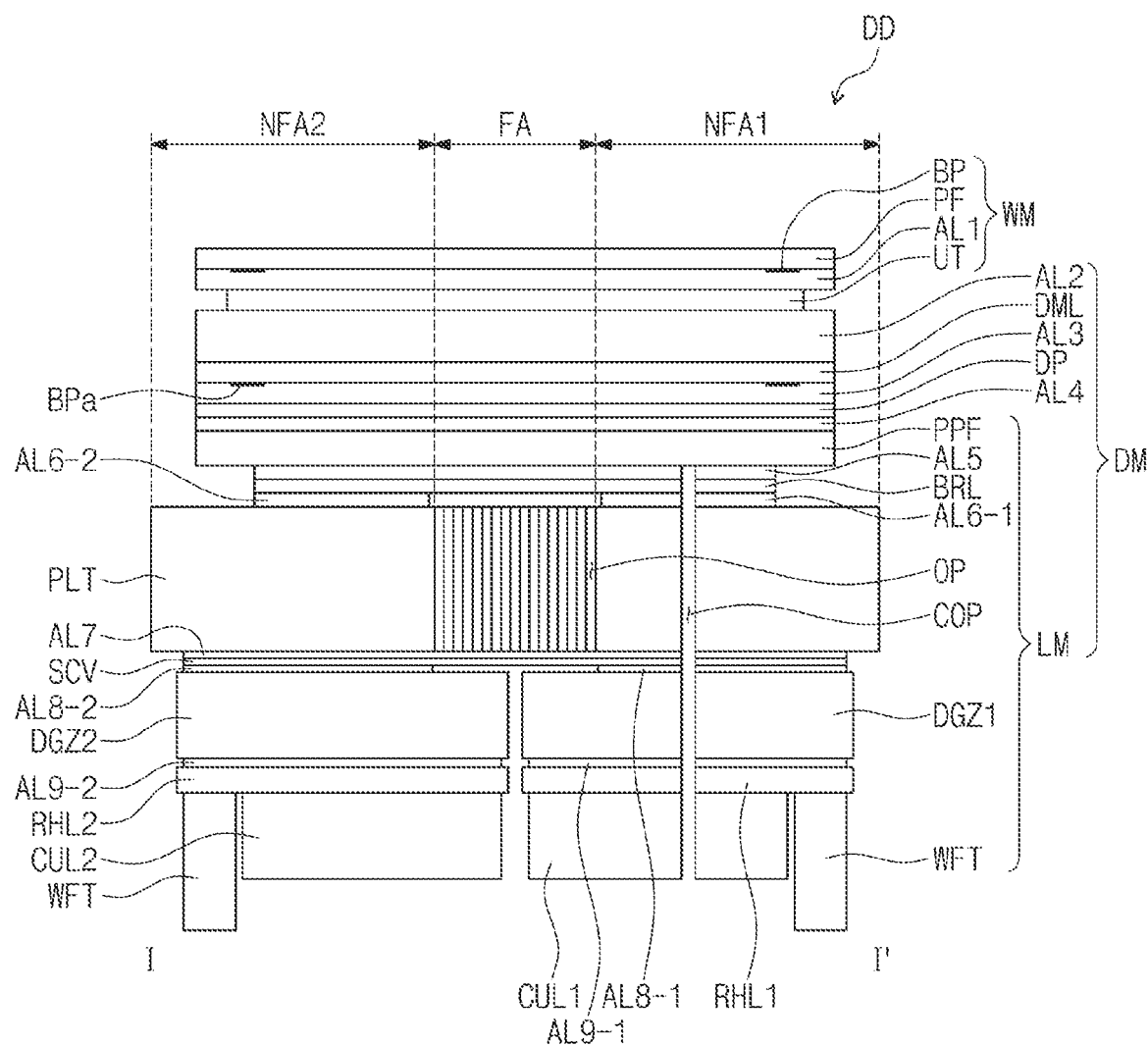
FIG. 3 is a cross-sectional view of a display device according to an embodiment of the inventive concept.
Figure 3:
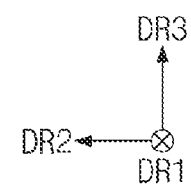

FIG. 3 is a cross-sectional view of the display device DD taken along line I-I' of FIG. 2A according to an embodiment of the inventive concept.

Referring to FIG. 3, the display device DD may include the window module WM and the display module DM.

The window module WM may include a window UT, a protective film PF disposed on the window UT, and a bezel pattern BP.

The window UT may be chemically reinforced glass. As the window UT is applied to the display device DD, the occurrence of wrinkles may be minimized even when folding and unfolding operations are repeated.

The protective film PF may include polyimide, polycarbonate, polyamide, triacetylcellulose, polymethylmethacrylate, or polyethylene terephthalate. Although not illustrated separately, at least one of a hard coating layer, an anti-fingerprint layer, or an anti-reflection layer may be disposed on a top surface of the protective film PF.

The bezel pattern BP overlaps the non-display area NDA illustrated in FIG. 1A. The bezel pattern BP may be disposed on one surface of the window UT or one surface of the protective film PF. FIG. 3 exemplarily illustrates the bezel pattern BP disposed on a bottom surface of the protective film PF. The location of the bezel pattern BP is not limited thereto and may also be disposed on a top surface of the protective film PF, a top surface of the window UT, or a bottom surface of the window UT. The bezel pattern BP is a colored light blocking film and may be formed, for example, in a coating method. The bezel pattern BP may include a base material and a dye or pigment mixed with the base material. The bezel pattern BP may have a closed line shape in a plan view.

A first adhesive layer AU may be disposed between the protective film PF and the window UT. The first adhesive layer AU may be a pressure sensitive adhesive (PSA) film or an optically clear adhesive (OCA). Adhesive layers to be described later may be the same as the first adhesive layer AU and may include a typical adhesive.

The first adhesive layer AU may have a thickness sufficient to cover the bezel pattern BP. For example, the thickness of the bezel pattern BP may be about three micrometers to about eight micrometers, and the first adhesive layer AU may have a thickness of a level at which bubbles are not generated on the periphery of the bezel pattern BP.

The first adhesive layer AU may be detached from the window UT. Because the strength of the protective film PF is lower than that of the window UT, scratches may occur relatively easily in the protective film PF. After the first adhesive layer AL1 and the damaged protective film PF are detached from the window UT, a new protective film PF may be attached to the window UT.

The display module DM may include an impact absorbing layer DML, the display panel DP, and a lower member LM.

The impact absorbing layer DML may be disposed on the display panel DP. The impact absorbing layer DML may be a functional layer for protecting the display panel DP from external impact. The impact absorbing layer DML may be bonded to the window UT through a second adhesive layer AL2 and may be bonded to the display panel DP through a third adhesive layer AL3.

An additional bezel pattern BPa overlaps the non-display area NDA illustrated in FIG. 1A. The additional bezel pattern BPa may be disposed on one surface of the impact absorbing layer DML. FIG. 3 exemplarily illustrates the additional bezel pattern BPa disposed on a bottom surface of the impact absorbing layer DML. The additional bezel pattern BPa may include the same material as the above-described bezel pattern BP. In an embodiment of the inventive concept, the additional bezel pattern BPa may be omitted.

The lower member LM may be disposed on a lower portion of the display panel DP. The lower member LM may be bonded to the display panel DP through a fourth adhesive layer AL4. The lower member LM may include a panel protective layer PPF, a barrier layer BRL, a support layer PLT, a cover layer SCV, a first digitizer DGZ1, a second digitizer DGZ2, a first lower plate RHL1, a second lower plate RHL2, a first cushion layer CUL1, a second cushion layer CUL2, and a waterproof tape WFT. In an embodiment of the inventive concept, the lower member LM may not include some of the above-described components or may further include other components. In addition, a laminating order of the components illustrated in FIG. 3 is only an example and may be altered as needed.

The panel protective layer PPF may be disposed on the lower portion of the display panel DP. The fourth adhesive layer AL4 may bond the panel protective layer PPF to the display panel DP. The panel protective layer PPF may protect the lower portion of the display panel DP. The panel protective layer PPF may include a flexible plastic material. The panel protective layer PPF may prevent scratches from being generated on a rear surface of the display panel DP during a manufacturing process of the display panel DP. The panel protective layer PPF may be a colored polyimide film. For example, the panel protective layer PPF may be an opaque yellow film but is not limited thereto.

The barrier layer BRL may be disposed on a lower portion of the panel protective layer PPF. A fifth adhesive layer AL5 may be disposed between the panel protective layer PPF and the barrier layer BRL to bond the barrier layer BRL to the panel protective layer PPF. The barrier layer BRL may increase resistance to a compressive force caused by external pressing. Accordingly, the barrier layer BRL may serve to prevent deformation of the display panel DP. The barrier layer BRL may include a flexible plastic material such as polyimide and polyethylene terephthalate.

In addition, the barrier layer BRL may absorb light incident from the outside. The barrier layer BRL may include a light blocking material or may be a colored film having low light transmittance. For example, the barrier layer BRL may be a black plastic film and may be, for example, a black polyimide film. When the display module DM is viewed from above the window module WM, the components disposed on a lower portion of the barrier layer BRL may not be viewed by a user.

The support layer PLT is disposed on the lower portion of the barrier layer BRL. The support layer PLT supports the components disposed on the support layer PLT and maintains an unfolded state and a folded state of the display device DD. In an embodiment of the inventive concept, the support layer PLT may include at least a first support part corresponding to the first non-folding area NFA1, a second support part corresponding to the second non-folding area NFA2, and a folding part corresponding to the folding area FA. The first support part and the second support part may be spaced apart from each other in the second direction DR2. The folding part may be disposed between the first support part and the second support part, and a plurality of openings OP may be defined in the folding part. The flexibility of a portion of the support layer PLT may be improved by the openings OP. The flexibility of the portion of the support layer PLT overlapping the folding area FA may be improved by the openings OP.

The support layer PLT may include carbon fiber reinforced plastic (CFRP) but the material forming the support layer PLT is not particularly limited thereto. Alternatively, the first support part and the second support part may include a non-metallic material, plastic, glass fiber reinforced plastic, or glass. The plastic may include polyimide, polyethylene, or polyethylene terephthalate, but the material forming the plastic is not particularly limited. The first support part and the second support part may include the same material. The folding part may include the same material as the first and second support parts, or may include a material different from that of the first and second support parts. For example, the folding part may include a material having an elastic modulus of about 60 GPa or higher and may include a metal material such as stainless steel. Although the folding part may include, e.g., SUS 304, the material forming the folding part is not limited thereto and may include various metal materials.

A sixth adhesive layer AL6-1 and AL6-2 may be disposed between the barrier layer BRL and the support layer PLT. The sixth adhesive layer AL6-1 and AL6-2 may bond the barrier layer BRL to the support layer PLT. The sixth adhesive layer AL6-1 and AL6-2 may not overlap the plurality of openings OP in a plan view. In addition, the sixth adhesive layer AL6-1 and AL6-2 may be spaced apart from the plurality of openings OP in a plan view.

The sixth adhesive layer AL6-1 and AL6-2 may include a first part AL6-1 and a second part AL6-2 spaced apart from each other. The first part AL6-1 and the second part AL6-2 may be spaced apart from each other with the plurality of openings OP disposed therebetween. The first part AL6-1 may overlap the first non-folding area NFA1, the second part AL6-2 may overlap the second non-folding area NFA2, and each of the first part AL6-1 and the second part AL6-2 may not overlap the folding area FA. Because the sixth adhesive layer AL6-1 and AL6-2 is not disposed in an area corresponding to the folding area FA, the flexibility of the support layer PLT may be improved.

In an area overlapping the folding area FA, the barrier layer BRL may be spaced apart from the support layer PLT. That is, an empty space may be defined between the support layer PLT and the barrier layer BRL in the area overlapping the folding area FA.

Because the empty space is defined between the barrier layer BRL and the support layer PLT, the shape of the plurality of openings OP defined in the support layer PLT may not be viewed from outside of the electronic device ED (see FIG. 1A) when the electronic device ED (see FIG. 1A) is folded.

In addition, as the barrier layer BRL includes the light blocking material or employs the colored film having low light transmittance, a color difference in the support layer PLT may not be viewed from the outside. For example, in the support layer PLT, a color difference may not be viewed from the outside between a first support area having the plurality of openings OP defined therein and a second support area not having the plurality of openings OP defined therein. The first support area may be an area overlapping the folding area FA, and the second support area may be an area overlapping the first non-folding area NFA1 and the second non-folding area NFA2.

The sixth adhesive layer AL6-1 and AL6-2 may be thinner than the fifth adhesive layer AL5. For example, a thickness of the fifth adhesive layer AL5 may be about 25 micrometers, and a thickness of the sixth adhesive layer AL6-1 and AL6-2 may be about 16 micrometers.

As the sixth adhesive layer AL6-1 and AL6-2 becomes thinner, a step due to the sixth adhesive layer AL6-1 and AL6-2 may be reduced. As the step becomes smaller, there is an advantage of decreasing shape deformation of the laminated components caused by folding and unfolding operations of the electronic device ED (see FIG. 1A), but the plurality of openings OP may be viewed, or the sixth adhesive layer AL6-1 and AL6-2 may be separated by repeated folding operations. As the sixth adhesive layer AL6-1 and AL6-2 becomes thicker, the plurality of openings OP may not be viewed, and there is an advantage that reliability of the adhesive force of the sixth adhesive layer AL6-1 and AL6-2 is enhanced when folding operations are repeated, but the step may increase. Accordingly, the thickness of the sixth adhesive layer AL6-1 and AL6-2 may be selected within an appropriate range in consideration of folding reliability, adhesion reliability, and the probability that the plurality of openings OP are viewed.

A seventh adhesive layer AL7 may be disposed on a lower portion of the support layer PLT, and the cover layer SCV may be disposed on a lower portion of the seventh adhesive layer AL7. The support layer PLT and the cover layer SCV may be bonded to each other by the seventh adhesive layer AL7. The cover layer SCV may be manufactured in the form of a sheet and attached to the support layer PLT.

The seventh adhesive layer AL7 and the cover layer SCV may cover the plurality of openings OP defined in the support layer PLT. Accordingly, the cover layer SCV may prevent foreign matter from being introduced into the plurality of openings OP. The cover layer SCV may have a lower elastic modulus than the support layer PLT. For example, the cover layer SCV may include thermoplastic polyurethane, rubber, or silicone, but is not limited thereto.

An eighth adhesive layer AL8-1 and AL8-2 may be disposed on a lower portion of the cover layer SCV. The eighth adhesive layer AL8-1 and AL8-2 may include a first part AL8-1 and a second part AL8-2. The first part AL8-1 and the second part AL8-2 may be spaced apart from each other. In a plan view, the first part AL8-1 and the second part AL8-2 may be spaced apart from each other with the plurality of openings OP disposed therebetween. The first part AL8-1 and the second part AL8-2 may not overlap the folding area FA in a plan view.

The first digitizer DGZ1 and the second digitizer DGZ2 may be respectively disposed on lower portions of the first part AL8-1 and the second part AL8-2. The first digitizer DGZ1 may be attached to the first part AL8-1, and the second digitizer DGZ2 may be attached to the second part AL8-2. The first digitizer DGZ1 and the second digitizer DGZ2 are disposed to be spaced apart from each other with a predetermined gap disposed therebetween. The gap may be disposed to correspond to the folding area FA. In a plan view, a portion of the first digitizer DGZ1 may overlap a portion of the plurality of openings OP, and a portion of the second digitizer DGZ2 may overlap another portion of the plurality of openings OP.

Each of the first and second digitizers DGZ1 and DGZ2 may include a plurality of loop coils that generate a magnetic field having a preset resonance frequency with an electronic pen. The first and second digitizers DGZ1 and DGZ2 may be referred to as an electromagnetic radiation (EMR) sensing panel.

The magnetic field generated in the first digitizer DGZ1 and the second digitizer DGZ2 is applied to an LC resonance circuit that includes an inductor (a coil) and a capacitor of the pen. The coil generates a current by the received magnetic field and transmits the generated current to the capacitor. Accordingly, the capacitor charges the current input from the coil and discharges the charged current to the coil. As a result, a magnetic field of the resonance frequency is emitted from the coil. The magnetic field emitted by the pen may be absorbed again by the loop coils of the digitizers, and accordingly, the location of the pen may be determined.

A ninth adhesive layer AL9-1 and AL9-2 may be disposed on lower portions of the first digitizer DGZ1 and the second digitizer DGZ2. The ninth adhesive layer AL9-1 and AL9-2 may include a first part AL9-1 and a second part AL9-2. The first part AL9-1 and the second part AL9-2 may be spaced apart from each other.

The first lower plate RHL1 and the second lower plate RHL2 may be respectively disposed on lower portions of the first part AL9-1 and the second part AL9-2. The first lower plate RHL1 and the second lower plate RHL2 may protect the components on the first lower plate RHL1 and the second lower plate RHL2 from external pressure. The first lower plate RHL1 and the second lower plate RHL2 may include SUS 316 but the material forming the first lower plate RHL1 and the second lower plate RHL2 are not particularly limited thereto.

The first cushion layer CUL1 and the second cushion layer CUL2 may be respectively disposed on lower portions of the first lower plate RHL1 and the second lower plate RHL2. The first cushion layer CUL1 and the second cushion layer CUL2 may absorb external impact to protect the display panel DP. The first cushion layer CUL1 and the second cushion layer CUL2 may include a foam sheet having a predetermined elastic force. Each of the first cushion layer CUL1 and the second cushion layer CUL2 may include a sponge or polyurethane.

The waterproof tape WFT may be attached to the first lower plate RHL1 and the second lower plate RHL2. For example, the waterproof tape WFT may be disposed outside the first cushion layer CUL1 and the second cushion layer CUL2. The waterproof tape WFT may be attached to a set bracket (not illustrated). A thickness of the waterproof tape WFT may be greater than a thickness of each of the first cushion layer CUL1 and the second cushion layer CUL2. Even when the electronic device ED (see FIG. 2A) is submerged into water, the waterproof tape WFT may reduce the risk that the driving chip DIC (see FIG. 2A) is damaged.

A through-hole COP may be defined in at least some of the components constituting the lower member LM. The through-hole COP may overlap or correspond to the sensing area ED-SA (see FIG. 1A) of the electronic device ED. At least a portion of the camera module CMM (see FIG. 2A) may be inserted into the through-hole COP.

Figure 4:
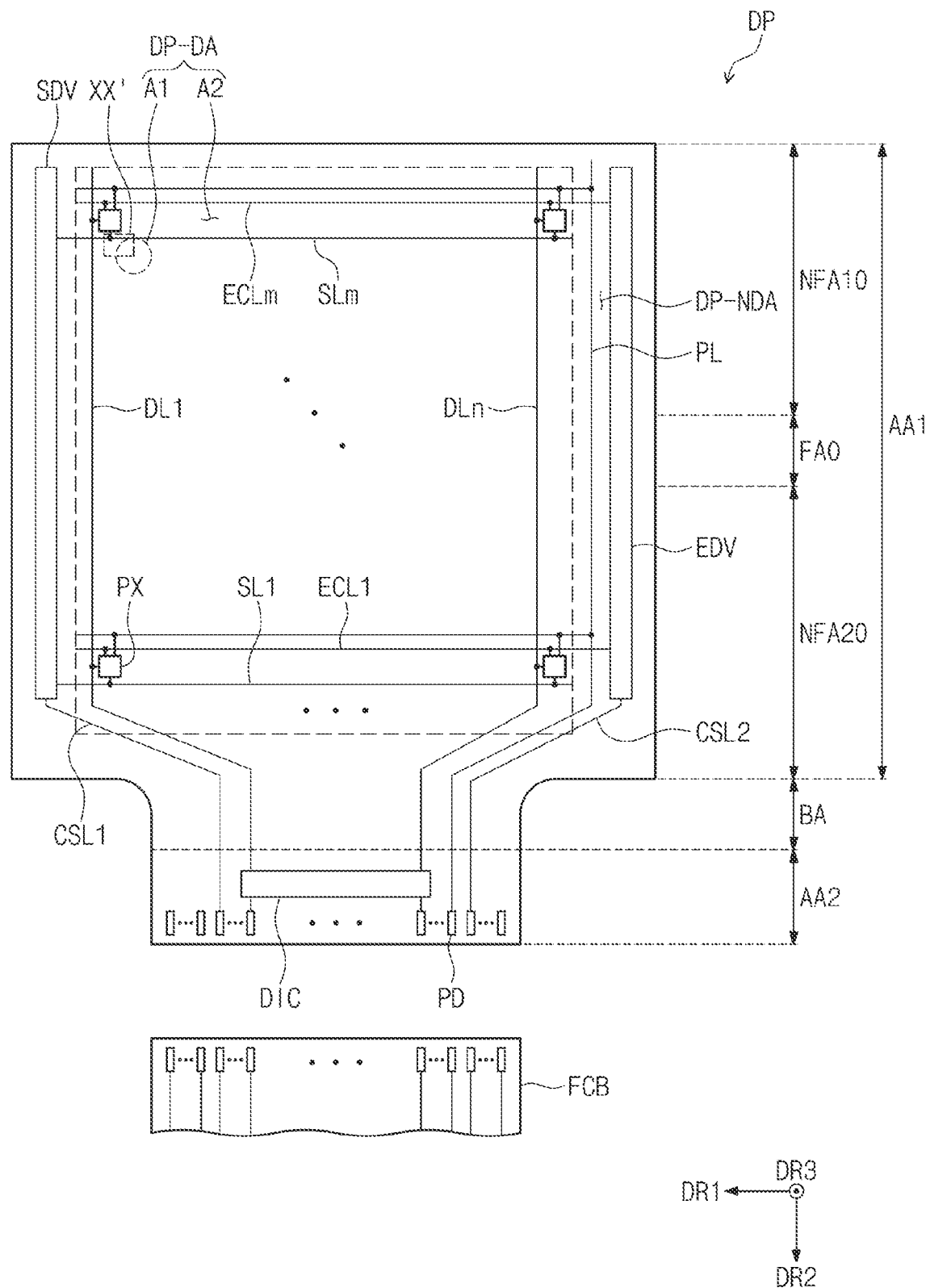
FIG. 4 is a plan view of a display panel according to an embodiment of the inventive concept.

FIG. 4 is a plan view of the display panel DP according to an embodiment of the inventive concept.

Referring to FIG. 4, the display area DP-DA and the non-display area DP-NDA around the display area DP-DA may be defined in the display panel DP. The display area DP-DA may include pixels PX and the non-display area DP-NDA may not include pixels PX. A scan driver SDV, a data driver, and an emission driver EDV may be disposed in the non-display area DP-NDA. The data driver may be included in the driving chip DIC.

The display area DP-DA may include the first area A1 and the second area A2. The first area A1 may be different from the second area A2 in that a distance between the pixels PX, the size of each of the pixels PX, and/or an existence of transmissive areas TP (see FIG. 5). A detailed description of the first area A1 and the second area A2 will be given later.

The display panel DP may include a first panel area AA1, a bending area BA, and a second panel area AA2 disposed along the second direction DR2. The second panel area AA2 and the bending area BA may be a partial area of the non-display area DP-NDA. The bending area BA is disposed between the first panel area AA1 and the second panel area AA2.

The first panel area AA1 is an area corresponding to the display surface DS of FIG. 1A. The first panel area AA1 may include a first non-folding area NFA10, a second non-folding area NFA20, and a folding area FAO. The first non-folding area NFA10, the second non-folding area NFA20, and the folding area FAO respectively correspond to the first non-folding area NFA1, the second non-folding area NFA2, and the folding area FA of FIG. 1A and FIG. 1B.

A width (or a length) of the bending area BA and a width (or a length) of the second panel area AA2 measured in a direction parallel to the first direction DR1 may be smaller than a width (or a length) of the first panel area AA1 measured in a direction parallel to the first direction DR1. An area having a shorter length in a direction of a bending axis may be bent more easily.

The display panel DP may include the plurality of pixels PX, a plurality of scan lines SL1 to SLm, a plurality of data lines DL1 to DLn, a plurality of emission control lines ECL1 to ECLm, first and second control lines CSL1 and CSL2, a driving voltage line PL, and a plurality of pads PD. Here, m and n are natural numbers. The pixels PX may be connected to the scan lines SL1 to SLm, the data lines DL1 to DLn, and the emission control lines ECL1 to ECLm.

The scan lines SL1 to SLm may extend in the first direction DR1 and may be electrically connected to the scan driver SDV. The data lines DL1 to DLn may extend in the second direction DR2 and may be electrically connected to the driving chip DIC via the bending area BA. The emission control lines ECL1 to ECLm may extend in the first direction DR1 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers. The portion of the driving voltage line PL extending in the second direction DR2 may extend to the second panel area AA2 via the bending area BA. The driving voltage line PL may provide a first voltage to the pixels PX.

The first control line CSL1 may be connected to the scan driver SDV and may extend toward a lower end of the second panel area AA2 via the bending area BA. The second control line CSL2 may be connected to the emission driver EDV and may extend toward the lower end of the second panel area AA2 via the bending area BA.

In a plan view, the pads PD may be disposed adjacent to the lower end of the second panel area AA2. The driving chip DIC, the driving voltage line PL, the first control line CSL1, and the second control line CSL2 may be electrically connected to the pads PD. The flexible circuit film FCB may be electrically connected to the pads PD through an anisotropic conductive adhesive layer.

Figure 5:
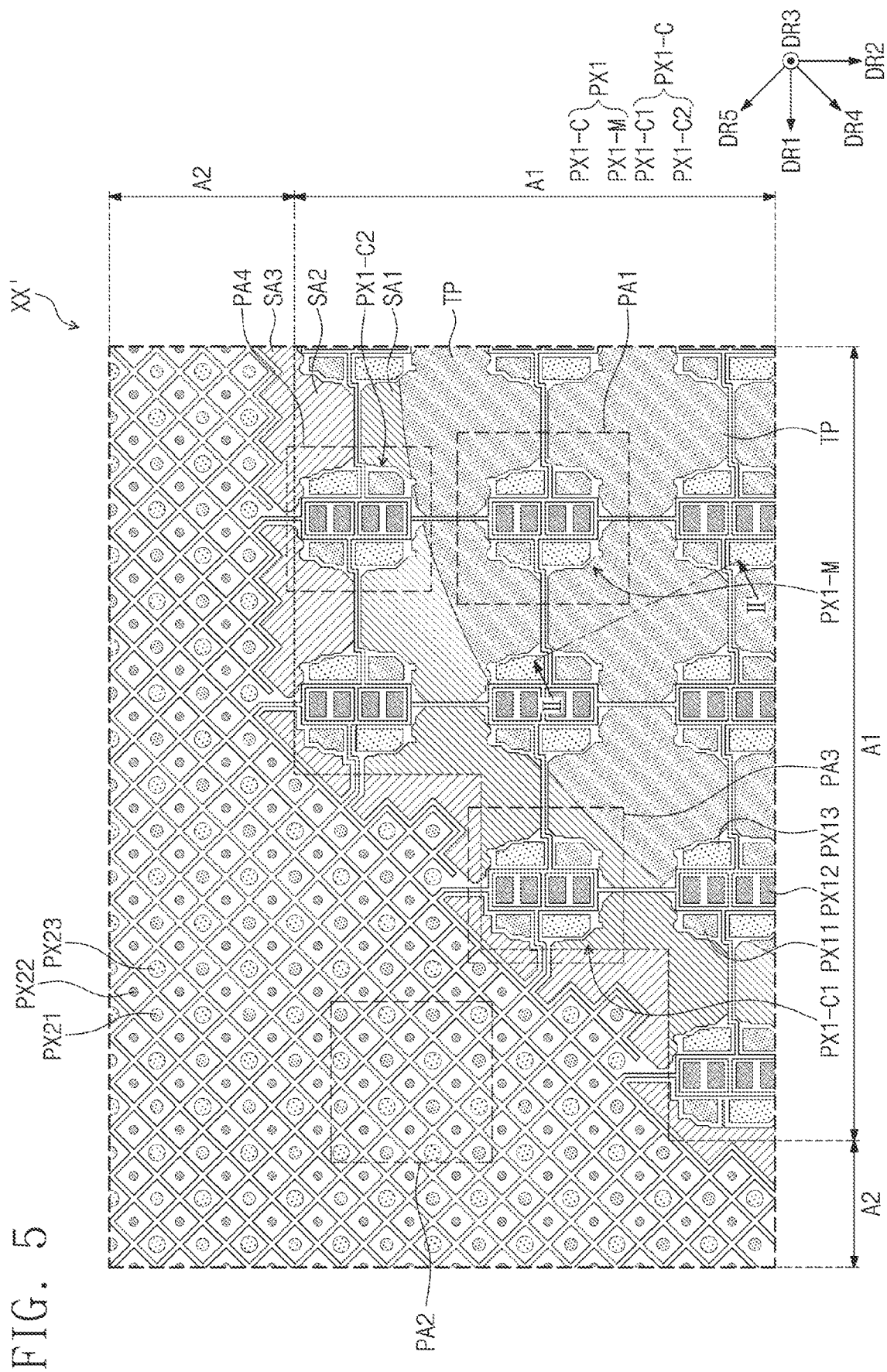
FIG. 5 is an enlarged plan view illustrating a partial area of a display panel according to an embodiment of the inventive concept.

FIG. 5 is an enlarged plan view illustrating the area XX' illustrated in FIG. 4.

Referring to FIG. 4 and FIG. 5, the pixel PX is provided in plurality, and the plurality of pixels PX may include a plurality of first pixels PX11, PX12, and PX13 disposed in the first area A1, and a plurality of second pixels PX21, PX22, and PX23 disposed in the second area A2. A shape, in a plan view, of each of the plurality of first pixels PX11, PX12, and PX13 and the plurality of second pixels PX21, PX22, and PX23 illustrated in FIG. 5 may correspond to an emission surface area by one light emitting element LD (see FIG. 6).

A first number, which is the number of the plurality of first pixels PX11, PX12, and PX13 disposed in a first predetermined area PA1, may be smaller than a second number, which is the number of the plurality of second pixels PX21, PX22, and PX23 disposed in a second predetermined area PA2. Accordingly, a resolution of the first area A1 may be lower than that of the second area A2. A surface area of the first predetermined area PA1 disposed in the first area A1 and a surface area of the second predetermined area PA2 disposed in the second area A2 may have the same shape and the same size. For example, the first number may be 8, and the second number may be 25. However, this is only an example for describing the difference in resolution, and the first number and the second number are not limited to the above example.

The plurality of first pixels PX11, PX12, and PX13 may include first red pixels PX11, first green pixels PX12, and first blue pixels PX13. The plurality of second pixels PX21, PX22, and PX23 may include second red pixels PX21, second green pixels PX22, and second blue pixels PX23.

The plurality of transmissive areas TP may be defined in the first area A1 of the display panel DP. The transmissive areas TP may be disposed to be spaced apart from each other in the first area A1. Two first red pixels PX11, four first green pixels PX12, and two first blue pixels PX13 described above may be defined as one of pixel groups, and at least some pixels of the pixel group may be disposed adjacent to at least one of the transmissive areas TP. As the transmissive areas TP are defined in the first area A1, transmittance of the first area A1 may be higher than that of the second area A2.

The first area A1 may include the transmissive areas TP and first sub-areas SA1 and second sub-areas SA2 disposed adjacent to the transmissive areas TP. Transmittance of each of the transmissive areas TP may be higher than transmittance of each of the first sub-areas SA1 and each of the second sub-areas SA2.

Figure 9:
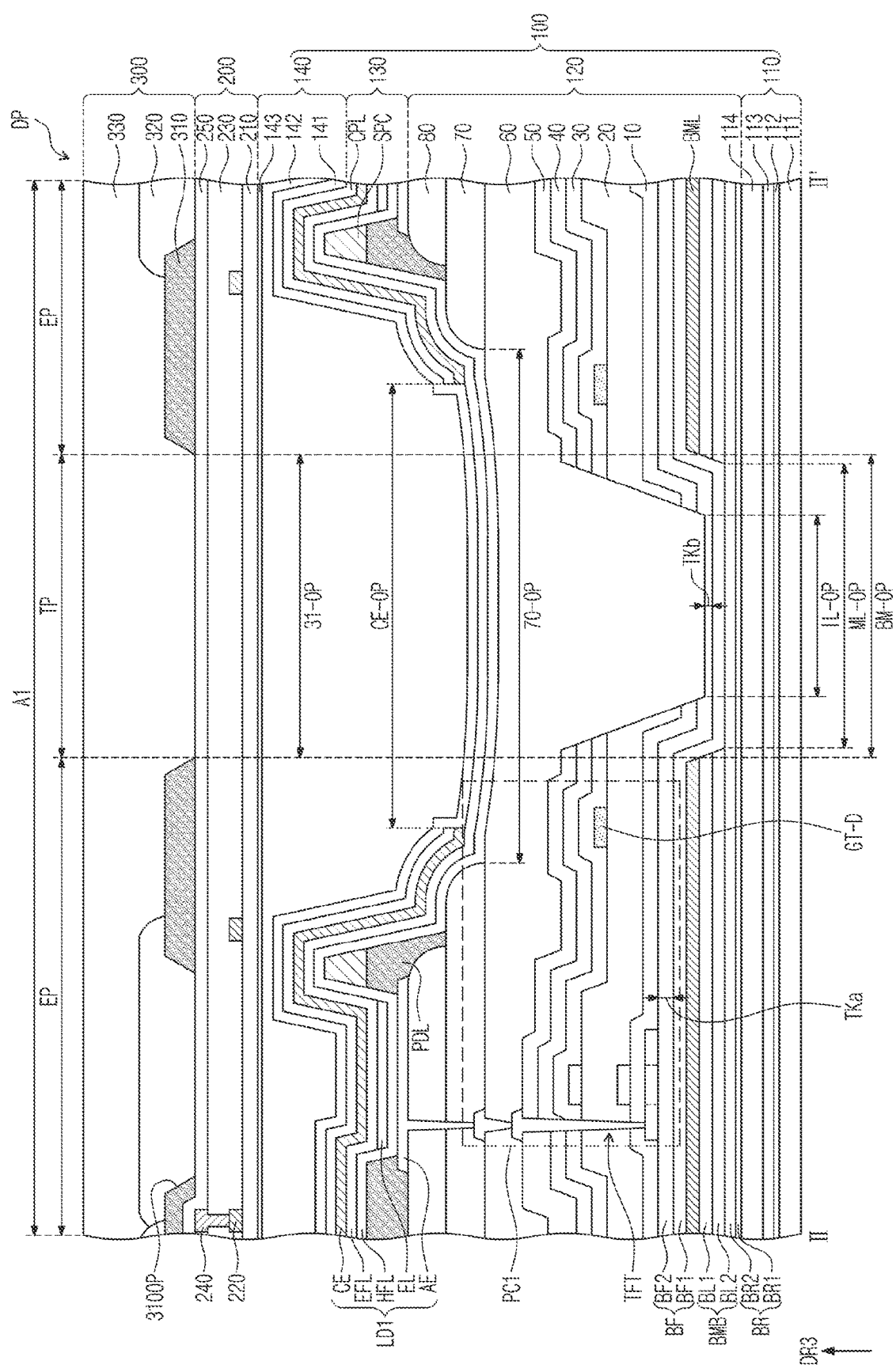
FIG. 9 is a cross-sectional view illustrating a first area of a display panel according to an embodiment of the inventive concept.

For example, the first sub-area SA1 may be a portion covered by a division layer 310 (see FIG. 9). In addition, the entirety of the second sub-area SA2 may be covered by the division layer 310 (see FIG. 9). Accordingly, the second sub-area SA2 and the first sub-area SA1 may not transmit light or may have transmittance lower than that of the transmissive area TP. In FIG. 5, different hatching is used in the first sub-areas SA1 to distinguish the first sub-areas SA1 from the transmissive areas TP. In addition, different hatching is used in the second sub-areas SA2 to distinguish the second sub-areas SA2 from the transmissive areas and the first sub-areas SAE The second sub-areas SA2 may be disposed adjacent to the second area A2. For example, the second sub-areas SA2 may be in contact with a boundary between the first area A1 and the second area A2. The second sub-areas SA2 may be defined in a portion of the first area A1 between the first pixels PX11, PX12, and PX13 and the second pixels PX21, PX22, and PX23. Accordingly, the second sub-area SA2 may be disposed adjacent to a corresponding one of the pixel groups disposed in the first area A1 and a corresponding one of pixel groups disposed in the second area A2. A surface area of the second sub-area SA2 may be smaller than a surface area of the transmissive area TP.

A boundary area in which the second pixels PX21, PX22, and PX23 are not disposed may also be defined in a portion of the second area A2 of the display panel DP which is disposed adjacent to the first area A1. Third sub-areas SA3 may be defined in a portion of the second area A2 which is disposed adjacent to the first area A1. Each of the third sub-areas SA3 may be in contact with the boundary between the first area A1 and the second area A2. The third sub-areas SA3 may have a shape connected to the second sub-areas SA2 defined in the first area A1.

A pixel defining film PDL (see FIG. 9) is not disposed in the transmissive areas TP. The first sub-area SA1 may be an area that does not overlap the pixel defining film PDL (see FIG. 9) but overlaps the division layer 310 (see FIG. 9). A line connecting a boundary between the first sub-area SA1 and a corresponding one of the transmissive areas TP may be a curved line. When the boundaries between the first sub-areas SA1 and the transmissive areas TP respectively corresponding thereto are connected, a circular shape may be derived. The second sub-area SA2 disposed in the first area A1 and the third sub-area SA3 disposed in the second area A2 may be areas overlapping the pixel defining film PDL (see FIG. 9). The transmissive area TP may be an area that overlaps neither the pixel defining film PDL (see FIG. 9) nor the division layer 310 (see FIG. 9).

The second sub-areas SA2 and the first sub-areas SA1 are disposed in a portion of the first area A1 adjacent to the second area A2, and the third sub-areas SA3 are disposed in a portion of the second area A2 adjacent to the first area A1. An area of the first area A1 in which the second sub-areas SA2 and the first sub-areas SA1 are defined and an area of the second area A2 in which the third sub-areas SA3 are defined may be defined as a boundary area. In the boundary area, two first red pixels PX11, four first green pixels PX12, and two first blue pixels PX13 are disposed adjacent to each other to form one of pixel groups, and the one pixel group may be disposed adjacent to at least one second sub-area SA2 and/or at least one first sub-area SA1 that are covered by the division layer 310 (see FIG. 9) and have relatively low light transmittance compared with the transmissive areas.

In the second area A2, the second red pixels PX21 and the second green pixels PX22 may be arranged to be alternately repeated one by one in each of a fourth direction DR4 and a fifth direction DR5. In addition, in the second area A2, the second blue pixels PX23 and the second green pixels PX22 may be arranged to be alternately repeated one by one in each of the fourth and fifth directions DR4 and DR5. The fourth direction DR4 may be a direction between the first direction DR1 and the second direction DR2, and the fifth direction DR5 may be a direction crossing or perpendicular to the fourth direction DR4. In relation to one second green pixel PX22, a corresponding one of the second red pixels PX21 may be spaced apart in the fourth direction DR4, and a corresponding one of the second blue pixels PX23 may be spaced apart in the fifth direction DR5.

In the second area A2, the second red pixels PX21 and the second blue pixels PX23 may be arranged to be alternately repeated one by one in each of the first direction DR1 and the second direction DR2. The second green pixels PX22 may be arranged to be repeated in the first direction DR1 and the second direction DR2.

A surface area of each of the first red pixels PX11 may be greater than a surface area of each of the second red pixels PX21, a surface area of each of the first green pixels PX12 may be greater than a surface area of each of the second green pixels PX22, and a surface area of each of the first blue pixels PX13 may be greater than a surface area of each of the second blue pixels PX23. However, this is only illustrated as an example, and the surface area relation between the first red pixel, first green pixel, and first blue pixel PX11, PX12, and PX13 and the second red pixel, second green pixel, and second blue pixel PX21, PX22, and PX23 is not limited to the above-described example.

In addition, a shape of the first red pixel PX11 may be different from that of the second red pixel PX21, a shape of the first green pixel PX12 may be different from that of the second green pixel PX22, and a shape of the first blue pixel PX13 may be different from that of the second blue pixel PX23. However, this is only illustrated as an example, and the shapes of the first red pixel, first green pixel, and first blue pixel PX11, PX12, and PX13 may be respectively the same as the shapes of the second red pixel, second green pixel, and second blue pixel PX21, PX22, and PX23.

Figure 6:
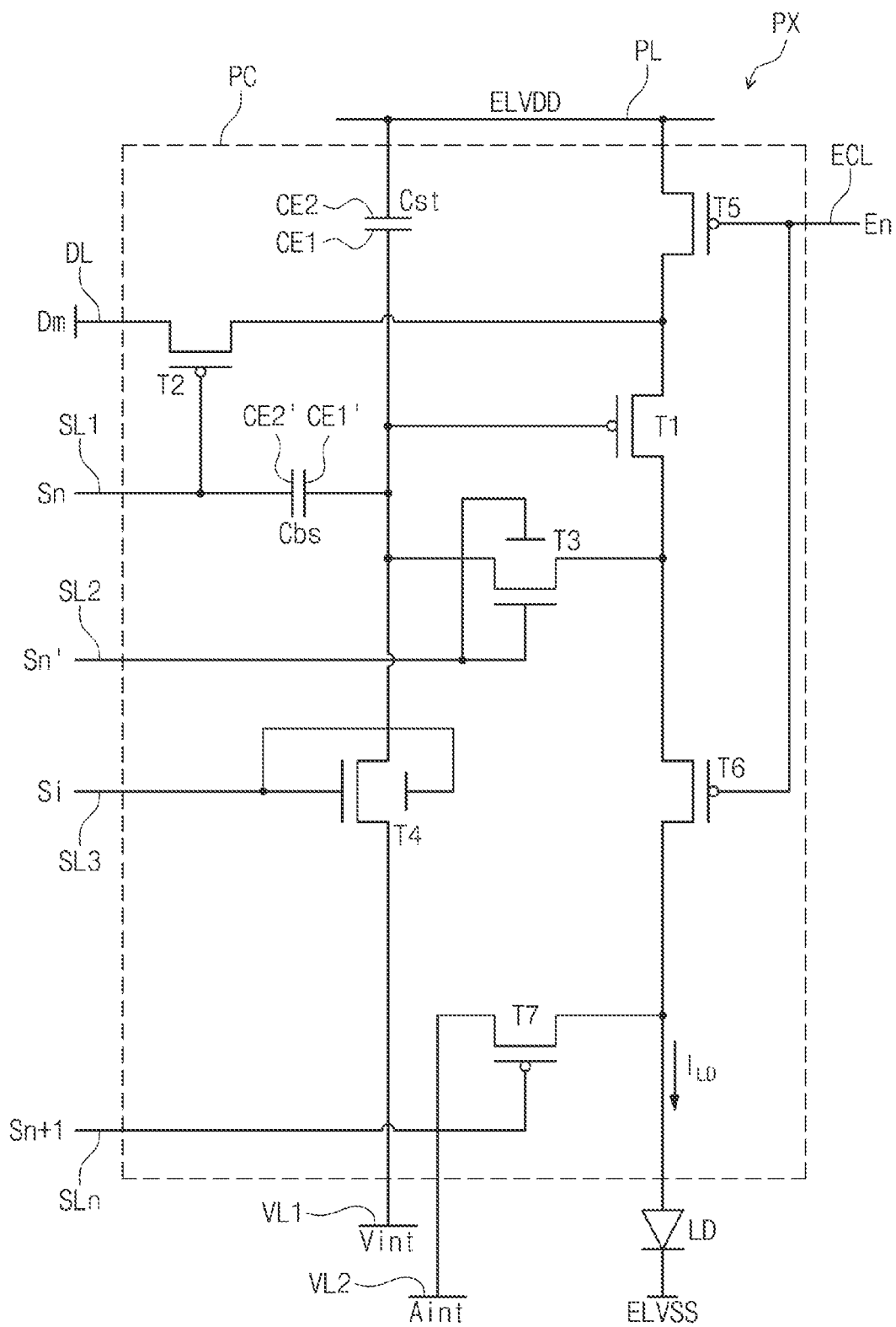
FIG. 6 is an equivalent circuit diagram of one of pixels according to an embodiment of the inventive concept.

FIG. 6 is an equivalent circuit diagram of one of pixels according to an embodiment of the inventive concept.

Referring to FIG. 6, an equivalent circuit diagram of one of the pixels PX is illustrated. The pixel PX illustrated in FIG. 6 may be the first red pixel PX11, the first green pixel PX12, the first blue pixel PX13, the second red pixel PX21, the second green pixel PX22, or the second blue pixel PX23.

The pixel PX may include the light emitting element LD and a pixel circuit PC. The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SL3, SLn, ECL, and DL, a first initialization voltage line VL1, a second initialization voltage line VL2 (or an anode initialization voltage line), and the driving voltage line PL. In an embodiment, at least one of the above-described lines, for example, the driving voltage line PL may be shared with neighboring pixels PX.

The plurality of thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a first electrode (e.g., an anode electrode or a pixel electrode) and a second electrode (e.g., a cathode electrode or a common electrode), and the first electrode of the light emitting element LD may be connected to the driving thin film transistor T1 through the emission control thin film transistor T6 to receive a driving current $I_{LD}$, and the second electrode may receive a low power supply voltage ELVSS. The light emitting element LD may generate light having luminance corresponding to the driving current $I_{LD}$.

Some of the plurality of thin film transistors T1 to T7 may be provided as n-channel MOSFET (NMOS), and the others may be provided as p-channel MOSFET (PMOS). For example, the compensation thin film transistor T3 and the first initialization thin film transistor T4 among the plurality of thin film transistors T1 to T7 may be provided as n-channel MOSFET (NMOS), and the others may be provided as p-channel MOSFET (PMOS).

In another embodiment, a compensation thin film transistor T3, a first initialization thin film transistor T4, and a second initialization thin film transistor T7 among a plurality of thin film transistors T1 to T7 may be provided as NMOS and the rest of the plurality of thin film transistors T1 to T7 may be provided as PMOS. Alternatively, only one of the plurality of thin film transistors T1 to T7 may be provided as NMOS, and the rest of the plurality of thin film transistors T1 to T7 may be provided as PMOS. Alternatively, all of the plurality of thin film transistors T1 to T7 may be provided as NMOS, or all thereof may be provided as PMOS.

The signal lines may include a first scan line SL1 transmitting a first scan signal Sn to the switching thin film transistor T2, a second scan line SL2 transmitting a second scan signal Sn' to the compensation thin film transistor T3, a third scan line SL3 transmitting a third scan signal S1 to the first initialization thin film transistor T4, an emission control line ECL transmitting an emission control signal En to the operation control thin film transistor T5 and the emission control thin film transistor T6, a next scan line SLn transmitting a next scan signal Sn+1 to the second initialization thin film transistor T7, and a data line DL that crosses the first scan line SL1 and transmits a data signal Dm. The first scan signal Sn may be a current scan signal and the next scan signal Sn+1 may be a subsequent scan signal of the first scan signal Sn.

The driving voltage line PL may transmit a driving voltage ELVDD to the driving thin film transistor T1 and the first initialization voltage line VL1 may transmit an initialization voltage Vint for initializing the driving thin film transistor T1.

A driving gate electrode of the driving thin film transistor T1 may be connected to the storage capacitor Cst, a driving source region of the driving thin film transistor T1 may be connected to the driving voltage line PL via the operation control thin film transistor T5, and a driving drain region of the driving thin film transistor T1 may be electrically connected to the first electrode of the light emitting element LD via the emission control thin film transistor T6. The driving thin film transistor T1 may receive the data signal Dm according to the switching operation of the switching thin film transistor T2 to supply the driving current $I_{LD}$ to the light emitting element LD.

A switching gate electrode of the switching thin film transistor T2 may be connected to the first scan line SL1 transmitting the first scan signal Sn, a switching source region of the switching thin film transistor T2 may be connected to the data line DL, and a switching drain region of the switching thin film transistor T2 may be connected to the driving source region of the driving thin film transistor T1 and connected to the driving voltage line PL via the operation control thin film transistor T5. The switching thin film transistor T2 may perform a switching operation in which the switching thin film transistor T2 is turned on in response to the first scan signal Sn transmitted through the first scan line SL1 and transmits the data signal Dm transmitted through the data line DL to the driving source region of the driving thin film transistor T1.

A compensation gate electrode of the compensation thin film transistor T3 is connected to the second scan line SL2. A compensation drain region of the compensation thin film transistor T3 may be connected to the driving drain region of the driving thin film transistor T1 and may be connected to the pixel electrode of the light emitting element LD via the emission control thin film transistor T6. A compensation source region of the compensation thin film transistor T3 may be connected to a first electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2 and may electrically connect the driving gate electrode and the driving drain region of the driving thin film transistor T1 to diode-connect the driving thin film transistor T1.

A first initialization gate electrode of the first initialization thin film transistor T4 may be connected to the third scan line SL3. A first initialization source region of the first initialization thin film transistor T4 may be connected to the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on in response to the third scan signal Si which is the previous scan signal Sn−1 received through the third scan line SL3 and may perform an initialization operation in which the first initialization thin film transistor T4 allows the initialization voltage Vint to be transmitted to the driving gate electrode of the driving thin film transistor T1 and initializes the voltage of the driving gate electrode of the driving thin film transistor T1.

An operation control gate electrode of the operation control thin film transistor T5 may be connected to the emission control line ECL, an operation control source region of the operation control thin film transistor T5 may be connected to the driving voltage line PL, and an operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line ECL, an emission control source region of the emission control thin film transistor T6 may be connected to the driving drain region of the driving thin film transistor T1 and the compensation drain region of the compensation thin film transistor T3, and an emission control drain region of the emission control thin film transistor T6 may be electrically connected to a second initialization drain region of the second initialization thin film transistor T7 and the pixel electrode of the light emitting element LD.

The operation control thin film transistor T5 and the emission control thin film transistor T6 are simultaneously turned on in response to the emission control signal En received through the emission control line ECL and allow the driving voltage ELVDD to be applied to the light emitting element LD for the driving current $I_{LD}$ to flow through the light emitting element LD.

A second initialization gate electrode of the second initialization thin film transistor T7 may be connected to the next scan line SLn, the second initialization drain region of the second initialization thin film transistor T7 may be connected to the emission control drain region of the emission control thin film transistor T6 and the pixel electrode of the light emitting element LD, and the second initialization source region of the second initialization thin film transistor T7 may be connected to the second initialization voltage line VL2 to receive an anode initialization voltage Aint. The second initialization thin film transistor T7 is turned on in response to the next scan signal Sn+1 transmitted through the next scan line SLn and initializes the pixel electrode of the light emitting element LD.

In another embodiment, a second initialization thin film transistor T7 may be connected to an emission control line ECL to be driven in response to an emission control signal En. Meanwhile, positions of the source regions and the drain regions may be interchanged according to the type (p-type or n-type) of the transistors.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. The storage capacitor Cst may store an electric charge corresponding to a difference between a voltage of the driving gate electrode of the driving thin film transistor T1 and the driving voltage ELVDD.

A boosting capacitor Cbs may include a first electrode $CE1^{st}$ and a second electrode $CE2'$. The first electrode $CE1^{st}$ of the boosting capacitor Cbs may be connected to the first electrode CE1 of the storage capacitor Cst and the second electrode $CE2'$ of the boosting capacitor Cbs may receive the first scan signal Sn. The boosting capacitor Cbs may compensate for the voltage drop of a gate terminal of the driving thin film transistor T1 by increasing the voltage of the gate terminal at the point in time when the provision of the first scan signal Sn is stopped.

A detailed operation of each of the pixels PX according to an embodiment is as follows.

When the third scan signal Si is provided through the third scan line SL3 during an initialization period, the first initialization thin film transistor T4 is turned on in response to the third scan signal S1 and the driving thin film transistor T1 is initialized by the initialization voltage Vint provided from the first initialization voltage line VL1.

When the first scan signal Sn and the second scan signal Sn' are provided through the first scan line SL1 and the second scan line SL2, respectively, during a data programming period, the switching thin film transistor T2 and the compensation thin film transistor T3 are turned on in response to the first scan signal Sn and the second scan signal Sn', respectively. At this time, the driving thin film transistor T1 is diode-connected by the turned-on compensation thin film transistor T3 and is forward-biased.

Then, a compensation voltage Dm+Vth obtained by adding the data signal Dm provided from the data line DL and a threshold voltage Vth (Vth is a negative value) of the driving thin film transistor T1 is applied to the driving gate electrode of the driving thin film transistor T1.

The driving voltage ELVDD and the compensation voltage Dm+Vth are respectively applied to both ends of the storage capacitor Cst, and an electric charge corresponding to a voltage difference between the both ends is stored in the storage capacitor Cst.

During an emission period, the operation control thin film transistor T5 and the emission control thin film transistor T6 are turned on by the emission control signal En provided from the emission control line ECL. The driving current $I_{LD}$ is generated according to a voltage difference between the voltage of the driving gate electrode of the driving thin film transistor T1 and the driving voltage ELVDD, and the driving current $I_{LD}$ is provided to the light emitting element LD through the emission control thin film transistor T6.

In this embodiment, at least one of the plurality of thin film transistors T1 to T7 includes a semiconductor layer including oxide, and the others include a semiconductor layer including silicon.

Specifically, the driving thin film transistor T1, which directly affects the brightness of the display device, may be formed to include a semiconductor layer formed of polycrystalline silicon having high reliability, thereby realizing a high-resolution display device.

Meanwhile, due to high carrier mobility and a low leakage current, the voltage drop of an oxide semiconductor is not large even when the driving time is long. That is, the oxide semiconductor is capable of low-frequency driving because the color change of an image caused by the voltage drop is not large even during the low-frequency driving.

As described above, because the oxide semiconductor has an advantage of a low leakage current, it is possible to prevent a leakage current that may flow into the driving gate electrode and simultaneously, to reduce power consumption by employing the oxide semiconductor for at least one of the compensation thin film transistor T3 and the first initialization thin film transistor T4 that are connected to the driving gate electrode of the driving thin film transistor T1.

Figure 7A:
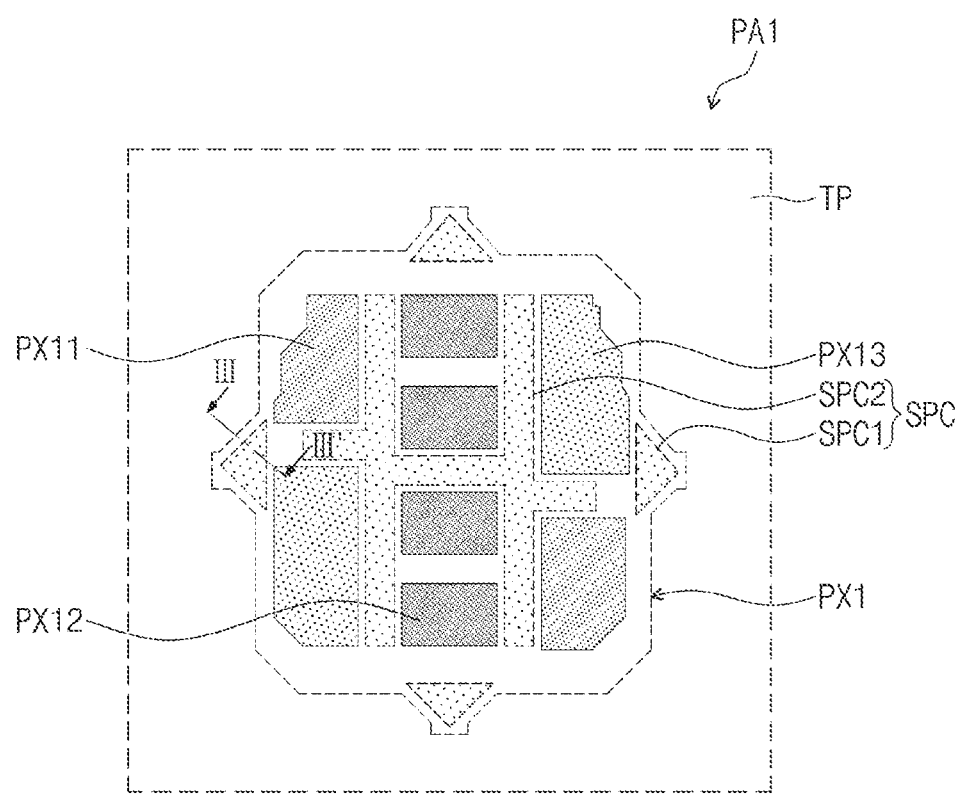
FIG. 7A and FIG. 7B are plan views illustrating one of first pixel groups according to an embodiment of the inventive concept.
Figure 7B:
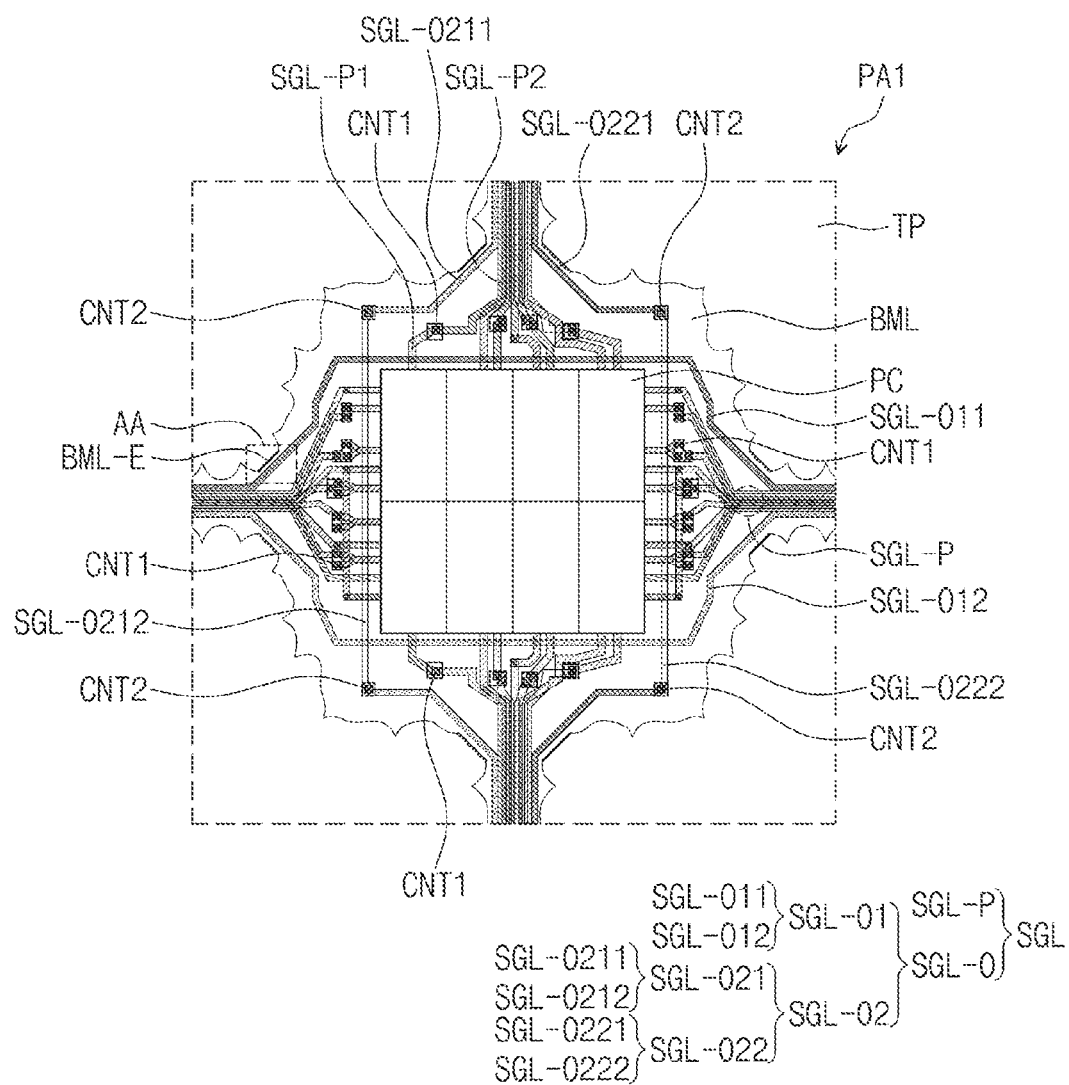

FIG. 7A and FIG. 7B are plan views illustrating one of first pixel groups PX1 according to an embodiment of the inventive concept. FIG. 7A illustrates a configuration of the plurality of first pixels PX11, PX12, and PX13, a spacer SPC, etc. in the first pixel group PX1 disposed in a plane corresponding to the area PA1 of FIG. 5. FIG. 7B illustrates a configuration of a light blocking layer BML, the pixel circuit PC, signal lines SGL, etc. in the first pixel group PX1 disposed in the plane corresponding to the area PA1 of FIG. 5.

Referring to FIG. 7A, the plurality of first pixels PX11, PX12, and PX13 included in the first pixel group PX1 may include the first red pixels PX11, the first green pixels PX12, and the first blue pixels PX13.

The first pixel group PX1 may include two first red pixels PX11, four first green pixels PX12, and two first blue pixels PX13, and each of the first pixels PX11, PX12, and PX13 may be disposed adjacent to each other. For example, in the first pixel group PX1, the four first green pixels PX12 may be arranged in the second direction DR2, and one of the first red pixels PX11 and a corresponding one of the first blue pixels PX13 may be spaced apart from each other in the first direction DR1 with two first green pixels PX12 interposed therebetween. In addition, in the first pixel group PX1, one of the first red pixels PX11 may be spaced apart from a corresponding one of the first blue pixels PX13 in the second direction DR2.

Referring to FIG. 5 and FIG. 7A together, the first pixel groups PX1 disposed in the first area A1 may include first connector pixel groups PX1-C disposed adjacent to the second area A2 and first central pixel groups PX1-M spaced apart from the second area A2 with the first connector pixel groups PX1-C interposed therebetween. The first connector pixel groups PX1-C may be first pixel groups surrounded by the second sub-areas SA2 and the first sub-areas SAE The first central pixel groups PX1-M may be a portion surrounded by the transmissive areas TP, the first sub-areas SA1, and the like. The first connector pixel groups PX1-C may include $1-1^{st}$ connector pixel groups PX1-C1 each of which has two sides adjacent to the second area A2 and $1-2^{nd}$ connector pixel groups PX1-C2 each of which has one side adjacent to the second area A2. The $1-1^{st}$ connector pixel groups PX1-C1 may be pixel groups disposed in a corner portion of the first area A1 and the $1-2^{nd}$ connector pixel groups PX1-C2 may be pixel groups disposed in upper, lower, left, and right side portions of the first area A1. The first connector pixel groups PX1-C are pixel groups disposed in a boundary area between the first area A1 and the second area A2, and the 1-1$^{st}$ connector pixel groups PX1-C1 may be pixel groups disposed in a corner portion of the boundary area, and the 1-2$^{nd}$ connector pixel groups PX1-C2 may be pixel groups disposed in upper, lower, left, and right side portions of the boundary area.

Referring to FIG. 7B, each of the plurality of first pixel groups PX1 may be connected by the plurality of signal lines SGL. The plurality of signal lines SGL may be a portion that connects each of the plurality of first pixels PX11, PX12, and PX13 disposed in each of the plurality of first pixel groups PX1 through at least one of the above-described lines. The plurality of signal lines SGL may include, for example, the scan lines SL1 to SLm, the data lines DL1 to DLn, the emission control lines ECL1 to ECLm, etc. illustrated in FIG. 4. The plurality of signal lines SGL may be disposed on the light blocking layer BML. That is, the scan lines SL1 to SLm, the data lines DL1 to DLn, the emission control lines ECL1 to ECLm, etc. included in the plurality of signal lines SGL may be disposed on the light blocking layer BML to overlap the light blocking layer BML.

The pixel circuit PC may be provided in plurality. Pixel signal lines SGL-P included in the plurality of signal lines SGL may be connected to corresponding ones of the pixel circuits PC. The scan lines SL1 to SLm, the data lines DL1 to DLn, the emission control lines ECL1 to ECLm, etc. included in the pixel signal lines SGL-P may be connected to the pixel circuits PC in the plurality of first pixel groups PX1 and may be connected to each of adjacent first pixel groups PX1. As illustrated in FIG. 7B, each of the first pixel groups PX1 may include the pixel circuits PC forming a plurality of rows and columns, for example, the plurality of pixel circuits PC forming two rows and four columns, and a corresponding one of the scan lines SL1 to SLm, a corresponding one of the data lines DL1 to DLn, and a corresponding one of the emission control lines ECL1 to ECLm may be connected to each of the plurality of pixel circuits PC. As illustrated in FIG. 7B, the pixel signal lines SGL-P may include a plurality of lines disposed on layers different from each other, and the plurality of lines may be connected to each other by first contact holes CNT1. For example, the pixel signal lines SGL-P may include first pixel signal lines SGL-P1 connected to the pixel circuits PC and second pixel signal lines SGL-P2 which are connected to the first pixel signal lines SGL-P1 through the first contact holes CNT1 and extend in directions toward adjacent first pixel groups PX1. The first pixel signal lines SGL-P1 may be disposed on, e.g., a first insulating layer 10 (see FIG. 9) and the second pixel signal lines SGL-P2 may be disposed on, e.g., a second insulating layer 20 (see FIG. 9).

The plurality of signal lines SGL may include outer signal lines SGL-O extending along an edge of the first pixel group PX1 and the pixel signal lines SGL-P connected to the pixel circuits PC. The outer signal lines SGL-O may be signal lines that are not connected to pixel circuits PC of the first area A1 and are connected to each of second pixel circuits PC2 (see FIG. 10) of the second pixels PX21, PX22, and PX23 (see FIG. 5) disposed in the second area A2. The outer signal lines SGL-O may include the scan lines SL1 to SLm and the data lines DL1 to DLn.

The outer signal lines SGL-O may include first outer signal lines SGL-O1 extending in a horizontal direction and second outer signal lines SGL-O2 extending in a vertical direction. The first outer signal lines SGL-O1 may include an 1-1$^{st}$ outer signal line SGL-O11 extending in the horizontal direction and bypassing the pixel circuits PC over an upper side of the pixel circuits PC to extend, and a 1-2$^{nd}$ outer signal line SGL-O12 extending in the horizontal direction and bypassing the pixel circuits PC under a lower side of the pixel circuits PC to extend. The second outer signal lines SGL-O2 may include 2-1$^{st}$ outer signal lines SGL-O21 extending in the vertical direction and bypassing the pixel circuits PC on a left side of the pixel circuits PC to extend, and 2-2$^{nd}$ outer signal lines SGL-O22 extending in the vertical direction and bypassing the pixel circuits PC on a right side of the pixel circuits PC to extend. At least a portion of each of the 1-1$^{st}$ outer signal line SGL-O11, the 1-2$^{nd}$ outer signal line SGL-O12, the 2-1$^{st}$ outer signal lines SGL-O21, and the 2-2$^{nd}$ outer signal lines SGL-O22 may be disposed closer to the pixel circuits PC than the first contact holes CNT1. That is, the 1-1$^{st}$ outer signal line SGL-O11 may extend in the horizontal direction and may bypass the pixel circuits PC so that the 1-1$^{st}$ outer signal line SGL-O11 is disposed closer to the pixel circuits PC, when bypassing the pixel circuits PC over the upper side thereof, than a first contact hole CNT1 disposed above the pixel circuits PC, the 1-2$^{nd}$ outer signal line SGL-O12 may extend in the horizontal direction and may bypass the pixel circuits PC so that the 1-2$^{nd}$ outer signal line SGL-O12 is disposed closer to the pixel circuits PC, when bypassing the pixel circuits PC under the lower side thereof, than a first contact hole CNT1 disposed below the pixel circuits PC, the 2-1$^{st}$ outer signal lines SGL-O21 may extend in the vertical direction and may bypass the pixel circuits PC so that the 2-1$^{st}$ outer signal lines SGL-O21 are disposed closer to the pixel circuits PC, when bypassing the pixel circuits PC on the left side thereof, than a first contact hole CNT1 disposed on the left side of the pixel circuits PC, and the 2-2$^{nd}$ outer signal lines SGL-O22 may extend in the vertical direction and may bypass the pixel circuits PC so that the 2-2$^{nd}$ outer signal lines SGL-O22 are disposed closer to the pixel circuits PC, when bypassing the pixel circuits PC on the right side thereof, than a first contact hole CNT1 disposed on the right side of the pixel circuits PC. The outer signal lines SGL-O may be outermost conductive patterns GT-D (see FIG. 11A) disposed adjacent to target portions BML-E to be described later. A detailed description thereabout will be given later in a description with reference to FIG. 8A, FIG. 11A, and FIG. 11B.

The second outer signal lines SGL-O2 extending in the vertical direction may include a plurality of lines disposed on different layers. In an embodiment, each of the 2-1$^{st}$ outer signal lines SGL-O21 and the 2-2$^{nd}$ outer signal lines SGL-O22 may include a plurality of lines disposed on different layers, and the lines disposed on the different layers may be connected to each other through second contact holes CNT2. The 2-1$^{st}$ outer signal lines SGL-O21 may include a 21-1$^{st}$ outer signal line SGL-O211 and a 21-2$^{nd}$ outer signal line SGL-O212, and the 21-1$^{st}$ outer signal line SGL-O211 and the 21-2$^{nd}$ outer signal line SGL-O212 may be connected to each other through a corresponding one of the second contact holes CNT2. The 2-2$^{nd}$ outer signal lines SGL-O22 may include a 22-1$^{st}$ outer signal line SGL-O221 and a 22-2$^{nd}$ outer signal line SGL-O222, and the 22-1$^{st}$ outer signal line SGL-O221 and the 22-2$^{nd}$ outer signal line SGL-O222 may be connected to each other through a corresponding one of the second contact holes CNT2. A portion of the 21-2$^{nd}$ outer signal line SGL-O212 of the 2-1$^{st}$ outer signal lines SGL-O21 may be disposed closer to the pixel circuits PC than the first contact hole CNT1 disposed on the left side of the pixel circuits PC. A portion of the 22-$2^{nd}$ outer signal line SGL-O222 of the 2-$2^{nd}$ outer signal lines SGL-O22 may be disposed closer to the pixel circuits PC than the first contact hole CNT1 disposed on the right side of the pixel circuits PC.

The 21-$1^{st}$ outer signal line SGL-O211 and the 21-$2^{nd}$ outer signal line SGL-O212 may be disposed on different layers. In an embodiment, the 21-$1^{st}$ outer signal line SGL-O211 may be a gate line, for example, a second gate line GAT2 (see FIG. 11B), and the 21-$2^{nd}$ outer signal line SGL-O212 may be the data line DL (see FIG. 6). In an embodiment, the 22-$1^{st}$ outer signal line SGL-O221 may be a gate line, for example, a first gate line GAT1 (see FIG. 11B), and the 22-$2^{nd}$ outer signal line SGL-O222 may be the data line DL (see FIG. 6). The 21-$1^{st}$ outer signal line SGL-O211 and the 21-$2^{nd}$ outer signal line SGL-O212 may be disposed on different insulating layers. The 22-$1^{st}$ outer signal line SGL-O221 and the 22-$2^{nd}$ outer signal line SGL-O222 may be disposed on different insulating layers.

Each of the 1-$1^{st}$ outer signal line SGL-O11, the 1-$2^{nd}$ outer signal line SGL-O12, the 2-$1^{st}$ outer signal lines SGL-O21, and the 2-$2^{nd}$ outer signal lines SGL-O22 may transmit a scan signal or a data signal. For example, each of the 1-$1^{st}$ outer signal line SGL-O11 and the 2-$2^{nd}$ outer signal lines SGL-O22 may transmit the scan signal, and the 1-$2^{nd}$ outer signal line SGL-O12 and the 2-$1^{st}$ outer signal lines SGL-O21 may transmit the data signal.

In an embodiment, the first central pixel groups PX1-M may be provided in plurality, and each of the plurality of first central pixel groups PX1-M may be connected through the plurality of signal lines SGL. In an embodiment, the first connector pixel groups PX1-C may be provided in plurality, and each of the plurality of first connector pixel groups PX1-C may be connected through the plurality of signal lines SGL, and each of the plurality of first central pixel groups PX1-M adjacent to the plurality of first connector pixel groups PX1-C may be connected through the plurality of signal lines SGL.

Meanwhile, although FIG. 7A and FIG. 7B illustrate the shape of one of the first central pixel groups PX1-M, as an example of the first pixel group PX1, disposed in a plane corresponding to the area PA1, the same description may be applied to the plurality of first pixels PX11, PX12, and PX13 and the signal lines SGL included in one of the first connector pixel groups PX1-C.

As illustrated in FIG. 7A and FIG. 7B, the spacer SPC may be disposed to overlap a portion of the first pixel group PX1 in the display panel according to an embodiment. In an embodiment, the spacer SPC may include a first spacer SPC1 that has a triangular shape in a plan view and is disposed at a position where each of the plurality of first pixel groups PX1 is connected to an adjacent first pixel group PX1 through the signal lines SGL. The spacer SPC may include a second spacer SPC2 that has a shape of connected bars in a plan view and is disposed between the plurality of first pixels PX11, PX12, and PX13. In a cross section, a thickness of the first spacer SPC1 may be greater than a thickness of the second spacer SPC2. That is, the thickness of the first spacer SPC1 in the third direction DR3 may be greater than the thickness of the second spacer SPC2 in the third direction DR3. For example, the first spacer SPC1 may have a thickness in the third direction DR3 of about 1.0 μm to about 1.4 μm, and the second spacer SPC2 may have a thickness in the third direction DR3 of about 0.1 μm to about 0.5 μm.

Figure 8A:
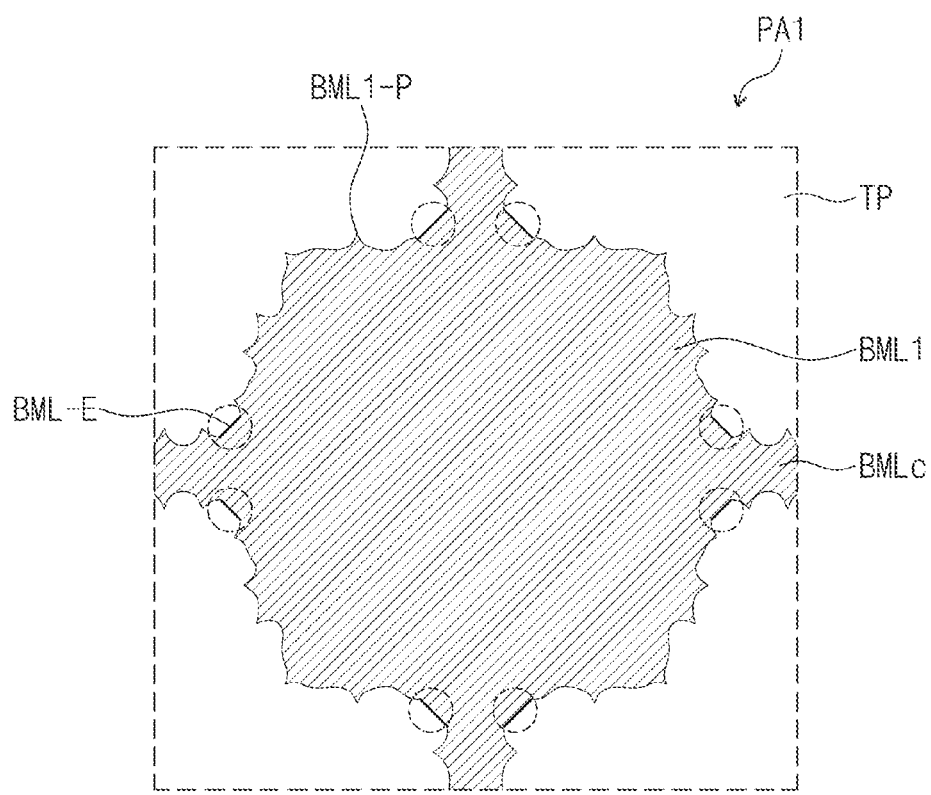
FIG. 8A is a plan view illustrating a portion of a first light blocking pattern according to an embodiment of the inventive concept.
Figure 8B:
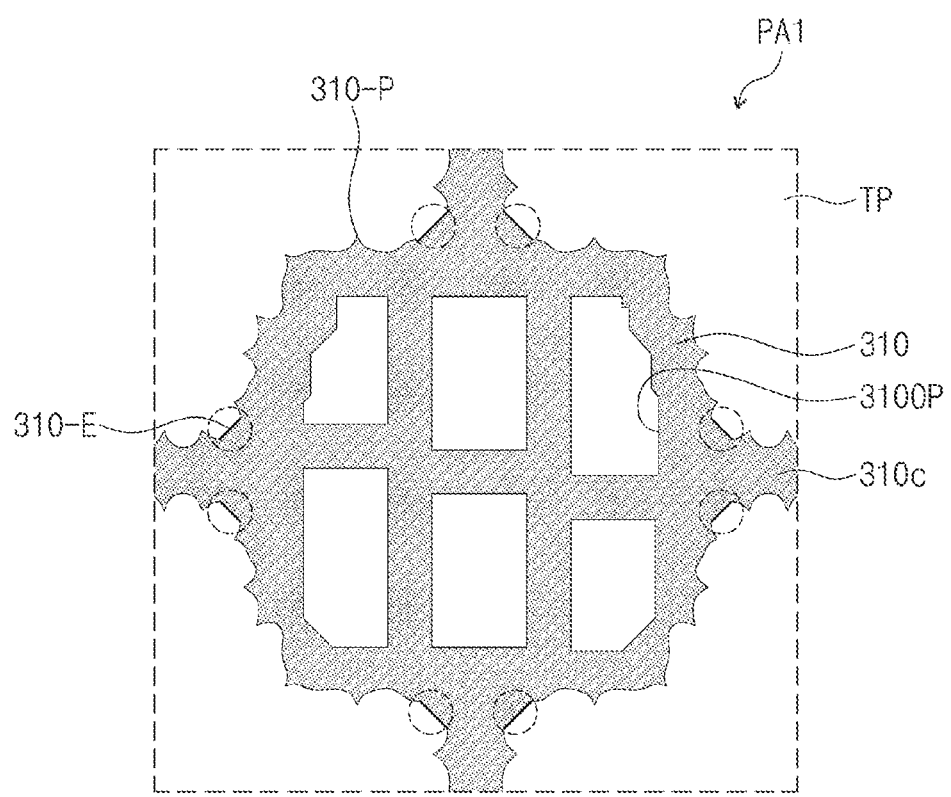
FIG. 8B is a plan view illustrating a portion of a division layer according to an embodiment of the inventive concept.
Figure 8C:
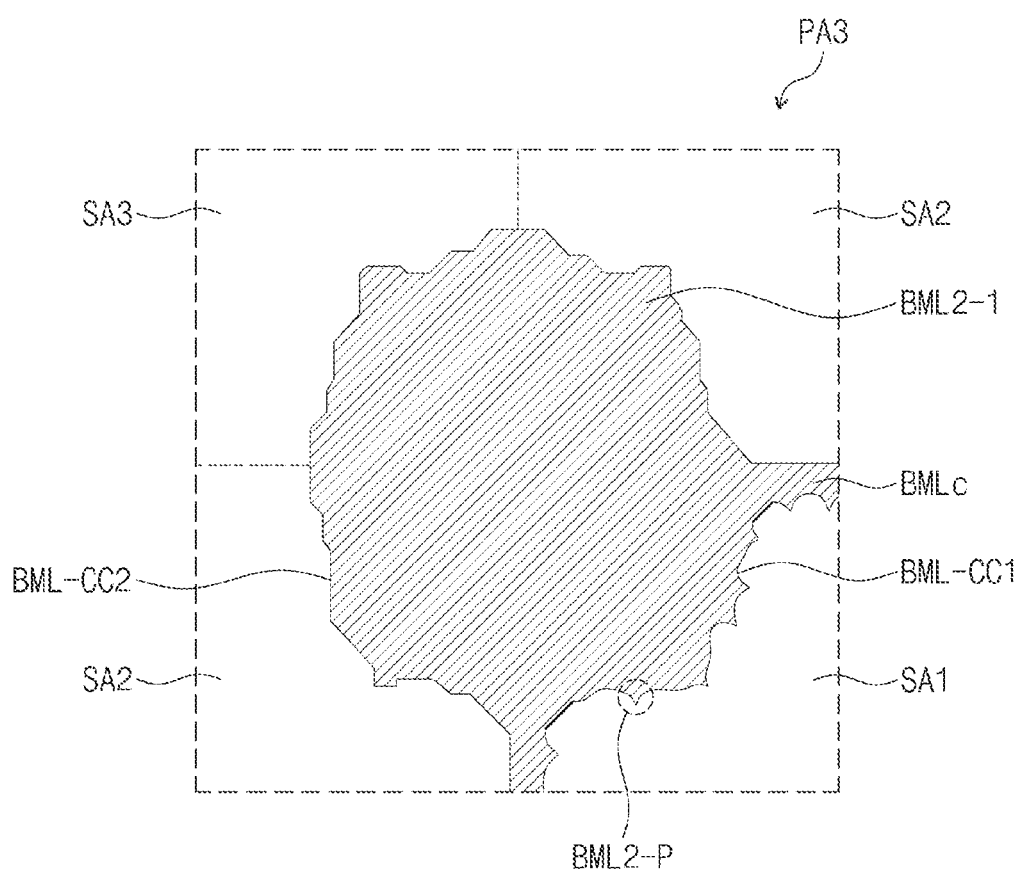
FIG. 8C is a plan view illustrating a portion of a second light blocking pattern according to an embodiment of the inventive concept.
Figure 8D:
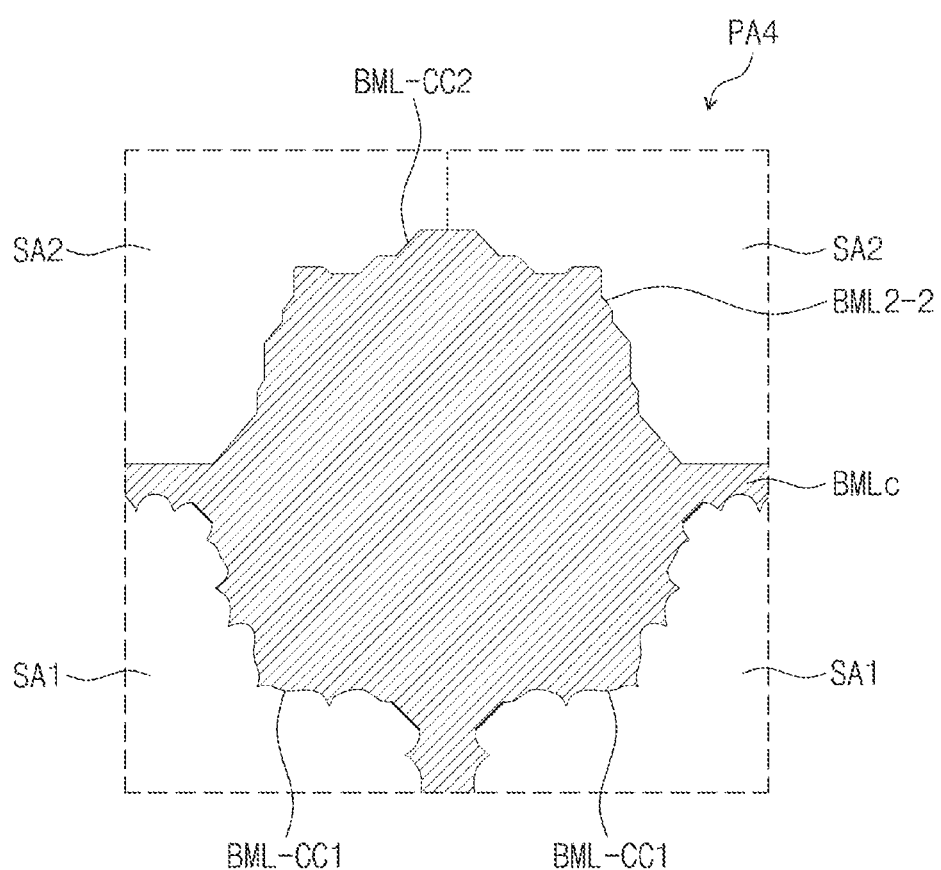
FIG. 8D is a plan view illustrating a portion of a second light blocking pattern according to an embodiment of the inventive concept.

FIG. 8A is a plan view illustrating a portion of a first light blocking pattern BML1 according to an embodiment of the inventive concept. FIG. 8B is a plan view illustrating a portion of the division layer 310 according to an embodiment of the inventive concept. FIG. 8C is a plan view illustrating a portion of a second light blocking pattern BML2-1 according to an embodiment of the inventive concept. FIG. 8D is a plan view illustrating a portion of a second light blocking pattern BML2-2 according to an embodiment of the inventive concept. FIG. 8A and FIG. 8B respectively illustrate planar shapes of the first light blocking pattern BML1 and the division layer 310 disposed in a plane corresponding to the area PA1 of FIG. 5. That is, FIG. 8A and FIG. 8B respectively illustrate the planar shapes of the first light blocking pattern BML1 and the division layer 310 overlapping the first central pixel group PX1-M. FIG. 8C illustrates a shape of the second light blocking pattern BML2-1 disposed in a plane corresponding to the area PA3 of FIG. 5. That is, FIG. 8C illustrates a planar shape of the second light blocking pattern BML2-1 overlapping each of the 1-$1^{st}$ connector pixel groups PX1-C1. FIG. 8D illustrates a shape of the second light blocking pattern BML2-2 disposed in a plane corresponding to the area PA4 of FIG. 5.

Referring to FIG. 5, FIG. 8A, and FIG. 8B together, the first light blocking pattern BML1 may be disposed to overlap each of the first central pixel groups PX1-M in a plan view. Meanwhile, the light blocking layer BML (see FIG. 9) including the first light blocking pattern BML1 and the second light blocking patterns BML2-1 and BML2-2 may prevent components such as the pixel circuits included in a circuit layer 120 (see FIG. 9) to be described later from being influenced by external light and may function as a mask for patterning the common electrode in a subsequent process.

The first light blocking pattern BML1 disposed to overlap the first central pixel group PX1-M may include first protrusion patterns BML1-P. The first light blocking pattern BML1 may include one or more first protrusion patterns BML1-P protruding in directions toward the transmissive areas TP in a plan view. Due to the one or more first protrusion patterns BML1-P and concave portions adjacent to the first protrusion patterns BML1-P, the first light blocking pattern BML1 may have a curved shape in a plan view.

In a portion where the first light blocking pattern BML1 overlaps the first central pixel group PX1-M, at least a portion of portions where the first light blocking pattern BML1 and adjacent light blocking connection parts BMLc are connected may have a straight-line shaped edge in a plan view. That is, the target portions BML-E, which are the portions where the first light blocking pattern BML1 and the adjacent light blocking connection parts BMLc are connected, may have the straight-line shaped edge. The target portions BML-E may have a straight-line shaped edge extending parallel to diagonal directions between the first direction DR1 (see FIG. 5) and the second direction DR2. As the target portions BML-E have shapes of straight lines connecting the first light blocking pattern BML1 and the adjacent light blocking connection parts BMLc, a planar width of the first light blocking pattern BML1 is widened in the corresponding portions, and thus it is possible to prevent a defect from occurring in the common electrode or the like in a subsequent process. A more detailed description thereof will be given later in a description with reference to FIG. 11A and FIG. 11B.

The division layer 310 disposed to overlap the first central pixel group PX1-M may include second protrusion patterns 310-P. The division layer 310 may include one or more second protrusion patterns 310-P protruding in directions toward the transmissive areas TP in a plan view. Due to the one or more second protrusion patterns 310-P, the division layer 310 may have a curved shape in a plan view.

At least a portion of portions where the division layer 310 disposed to overlap the first central pixel group PX1-M is connected to adjacent division connection parts 310c may have a straight-line shaped edge in a plan view. That is, division target portions 310-E, which are the portions where the division layer 310 is connected to the adjacent division connection parts 310c, may have the straight-line shaped edge.

The first light blocking pattern BML1 and the division layer 310 which are disposed to overlap the first central pixel group PX1-M may have the same outer contour in a plan view. The first protrusion patterns BML1-P included in the first light blocking pattern BML1 and the second protrusion patterns 310-P included in the division layer 310 may have substantially the same outer contour and may be disposed substantially at the same positions to overlap each other. The target portions BML-E included in the first light blocking pattern BML1 and the division target portions 310-E included in the division layer 310 may have substantially the same outer contour and may be disposed substantially at the same positions to overlap each other. Accordingly, as illustrated in FIG. 9, an end of the light blocking layer BML which is disposed adjacent to the transmission area TP and includes the first light blocking pattern BML1 and an end of the division layer 310 may be substantially aligned in the cross section.

Referring to FIGS. 5, 8A, 8C, and 8D together, the first light blocking pattern BML1 disposed to overlap the first central pixel group PX1-M may have a shape different from shapes of the second light blocking patterns BML2-1 and BML2-2 disposed to respectively overlap the first connector pixel groups PX1-C1 and PX1-C2. The second light blocking patterns BML2-1 and BML2-2 may include a 2-1$^{st}$ light blocking pattern BML2-1 overlapping each of the 1-1$^{st}$ connector pixel groups PX1-C1 and a 2-2$^{nd}$ light blocking pattern BML2-2 overlapping each of the 1-2$^{nd}$ connector pixel groups PX1-C2.

In a plan view, each of the 2-1$^{st}$ light blocking pattern BML2-1 and the 2-2$^{nd}$ light blocking pattern BML2-2 may have a shape different from that of the first light blocking pattern BML1. The first light blocking pattern BML1 disposed to overlap the first central pixel group PX1-M may include a shape in which the first protrusion patterns BML1-P protruding toward the transmissive areas TP are disposed in all directions, but a protrusion pattern may not be disposed on at least one side of the second light blocking patterns BML2-1 and BML2-2 disposed to respectively overlap the first connector pixel groups PX1-C1 and PX1-C2. More specifically, as illustrated in FIG. 8C, the 2-1$^{st}$ light blocking pattern BML2-1 may have a shape in which protrusion patterns BML2-P are disposed in only one quadrant, i.e., in a lower right portion BML-CC1, and the protrusion patterns are not disposed in the remaining three quadrants, i.e., in upper left, lower left, and upper right portions BML-CC2. On the contrary, as illustrated in FIG. 8D, the 2-2$^{nd}$ light blocking pattern BML2-2 may have a shape in which the protrusion patterns BML2-P are disposed in two quadrant, i.e., in lower right and lower left portions BML-CC1, and the protrusion patterns are not disposed in the remaining two quadrant, i.e., in upper left and upper right portions BML-CC2. Accordingly, the first light blocking pattern BML1 disposed to overlap the first central pixel group PX1-M may have a shape different from the shapes of the second light blocking patterns BML2-1 and BML2-2 disposed to respectively overlap the first connector pixel groups PX1-C1 and PX1-C2 in a plan view.

Figure 10:
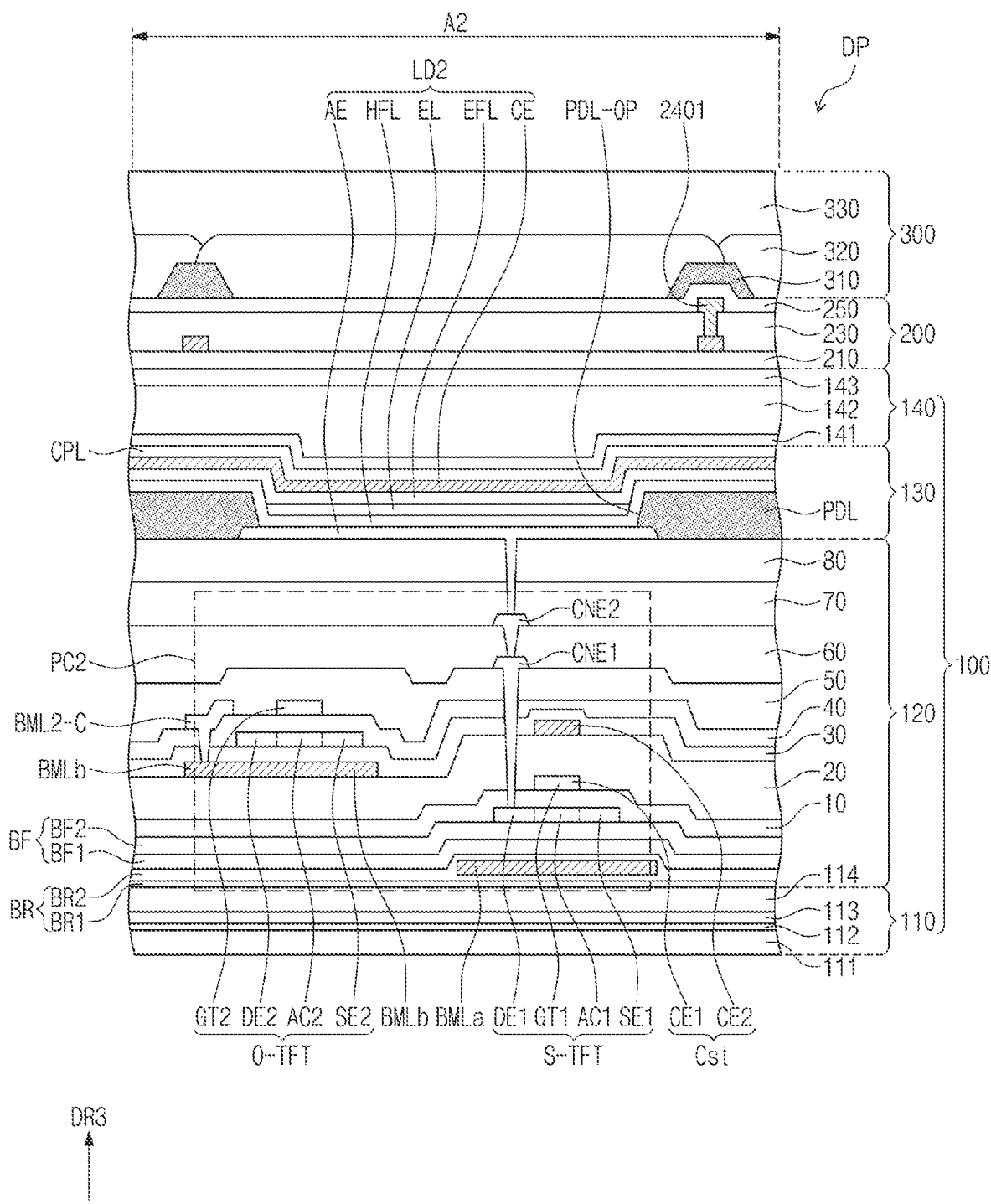
FIG. 10 is a cross-sectional view illustrating a second area of a display panel according to an embodiment of the inventive concept.

FIG. 9 is a cross-sectional view illustrating the first area A1 of the display panel DP according to an embodiment of the inventive concept. FIG. 10 is a cross-sectional view illustrating the second area A2 of the display panel DP according to an embodiment of the inventive concept. FIG. 9 is a cross-sectional view taken along line II-If of FIG. 5.

Referring to FIG. 9 and FIG. 10, the display panel DP may include the display layer 100, the sensor layer 200, and an anti-reflection layer 300. The display layer 100 may include a substrate 110, the circuit layer 120, a light emitting element layer 130, and an encapsulation layer 140.

The substrate 110 may include a plurality of layers 111, 112, 113, and 114. For example, the substrate 110 may include a first sub-base layer 111, a first intermediate barrier layer 112, a second intermediate barrier layer 113, and a second sub-base layer 114. The first sub-base layer 111, the first intermediate barrier layer 112, the second intermediate barrier layer 113, and the second sub-base layer 114 may be sequentially laminated in the third direction DR3.

Each of the first sub-base layer 111 and the second sub-base layer 114 may include at least one of polyimide-based resin, acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. In this specification, meanwhile, "~~"-based resin means that the "~~"-based resin includes a functional group of "~~". A barrier layer BR may be disposed on the substrate 110. The barrier layer BR may include a first sub-barrier layer BR1 disposed on the substrate 110 and a second sub-barrier layer BR2 disposed on the first sub-barrier layer BR1.

Each of the first and second intermediate barrier layers 112 and 113 and the first and second sub-barrier layers BR1 and BR2 may include an inorganic material. Each of the first and second intermediate barrier layers 112 and 113 and the first and second sub-barrier layers BR1 and BR2 may include at least one of silicon oxide, silicon nitride, silicon oxynitride, or amorphous silicon. For example, each of the first and second sub-base layers 111 and 114 may include polyimide having a refractive index of about 1.9. The first intermediate barrier layer 112 and the first sub-barrier layer BR1 may include silicon oxynitride (SiON) having a refractive index of about 1.72. The second intermediate barrier layer 113 and the second sub-barrier layer BR2 may include silicon oxide (SiO$_x$) having a refractive index of about 1.5.

That is, the refractive index of the first intermediate barrier layer 112 may have a value between the refractive index of the first sub-base layer 111 and the refractive index of the second intermediate barrier layer 113. The refractive index of the first sub-barrier layer BR1 may have a value between the refractive index of the second sub-base layer 114 and the refractive index of the second sub-barrier layer BR2. As a difference in refractive index between adjoining layers decreases, reflection at an interface between the adjoining layers may be reduced. As a result, the degree of transmission of light passing through the transmissive areas TP may be improved.

The first sub-base layer 111 may be thicker than the second sub-base layer 114. For example, a thickness of the first sub-base layer 111 may be about 100,000 angstroms, and a thickness of the second sub-base layer 114 may be about 56,000 angstroms. However, the thickness of each of the first and second sub-base layers 111 and 114 is not limited to the above-described value.

The first intermediate barrier layer 112 may be thinner than the second intermediate barrier layer 113, and the first sub-barrier layer BR1 may be thinner than the second sub-barrier layer BR2. For example, a thickness of the first intermediate barrier layer 112 may be about 1,000 angstroms, a thickness of the second intermediate barrier layer 113 may be about 5,000 angstroms, a thickness of the first sub-barrier layer BR1 may be about 1,000 angstroms, and a thickness of the second sub-barrier layer BR2 may be about 4,000 angstroms. However, the thickness of each of the first and second intermediate barrier layers 112 and 113 and the first and second sub-barrier layers BR1 and BR2 is not limited to the above-described value.

The light blocking layer BML may be disposed on the barrier layer BR. The light blocking layer BML may be disposed to overlap the first area A1 and may not be disposed to overlap the second area A2. The light blocking layer BML may have a first opening BM-OP defining the transmissive area TP. The light blocking layer BML may be a pattern serving as a mask when an electrode opening CE-OP is formed in a common electrode CE. For example, light is irradiated from a rear surface of the substrate 110 toward the common electrode CE and the capping layer CPL. The light irradiated from the rear surface of the substrate 110 may pass through the first opening BM-OP of the light blocking layer BML to reach a portion of each of the common electrode CE and a the capping layer CPL to expose the photoresist. That is, the exposed portion of each of the common electrode CE and the capping layer CPL may be removed by the light that has passed through the first opening BM-OP of the light blocking layer BML, and to form a common electrode CE and the capping layer CPL having an opening in an area corresponding to the transmissive area TP. The light may be a laser beam.

The light blocking layer BML may include molybdenum (Mo), an alloy containing molybdenum, silver (Ag), an alloy containing silver, aluminum (Al), an alloy containing aluminum, aluminum nitride (AlN), tungsten (W), tungsten nitride (WN), copper (Cu), titanium (Ti), p+ doped amorphous silicon, MoTaOx, and the like, but the light blocking layer BML is not particularly limited thereto. The light blocking layer BML may be referred to as a back metal layer or a back layer.

In the first area A1, an area overlapping the first opening BM-OP may be defined as the transmissive area TP and the remaining area may be defined as an element area EP. Each of the plurality of first pixels PX11, PX12, and PX13 (see FIG. 5) may be disposed in the element area EP and may be spaced apart from the transmissive area TP.

At least one lower insulating layer BMB may be disposed between the light blocking layer BML and the barrier layer BR. A lower insulating layer opening ML-OP overlapping the first opening BM-OP may be defined in the at least one lower insulating layer BMB. The first opening BM-OP and the lower insulating layer opening ML-OP may be simultaneously formed through the same process. Accordingly, a sidewall of the light blocking layer BML defining the first opening BM-OP may be aligned with a sidewall of the lower insulating layer BMB defining the lower insulating layer opening ML-OP.

A first pixel circuit PC1 may be spaced apart from the first opening BM-OP of the light blocking layer BML and the lower insulating layer opening ML-OP of the lower insulating layer BMB. That is, the first pixel circuit PC1 may not overlap each of the first opening BM-OP of the light blocking layer BML and the lower insulating layer opening ML-OP of the lower insulating layer BMB in a plan view.

The at least one lower insulating layer BMB may include a first lower insulating layer BL1 disposed between the barrier layer BR and the light blocking layer BML, and a second lower insulating layer BL2 disposed between the first lower insulating layer BL1 and the barrier layer BR.

Each of the first and second lower insulating layers BL1 and BL2 may include an inorganic material. For example, each of the first and second lower insulating layers BL1 and BL2 may include at least one of silicon oxide, silicon nitride, silicon oxynitride, or amorphous silicon. For example, the first lower insulating layer BL1 may include silicon oxide having a refractive index of about 1.5, and the second lower insulating layer BL2 may include amorphous silicon having a refractive index of about 1.7.

The refractive index of the first lower insulating layer BL1 and the refractive index of the second lower insulating layer BL2 may be different from each other. For example, the refractive index of the first lower insulating layer BL1 may be lower than that of the second lower insulating layer BL2 but is not particularly limited thereto. For example, the refractive index of the first lower insulating layer BL1 may be higher than that of the second lower insulating layer BL2.

As the first and second lower insulating layers BL1 and BL2 are sequentially disposed on a lower portion of the light blocking layer BML, reflection from the light blocking layer BML may be reduced. For example, light incident toward a rear surface of the light blocking layer BML or light reflected from the rear surface of the light blocking layer BML may destructively interfere in the first and second lower insulating layers BL1 and BL2. As a result, a probability that a noise image, e.g., a ghost phenomenon occurs in an image acquired from the camera module CMM (see FIG. 2A) may be reduced or eliminated. Accordingly, the quality of a signal obtained or received from the camera module CMM (see FIG. 2A) may be improved. The first and second lower insulating layers BL1 and BL2 may be respectively referred to as first and second noise prevention layers.

Although, in FIG. 9, two lower insulating layers, i.e., the first and second lower insulating layers BL1 and BL2 are illustrated as an example to be disposed on the lower portion of the light blocking layer BML, an embodiment of the inventive concept is not limited thereto. For example, the lower insulating layer BMB disposed on the lower portion of the light blocking layer BML may be constituted of one layer or may be constituted of three or more layers.

A thickness of the first lower insulating layer BL1 and a thickness of the second lower insulating layer BL2 may be the same. For example, each of the thicknesses of the first lower insulating layer BL1 and the second lower insulating layer BL2 may be about 130 angstroms but is not particularly limited thereto. In addition, the thicknesses of the first lower insulating layer BL1 and the second lower insulating layer BL2 may be different from each other.

A buffer layer BF may be provided in both the first area A1 and the second area A2. The buffer layer BF may be disposed on the barrier layer BR and may cover the light blocking layer BML and the at least one lower insulating layer BMB disposed in the first area A1. The buffer layer BF may prevent metal atoms or impurities from diffusing from the substrate 110 into a first semiconductor pattern. In addition, the buffer layer BF may adjust a thermal conductivity of the first semiconductor pattern during a crystallization process for forming the first semiconductor pattern, so that the first semiconductor pattern may be uniformly formed.

The buffer layer BF may cover the first opening BM-OP and the lower insulating layer opening ML-OP and may overlap the transmissive area TP. The buffer layer BF may include a first sub-buffer layer BF1 and a second sub-buffer layer BF2 disposed on the first sub-buffer layer BF1. Each of the first sub-buffer layer BF1 and the second sub-buffer layer BF2 may include at least one of silicon oxide, silicon nitride, or silicon oxynitride. For example, the first sub-buffer layer BF1 may include silicon nitride and the second sub-buffer layer BF2 may include silicon oxide.

A portion of the second sub-buffer layer BF2 overlapping the transmissive area TP may be removed. Accordingly, a thickness TKa of a portion of the second sub-buffer layer BF2 disposed in the element area EP may be greater than a thickness TKb of a portion of the second sub-buffer layer BF2 disposed in the transmissive area TP. For example, the thickness TKb of the portion of the second sub-buffer layer BF2 disposed in the transmissive area TP may be about 500 angstroms but is not particularly limited thereto.

Each of the plurality of first pixels PX11, PX12, and PX13 (see FIG. 5) may include a first light emitting element LD1 and the first pixel circuit PC1, and each of the plurality of second pixels PX21, PX22, and PX23 may include a second light emitting element LD2 and the second pixel circuit PC2. The first light emitting element LD1 may be disposed in the element area EP and the second light emitting element LD2 may be disposed in the second area A2.

FIG. 9 is a cross-sectional view of a portion of the first light emitting element LD1 and the first pixel circuit PC1 disposed in the first area A1, and FIG. 10 is a cross-sectional view of a portion of the second light emitting element LD2 and the second pixel circuit PC2 disposed in the second area A2. In addition, a silicon thin film transistor S-TFT and an oxide thin film transistor O-TFT of the second pixel circuit PC2 are illustrated in FIG. 10.

Referring to FIG. 10, a first light blocking layer BMLa may be disposed on a lower portion of the silicon thin film transistor S-TFT, and a second light blocking layer BMLb may be disposed on a lower portion of the oxide thin film transistor O-TFT. Each of the first light blocking layer BMLa and the second light blocking layer BMLb may be disposed to overlap the second pixel circuit PC2 to protect the second pixel circuit PC2. The first light blocking layer BMLa and the second light blocking layer BMLb may not be disposed in the first area A1.

The first and second light blocking layers BMLa and BMLb may block an electric potential due to polarization of the first sub-base layer 111 or the second sub-base layer 114 from affecting the second pixel circuit PC2. In an embodiment of the inventive concept, the second light blocking layer BMLb may be omitted.

The first light blocking layer BMLa may be surrounded by the second sub-barrier layer BR2. For example, after a portion of the second sub-barrier layer BR2 is formed, the first light blocking layer BMLa may be formed, and a second portion of the second sub-barrier layer BR2 may cover the first light blocking layer BMLa.

The second light blocking layer BMLb may be disposed between the second insulating layer 20 and a third insulating layer 30. The second light blocking layer BMLb may be disposed on the same layer as the second electrode CE2 of the storage capacitor Cst. The second light blocking layer BMLb may be connected to a contact electrode BML2-C to receive a constant voltage or a signal. The contact electrode BML2-C may be disposed on the same layer as a gate GT2 of the oxide thin film transistor O-TFT. Each of the first and second light blocking layers BMLa and BMLb may include the same material as the light blocking layer BML or may include a material different from that of the light blocking layer BML.

The first semiconductor pattern may be disposed on the buffer layer BF. The first semiconductor pattern may include a silicon semiconductor. For example, the silicon semiconductor may include amorphous silicon, polycrystalline silicon, and the like. For example, the first semiconductor pattern may include low-temperature polysilicon.

FIG. 9 and FIG. 10 illustrate only a portion of the first semiconductor pattern disposed on the buffer layer BF, and another portion of the first semiconductor pattern may be further disposed in another area. The first semiconductor pattern may be arranged in a specific rule across the pixels. The first semiconductor pattern may have different electrical properties depending on whether the same is doped. The first semiconductor pattern may include a first region having a high conductivity and a second region having a low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped in a lower concentration than the first region.

Conductivity of the first region may be higher than that of the second region, and the first region may substantially serve as an electrode or a signal line. The second region may substantially correspond to an active region (or a channel) of the transistor. In other words, a portion of the first semiconductor pattern may be the active region of the transistor, another portion may be a source region or a drain region of the transistor, and another portion may be a connection electrode or a connection signal line.

A source region SE1, an active region AC1, and a drain region DE1 of the silicon thin film transistor S-TFT may be formed from the first semiconductor pattern. The source region SE1 and the drain region DE1 may respectively extend in opposite directions from the active region AC1 when viewed in the cross section.

The circuit layer 120 may include a plurality of inorganic insulating layers disposed on the light blocking layer BML. In an embodiment, at least some of the first to third insulating layers 10 to 30 and fourth to fifth insulating layers 40 to 50 sequentially laminated on the buffer layer BF may be inorganic insulating layers. For example, all of the first to fifth insulating layers 10 to 50 may be inorganic insulating layers.

The first insulating layer 10 may be disposed on the buffer layer BF. The first insulating layer 10 may overlap the plurality of pixels in common and may cover the first semiconductor pattern. The first insulating layer 10 may be an inorganic layer and/or an organic layer and may have a single-layer structure or a multilayer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, each of the insulating layers of the circuit layer 120 to be described later may have a single-layer structure or a multilayer structure.

A gate GT1 of the silicon thin film transistor S-TFT is disposed on the first insulating layer 10. The gate GT1 may be a portion of a metal pattern. The gate GT1 overlaps the active region AC1. In a process of doping the first semiconductor pattern, the gate GT1 may function as a self-aligned mask. Although the gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, the material forming the gate GT1 is not particularly limited thereto.

The second insulating layer 20 may be disposed on the first insulating layer 10 and may cover the gate GT1. The second insulating layer 20 may be an inorganic layer and may have a single-layer structure or a multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may be an inorganic layer and may have a single-layer structure or a multilayer structure. For example, the third insulating layer 30 may have a multilayer structure including a silicon oxide layer and a silicon nitride layer. The second electrode CE2 of the storage capacitor Cst may be disposed between the second insulating layer 20 and the third insulating layer 30. In addition, the first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of regions which include a reduction region and a non-reduction region. A region in which the metal oxide is reduced (the reduction region) has a higher conductivity than a region in which the metal oxide is not reduced (the non-reduction region). The reduction region substantially serves as a source/drain of the transistor or a signal line. The non-reduction region substantially corresponds to the active region (or a semiconductor region or the channel) of the transistor. In other words, one portion of the second semiconductor pattern may be the active region of the transistor, another portion may be the source/drain region of the transistor, and the other portion may be a signal transmission region.

A source region SE2, an active region AC2, and a drain region DE2 of the oxide thin film transistor O-TFT may be formed from the second semiconductor pattern. The source region SE2 and the drain region DE2 may respectively extend in opposite directions from the active region AC2 in a cross section.

The fourth insulating layer 40 may be disposed on the third insulating layer 30. The fourth insulating layer 40 may overlap the plurality of pixels in common and may cover the second semiconductor pattern. The fourth insulating layer 40 may be an inorganic layer and may have a single-layer structure or a multilayer structure. The fourth insulating layer 40 may include at least one of aluminum oxide, titanium oxide, silicon oxide, silicon nitride, silicon oxynitride, zirconium oxide, or hafnium oxide.

The gate GT2 of the oxide thin film transistor O-TFT is disposed on the fourth insulating layer 40. The gate GT2 may be a portion of a metal pattern. The gate GT2 overlaps the active region AC2. In a process of doping the second semiconductor pattern, the gate GT2 may function as a self-aligned mask.

The fifth insulating layer 50 may be disposed on the fourth insulating layer 40 and may cover the gate GT2. The fifth insulating layer 50 may be an inorganic layer and/or an organic layer and may have a single-layer structure or a multilayer structure.

A first connection electrode CNE1 may be disposed on the fifth insulating layer 50. The first connection electrode CNE1 may be connected to the drain region DE1 of the silicon thin film transistor S-TFT through a contact hole formed through the first to fifth insulating layers 10, 20, 30, 40, and 50.

Referring to FIG. 9 again, the first pixel circuit PC1 may include a thin film transistor TFT and one of the outermost conductive patterns GT-D. The description of the silicon thin film transistor S-TFT of FIG. 10 may be equally applied to the thin film transistor TFT. The thin film transistor TFT may be electrically connected to the first light emitting element LD1.

The outermost conductive pattern GT-D may be disposed adjacent to the transmissive area TP. The outermost conductive pattern GT-D may be a component disposed closest to the transmissive area TP among components included in the first pixel circuit PC1. That is, in one direction in the cross section defined by line other components of the first pixel circuit PC1 may not be disposed between the outermost conductive pattern GT-D and the transmissive area TP. In the one direction, no other components are disposed between the end of the light blocking layer BML which is disposed adjacent to the transmission area TP and defines the transmissive area TP and the outermost conductive pattern GT-D, so that portions of the first to fifth insulating layers 10, 20, 30, 40, and 50 disposed between the end of the light blocking layer BML which is disposed adjacent to the transmission area TP and the outermost conductive pattern GT-D may be sequentially laminated, and no other components may be disposed therebetween.

The outermost conductive pattern GT-D is not particularly limited and may be variously selected as long as the outermost conductive pattern GT-D is a component disposed closest to the transmissive area TP among the components included in the first pixel circuit PC1. For example, the outermost conductive pattern GT-D may be a connection line connecting the components included in the first pixel circuit PC1 or connecting adjacent first pixels PX11, PX12, and PX13 (see FIG. 5) to each other. For example, the outermost conductive pattern GT-D may be a component that is disposed on the same layer, includes the same material, and is formed by the same process as the gates GT1 and GT2. Alternatively, the outermost conductive pattern GT-D may be a component that is disposed on the same layer, includes the same material, and is formed by the same process as the first connection electrode CNE1 or a second connection electrode CNE2.

The outermost conductive pattern GT-D may be disposed on any one of the plurality of inorganic insulating layers. The outermost conductive pattern GT-D may be disposed on any one of the first to fifth insulating layers 10, 20, 30, 40, and 50. As illustrated in FIG. 9, the outermost conductive pattern GT-D may be disposed on the second insulating layer 20. However, the outermost conductive pattern GT-D is not limited thereto and may be disposed on the first insulating layer 10 or the fifth insulating layer 50.

In the display panel DP according to an embodiment, a distance between the outermost conductive pattern GT-D and the end of the light blocking layer BML which is disposed adjacent to the transmission area TP may be designed to be a predetermined distance or longer in the cross section defined by line II-If, that is, in a cross section of a portion where the first spacer SPC1 is disposed.

Accordingly, in the process of forming the electrode opening CE-OP in the common electrode CE using the light blocking layer BML as a mask, a defect such as a burr may be prevented from occurring in the common electrode CE. A detailed description about designing the distance between the outermost conductive pattern GT-D and the end of the light blocking layer BML which is disposed adjacent to the transmission area TP to be the predetermined distance or longer will be given later when a description is given with reference to FIG. 11A and FIG. 11B.

A second opening IL-OP may be defined in the buffer layer BF and at least some of the plurality of insulating layers 10, 20, 30, 40, and 50 and a plurality of insulating layers 60, 70, and 80 included in the circuit layer 120. For example, the second opening IL-OP may be defined in a portion in a thickness direction of the second sub-buffer layer BF2 and in the first to fifth insulating layers 10, 20, 30, 40, and 50. The second opening IL-OP may be defined in an area overlapping the transmissive area TP. That is, as the portion in the thickness direction of the second sub-buffer layer BF2 and a portion of each of the first to fifth insulating layers 10, 20, 30, 40, and 50 overlapping the transmissive area TP are removed, transmittance of the transmissive area TP may be improved.

A minimum width of the second opening IL-OP may be smaller than a minimum width of the first opening BM-OP. A sidewall of the second sub-buffer layer BF2 and the first to fifth insulating layers 10, 20, 30, 40, and 50 defining the second opening IL-OP may protrude more than the sidewall of the light blocking layer BML toward the center of the transmissive area TP.

The circuit layer 120 may include a plurality of organic insulating layers disposed on the plurality of inorganic insulating layers. For example, at least one of sixth to eighth insulating layers 60, 70, and 80 may be an organic insulating layer.

The sixth insulating layer 60 may be disposed on the fifth insulating layer 50. The sixth insulating layer 60 may include an organic material and may include, for example, polyimide-based resin. The second connection electrode CNE2 may be disposed on the sixth insulating layer 60. The second connection electrode CNE2 may be connected to the first connection electrode CNE1 through a contact hole formed through the sixth insulating layer 60.

The sixth insulating layer 60 may cover the second opening IL-OP. A portion in which the second opening IL-OP is defined may be filled with the sixth insulating layer 60. That is, the sixth insulating layer 60 may overlap the transmissive area TP. As the sixth insulating layer 60 is provided in the transmissive area TP, a step formed by components disposed below the sixth insulating layer 60 may be reduced. When the step formed by components disposed below the sixth insulating layer 60 is reduced, diffraction of light incident on the transmissive area TP may be alleviated (or reduced). Accordingly, image distortion due to the diffraction is reduced, and thus the quality of an image obtained from the camera module CMM (see FIG. 2A) may be enhanced.

In addition, the transmittance of the transmissive area TP may be controlled by adjusting the thickness of the sixth insulating layer 60. The thickness of the sixth insulating layer 60 is about 15,000 angstroms, and thus the thickness thereof may be more easily controlled than thicknesses of other thin insulating layers of several to hundreds of angstroms. Accordingly, as variance of transmittance distribution for electronic devices is reduced and process management may become easier.

In addition, as the sixth insulating layer 60 is provided, it is possible to secure the thickness uniformity of the seventh insulating layer 70, the eighth insulating layer 80, and the pixel defining film PDL that are disposed on the sixth insulating layer 60.

The seventh insulating layer 70 may be disposed on the sixth insulating layer 60 and may cover the second connection electrode CNE2. The eighth insulating layer 80 may be disposed on the seventh insulating layer 70.

Each of the sixth insulating layer 60, the seventh insulating layer 70, and the eighth insulating layer 80 may be an organic layer. In this specification, the sixth insulating layer 60 may be referred to as a first organic insulating layer, the seventh insulating layer 70 as a second organic insulating layer, and the eighth insulating layer 80 as a third organic insulating layer. For example, each of the sixth insulating layer 60, the seventh insulating layer 70, and the eighth insulating layer 80 may include benzocyclobutene (BCB), polyimide, hexamethyldisiloxane (HMDSO), a general-purpose polymer such as polymethylmethacrylate (PMMA) and polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, blends thereof, and the like.

A third opening 70-OP may be defined in the seventh insulating layer 70. A portion of the third opening 70-OP may overlap the transmissive area TP. A minimum width of the third opening 70-OP may be greater than the minimum width of the first opening BM-OP. That is, an end of the sidewall of the light blocking layer BML may protrude more than an end of a sidewall of the seventh insulating layer 70 toward the center of the transmissive area TP. The end of the sidewall of the seventh insulating layer 70 may be spaced apart from the transmissive area TP by a predetermined distance.

The outermost conductive pattern GT-D may be disposed closer to the transmissive area TP than an end of the seventh insulating layer 70. The distance in one direction from the end of the light blocking layer BML which is disposed adjacent to the transmission area TP and defines the transmissive area TP to the outermost conductive pattern GT-D may be shorter than a distance in the one direction from the end of the light blocking layer BML which is disposed adjacent to the transmission area TP to the end of the seventh insulating layer 70. However, an embodiment of the inventive concept is not limited thereto, and the end of the seventh insulating layer 70 may be disposed closer to the transmissive area TP than the outermost conductive pattern GT-D.

Referring to FIG. 9 and FIG. 10 together, the light emitting element layer 130 including the first and second light emitting elements LD1 and LD2 may be disposed on the circuit layer 120. Each of the first and second light emitting elements LD1 and LD2 may include a pixel electrode AE, a first functional layer HFL, a light emitting layer EL, a second functional layer EFL, and the common electrode CE. The first functional layer HFL, the second functional layer EFL, and the common electrode CE may be formed in common throughout the pixels PX (see FIG. 4).

The pixel electrode AE may be disposed on the eighth insulating layer 80. The pixel electrode AE may be a (semi-)transmissive electrode or a reflective electrode. In an embodiment, the pixel electrode AE may include a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may include at least one selected from a group including indium tin oxide (ITO), indium zinc oxide (IZO), indium gallium zinc oxide (IGZO), zinc oxide (ZnO) or indium oxide (In2O3), and aluminum-doped zinc oxide (AZO). For example, the pixel electrode AE may be formed of ITO/Ag/ITO.

The pixel defining film PDL may be disposed on the eighth insulating layer 80. The pixel defining film PDL may have a property of absorbing light and may have, for example, a black color. The pixel defining film PDL may include a black coloring agent. The black coloring agent may include a black dye or a black pigment. The black coloring agent may include carbon black, a metal such as chromium, or oxide thereof.

An opening PDL-OP exposing a portion of the pixel electrode AE may be defined in the pixel defining film PDL. That is, the pixel defining film PDL may cover edges of the pixel electrode AE. In addition, the pixel defining film PDL may cover a side surface of the eighth insulating layer 80 adjacent to the transmissive area TP.

The first functional layer HFL may be disposed on the pixel electrode AE and the pixel defining film PDL. The first functional layer HFL may include a hole transport layer HTL, a hole injection layer HIL, or both the hole transport layer HTL and the hole injection layer HIL. The first functional layer HFL may be disposed in the entirety of the first area A1 and the second area A2 and may also be disposed in the transmissive area TP.

The light emitting layer EL may be disposed on the first functional layer HFL and may be disposed in an area corresponding to the opening PDL-OP of the pixel defining film PDL. The light emitting layer EL may include an organic material, an inorganic material, or an organic-inorganic material that emits light of a predetermined color. The light emitting layer EL may be disposed in the first area A1 and the second area A2. The light emitting layer EL disposed in the first area A1 may be disposed in an area spaced apart from the transmissive area TP, that is, in the element area EP.

The second functional layer EFL may be disposed on the first functional layer HFL and may cover the light emitting layer EL. The second functional layer EFL may include an electron transport layer ETL, an electron injection layer EIL, or both the electron transport layer ETL and the electron injection layer EIL. The second functional layer EFL may be disposed in the entirety of the first area A1 and the second area A2 and may also be disposed in the transmissive area TP.

The common electrode CE may be disposed on the second functional layer EFL. The common electrode CE may be disposed in the first area A1 and the second area A2. The electrode opening CE-OP overlapping the first opening BM-OP may be defined in the common electrode CE. A minimum width of the electrode opening CE-OP may be greater than the minimum width of the first opening BM-OP of the light blocking layer BML.

The light emitting element layer 130 may further include the capping layer CPL disposed on the common electrode CE. The capping layer CPL may include LiF, an inorganic material, and/or an organic material. A portion of the capping layer CPL overlapping the electrode opening CE-OP of the common electrode CE may be removed. As the portion of the capping layer CPL including a portion overlapping the transmissive area TP and a portion of the common electrode CE are removed, the light transmittance of the transmissive area TP may be further improved.

Referring to FIG. 9, the light emitting element layer 130 included in the plurality of first pixels disposed in the first area A1 may further include the spacer SPC. The spacer SPC may be disposed on the pixel defining film PDL. The spacer SPC may be a component supporting to maintain a predetermined distance between the components included in the circuit layer 120 and the light emitting element layer 130 disposed in a lower portion and components included in the sensor layer 200 and the anti-reflection layer 300 disposed in an upper portion. The spacer SPC may include an organic material. The spacer SPC may also include the black coloring agent as the pixel defining film PDL does.

As illustrated in FIG. 9, the first spacer SPC1 may be disposed on a portion of the pixel defining film PDL closer to the transmissive area TP. The first spacer SPC1 may be thicker than the second spacer SPC2 (see FIG. 7A) disposed between the plurality of first pixels in a plan view. In an embodiment, the first spacer SPC1 may have a thickness of about 1.0 μm to about 1.4 μm in the third direction DR3. As the thicker first spacer SPC1 is disposed on the pixel defining film PDL in a portion closer to the transmissive area TP, the organic layers included in the circuit layer 120 and the light emitting element layer 130 may have a greatly increased total thickness in the portion closer to the transmissive area TP.

The encapsulation layer 140 may be disposed on the light emitting element layer 130. The encapsulation layer 140 may include an inorganic layer 141, an organic layer 142, and an inorganic layer 143 sequentially laminated, but layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylate-based organic layer but is not limited thereto.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be directly disposed on the display layer 100. The sensor base layer 210 may be an inorganic layer including at least one of silicon nitride, silicon oxynitride, or silicon oxide. Alternatively, the sensor base layer 210 may be an organic layer including epoxy resin, acrylic resin, or imide-based resin. The sensor base layer 210 may have a single-layer structure or a multilayer structure laminated in the third direction DR3.

Each of the first sensor conductive layer 220 and the second sensor conductive layer 240 may have a single-layer structure or may have a multilayer structure laminated in the third direction DR3.

The conductive layer of the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and indium zinc tin oxide (IZTO). In addition, the transparent conductive layer may include a conductive polymer such as PEDOT, metal nanowires, graphene, and the like.

The conductive layer of the multilayer structure may include metal layers. The metal layers may have, for example, a three-layer structure of titanium/aluminum/titanium. The conductive layer of the multilayer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensor insulating layer 230 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

The sensor cover layer 250 may be disposed on the sensor insulating layer 230 and may cover the second sensor conductive layer 240. The sensor cover layer 250 may cover the conductive layer 240 and may reduce or eliminate a probability of damage to the conductive layer 240 in a subsequent process.

The sensor cover layer 250 may include an inorganic material. For example, the sensor cover layer 250 may include silicon nitride but is not particularly limited thereto.

The anti-reflection layer 300 may be disposed on the sensor layer 200. The anti-reflection layer 300 may include the division layer 310, a plurality of color filters 320, and a planarization layer 330. The division layer 310 and the color filters 320 are not disposed in the transmissive area TP of the first area A1.

The division layer 310 may be disposed to overlap the second sensor conductive layer 240 in a plan view. The sensor cover layer 250 may be disposed between the division layer 310 and the second sensor conductive layer 240. The division layer 310 may prevent reflection of external light by the second sensor conductive layer 240. A material constituting the division layer 310 is not particularly limited as long as the material absorbs light. The division layer 310 may be a layer having a black color and may include, in an embodiment, a black coloring agent. The black coloring agent may include a black dye or a black pigment. The black coloring agent may include carbon black, a metal such as chromium, or oxide thereof.

A plurality of division openings 3100P and a transmissive opening 31-OP may be defined in the division layer 310. The light emitting layer EL may be provided in plurality. The plurality of division openings 3100P may respectively overlap the plurality of light emitting layers EL. The color filters 320 may be disposed to respectively correspond to the plurality of division openings 3100P. Each of the color filters 320 may transmit light provided from the light emitting layer EL overlapping the color filter 320.

The transmissive opening 31-OP of the division layer 310 may overlap the first opening BM-OP of the light blocking layer BML. A minimum width of the transmissive opening 31-OP of the division layer 310 may be substantially the same as the minimum width of the first opening BM-OP of the light blocking layer BML. That is, in an area adjacent to the transmissive area TP, the edge of the division layer 310 may be substantially aligned with the edge of the light blocking layer BML. Meanwhile, in this specification, the expression that a component and another component are "substantially aligned with" each other or have "substantially the same" width includes a case that the two components are aligned or have the same width within a range of error margin occurring in the process in spite of being aligned or having the same width in design, in addition to a case that the two components are completely aligned or have physically the same width.

In an area adjacent to the transmissive area TP, the end of the division layer 310 may protrude more than an end of the pixel defining film PDL and an end of the common electrode CE toward the center of the transmission area TP. In a plan view, the end of the division layer 310 may protrude more than an end of the outermost conductive pattern GT-D toward the center of the transmission area TP. The transmissive opening 31-OP of the division layer 310 may define the transmissive area TP.

The planarization layer 330 may cover the division layer 310 and the color filters 320. The planarization layer 330 may include an organic material and may provide a flat surface on a top surface of the planarization layer 330. In an embodiment, the planarization layer 330 may be omitted.

Figure 11A:
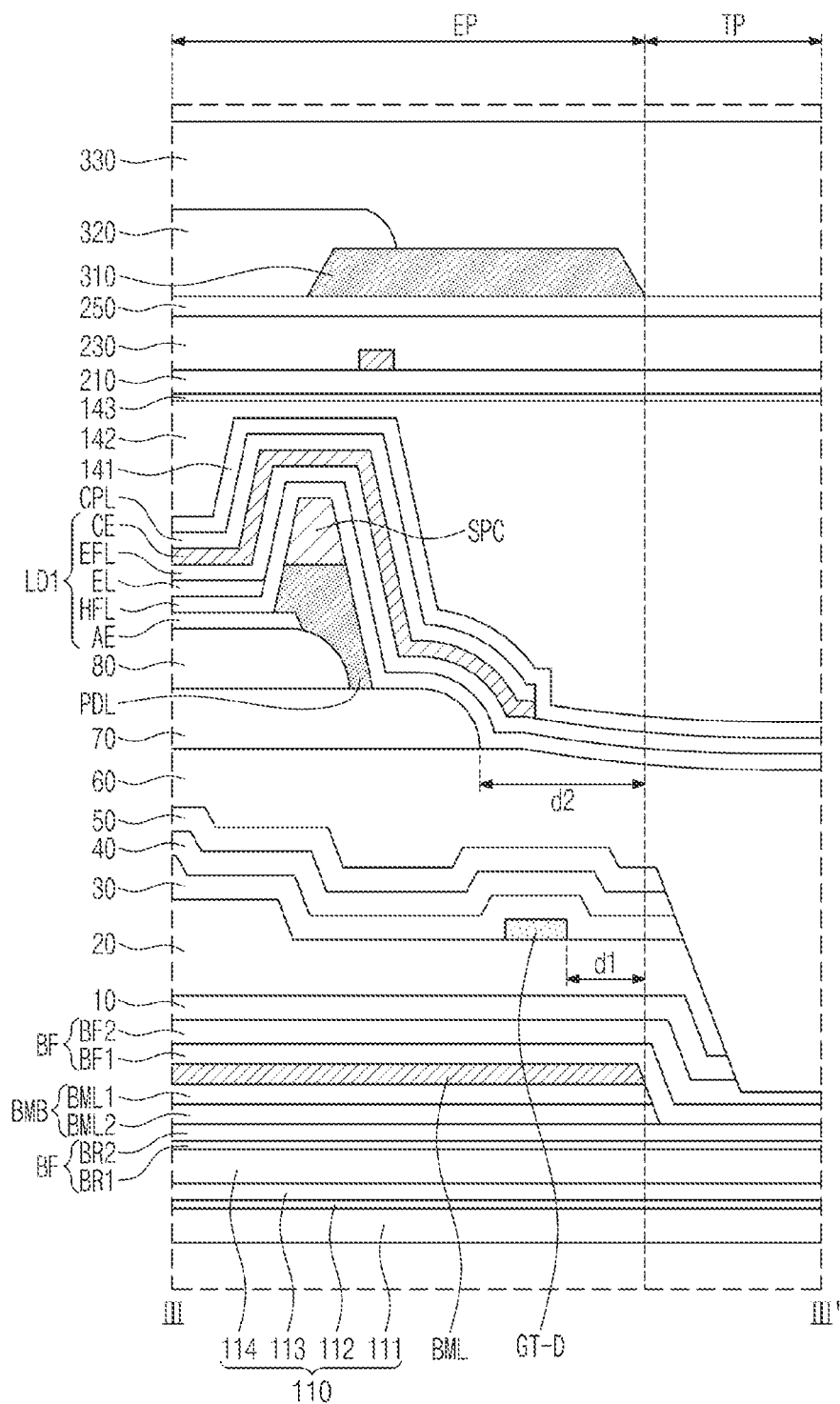
FIG. 11A is a cross-sectional view illustrating a partial area of a first area of a display panel according to an embodiment of the inventive concept.
Figure 11B:
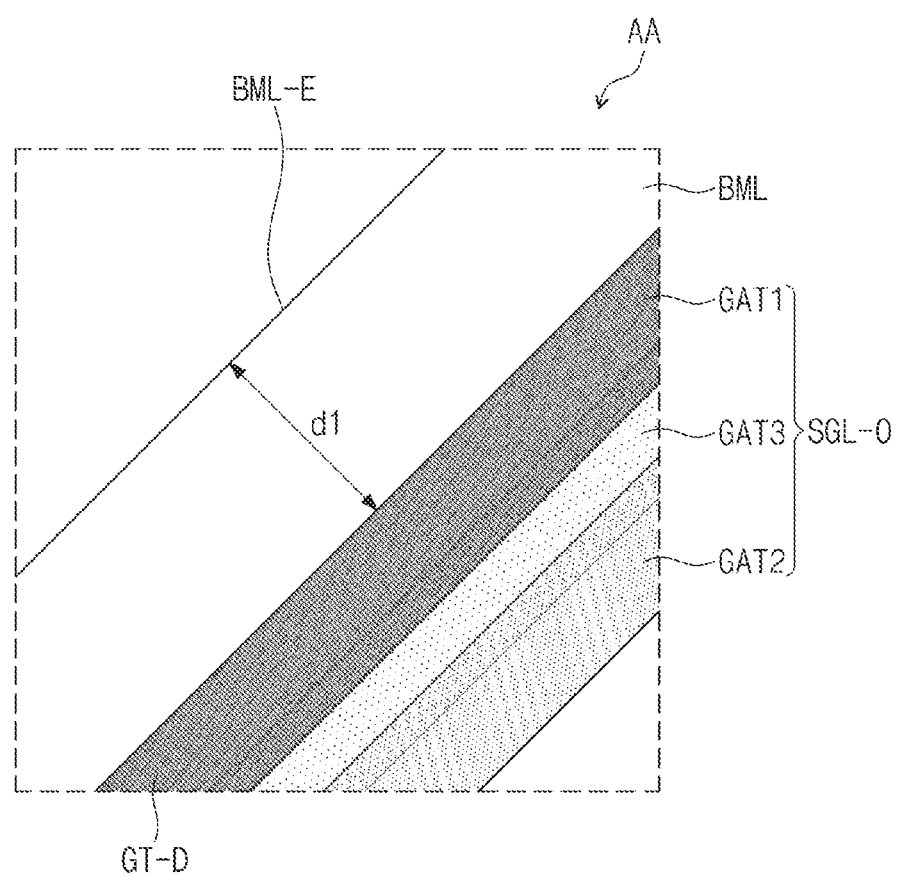
FIG. 11B is a plan view illustrating a partial area of a first area of a display panel according to an embodiment of the inventive concept.

FIG. 11A is a cross-sectional view illustrating a partial area of the first area A1 of the display panel DP according to an embodiment of the inventive concept. FIG. 11B is a plan view illustrating a partial area of the first area A1 of the display panel DP according to an embodiment of the inventive concept. FIG. 11A illustrates a cross section taken along line illustrated in FIG. 7A. FIG. 11A illustrates a cross section of a portion where the first spacer SPC1 illustrated in FIG. 7A is disposed. FIG. 11B is an enlarged plan view illustrating the area AA illustrated in FIG. 7A and FIG. 7B. FIG. 11B is a plan view of a portion where the first spacer SPC1 illustrated in FIG. 7A is disposed.

Referring to FIG. 11A and FIG. 11B together, in the cross section corresponding to line of FIG. 7A and in a plane corresponding to the area AA of FIG. 7B, in other words, in the portion where the first spacer SPC1 is disposed, the distance between the outermost conductive pattern GT-D and the end of the light blocking layer BML which is disposed adjacent to the transmission area TP may have a first distance d1. The first distance d1 may be about 5 micrometers to about 20 micrometers. When the first distance d1 is shorter than about 5 micrometers, burrs may be generated in the common electrode CE in a process of patterning the common electrode CE using the light blocking layer BML as a mask. When the first distance d1 is longer than about 20 micrometers, the surface area of an area in which the transmissive area TP is defined may be reduced, and thus the transmittance of the first area A1 may decrease.

Referring to FIG. 7B, FIG. 8A, and FIG. 11B together, the first distance d1 may be a minimum distance between an edge of a corresponding one of the above-described target portions BML-E which is disposed adjacent to the transmission area TP and the edge of the outermost conductive pattern GT-D. In an embodiment, the outermost conductive pattern GT-D may be any one of the gate lines GAT1 and GAT2 and a gate line GAT3 disposed adjacent to the target portion BML-E of the light blocking layer BML. The gate lines GAT1, GAT2, and GAT3 may be lines included in the outer signal lines SGL-O. In other words, the outermost conductive patterns GT-D disposed closest to the target portions BML-E among the plurality of signal lines SGL disposed in the first pixel group PX1 may be the gate lines GAT1, GAT2, and GAT3 included in the outer signal lines SGL-O. In portions adjacent to the target portions BML-E, the outermost conductive patterns GT-D may be gate lines GAT1, GAT2, and GAT3 included in the first outer signal lines SGL-O1 extending in the horizontal direction. However, the outermost conductive patterns GT-D are not limited thereto and may be gate lines GAT1, GAT2, and GAT3 included in the second outer signal lines SGL-O2 extending in the vertical direction. In an embodiment, outermost conductive patterns GT-D adjacent to target portions BML-E on the left and right sides among the target portions BML-E illustrated in FIG. 8A may be the gate lines GAT1, GAT2, and GAT3 included in the first outer signal lines SGL-O1 extending in the horizontal direction, and outermost conductive patterns GT-D adjacent to target portions BML-E on the upper and lower sides may be the gate lines GAT1, GAT2, and GAT3 included in the second outer signal lines SGL-O2 extending in the vertical direction. The scan signal or the data signal may be transmitted through the gate lines GAT1, GAT2, and GAT3.

In a plan view corresponding to the area AA, that is, in the plan view of the portion where the first spacer SPC1 is disposed, the gate lines GAT1, GAT2, and GAT3 may be lines extending in a direction parallel to an edge of the target portion BML-E which is a straight-line. The gate lines GAT1, GAT2, and GAT3 may be signal lines that extend along the periphery of the first pixel group PX1 and connect adjacent first pixel groups PX1. The gate lines GAT1, GAT2, and GAT3 may include the first gate line GAT1 disposed on the above-described second insulating layer 20 (see FIG. 9), the second gate line GAT2 disposed on the first insulating layer 10 (see FIG. 9), and a third gate line GAT3 disposed on the third insulating layer 30 (see FIG. 9). At least portions of the first gate line GAT1, the second gate line GAT2, and the third gate line GAT3 may overlap in a plan view. For example, as illustrated in FIG. 11B, portions of the third gate line GAT3 may respectively overlap the first gate line GAT1 and the second gate line GAT2 in a plan view. A line closest to an end of the target portion BML-E among the first gate line GAT1, the second gate line GAT2, and the third gate line GAT3 may be the outermost conductive pattern GT-D. That is, in the embodiment illustrated in FIG. 11B, the first gate line GAT1 may correspond to the outermost conductive pattern GT-D. However, an embodiment of the inventive concept is not limited thereto, and layers on which the gate lines GAT1, GAT2, and GAT3 are disposed and a gate line of the gate lines GAT1, GAT2, and GAT3 disposed close to the target portion BML-E may be variously selected according to a line design. In an embodiment, for target portions BML-E located in an upper right quadrant among the target portions BML-E illustrated in FIG. 8A, the first gate line GAT1 may correspond to the outermost conductive pattern GT-D. For target portions BML-E located in a lower left quadrant among the target portions BML-E illustrated in FIG. 8A, the second gate line GAT2 may correspond to the outermost conductive pattern GT-D. For a right target portion BML-E among target portions BML-E located in a lower right quadrant illustrated in FIG. 8A, the first gate line GAT1 may be the outermost conductive pattern GT-D, and for a lower target portion BML-E, the second gate line GAT2 may be the outermost conductive pattern GT-D. For a left target portion BML-E among target portions BML-E located in an upper left quadrant illustrated in FIG. 8A, the first gate line GAT1 may be the outermost conductive pattern GT-D, and for an upper target portion BML-E, the second gate line GAT2 may be the outermost conductive pattern GT-D.

Each of the outer signal lines SGL-O may include at least one of the gate lines GAT1, GAT2, and GAT3, and any one of the gate lines GAT1, GAT2, and GAT3 included in the outer signal lines SGL-O may be the outermost conductive pattern GT-D disposed adjacent to the target portion BML-E.

Meanwhile, for each of the $1\text{-}1^{st}$ outer signal line SGL-O11, the $1\text{-}2^{nd}$ outer signal line SGL-O12, the $2\text{-}1^{st}$ outer signal lines SGL-O21, and the $2\text{-}2^{nd}$ outer signal lines SGL-O22 illustrated in FIG. 7B, the outermost conductive patterns GT-D disposed adjacent to the target portions BML-E may be the same as or different from each other. In an embodiment, an outermost conductive pattern GT-D disposed adjacent to a corresponding one of the target portions BML-E in the $1\text{-}1^{st}$ outer signal line SGL-O11 and an outermost conductive pattern GT-D disposed adjacent to a corresponding one of the target portions BML-E in the $2\text{-}2^{nd}$ outer signal lines SGL-O22 may be lines disposed on the same layer, and an outermost conductive pattern GT-D disposed adjacent to a corresponding one of the target portions BML-E in the $1\text{-}2^{nd}$ outer signal line SGL-O12 and an outermost conductive pattern GT-D disposed adjacent to a corresponding one of the target portions BML-E in the $2\text{-}1^{st}$ outer signal lines SGL-O21 may be lines disposed on the same layer, and the $1\text{-}1^{st}$ outer signal line SGL-O11 and the $2\text{-}2^{nd}$ outer signal lines SGL-O22 may be lines disposed on a layer different from that on which the $1\text{-}2^{nd}$ outer signal line SGL-O12 and the $2\text{-}1^{st}$ outer signal lines SGL-O21 are disposed. For example, the outermost conductive patterns GT-D respectively disposed adjacent to the target portions BML-E in the $1\text{-}1^{st}$ outer signal line SGL-O11 and the $2\text{-}2^{nd}$ outer signal lines SGL-O22 may be the first gate line GAT1. The outermost conductive patterns GT-D respectively disposed adjacent to the target portions BML-E in the $1\text{-}2^{nd}$ outer signal line SGL-O12 and the $2\text{-}1^{st}$ outer signal lines SGL-O211 may be the second gate line GAT2. That is, the outermost conductive patterns GT-D respectively disposed adjacent to the target portions BML-E in the $1\text{-}1^{st}$ outer signal line SGL-O11 and the $2\text{-}2^{nd}$ outer signal lines SGL-O221 may be a line disposed on the second insulating layer 20 (see FIG. 9), and the outermost conductive patterns GT-D respectively disposed adjacent to the target portions BML-E in the $1\text{-}2^{nd}$ outer signal line SGL-O12 and the $2\text{-}1^{st}$ outer signal lines SGL-O211 may be a line disposed on the first insulating layer 10 (see FIG. 9).

Referring back to FIG. 11A, in the cross section of the portion where the first spacer SPC1 is disposed, the outermost conductive pattern GT-D may be disposed closer to the transmissive area TP than the end of the seventh insulating layer 70. The first distance d1 in one direction from the end of the light blocking layer BML which is disposed adjacent to the transmission area TP and defines the transmissive area TP to the outermost conductive pattern GT-D may be shorter than a second distance d2 in the one direction from the end of the light blocking layer BML which is disposed adjacent to the transmission area TP to the end of the seventh insulating layer 70. However, an embodiment of the inventive concept is not limited thereto, and the end of the seventh insulating layer 70 may be disposed closer to the transmissive area TP than the outermost conductive pattern GT-D, so that the second distance d2 may be shorter than the first distance d1. The second distance d2 may be about 5 micrometers to about 20 micrometers. When the second distance d2 is shorter than about 5 micrometers, burrs may be generated in the common electrode CE in the process of patterning the common electrode CE using the light blocking layer BML as a mask. When the second distance d2 is longer than about 20 micrometers, the surface area of an area in which the transmissive area TP is defined may be reduced, and thus the transmittance of the first area A1 may decrease. The end of the division layer 310 and the end of the light blocking layer BML which is disposed adjacent to the transmission area TP may be substantially aligned. In the cross section of the portion where the first spacer SPC1 is disposed, each of the end of the division layer 310 and the end of the light blocking layer BML which is disposed adjacent to the transmission area TP may be disposed at a boundary between the transmissive area TP and the element area EP. That is, the end of the division layer 310 and the end of the light blocking layer BML which is disposed adjacent to the transmission area TP may each define the transmissive area TP.

In the first area A1 of the display panel DP according to an embodiment, the distance between the outermost conductive pattern GT-D and the end of the light blocking layer BML which is disposed adjacent to the transmission area TP may be designed to be about 5 micrometers or longer in the cross section of the portion where the first spacer SPC1 is disposed. The portion where the first spacer SPC1 is disposed is a portion where the organic layers, that is, the plurality of organic insulating layers 60, 70, and 80, the pixel defining film PDL, and the first spacer SPC1 are all disposed, and the first spacer SPC1 is thicker than the second spacer SPC2 disposed between the plurality of first pixels. Accordingly, the portion where the first spacer SPC1 is disposed may be a portion having a greater total thickness of the organic layers than other portions. As the total thickness of the organic layers is greater, the portion where the first spacer SPC1 is disposed may be a vulnerable portion that is likely to cause defects such as burrs to the common electrode CE in the process of forming the electrode opening CE-OP in the common electrode CE using the light blocking layer BML as a mask. More specifically, as the distance at which a laser beam is radiated during patterning of the common electrode CE becomes longer when the total thickness of the organic layers increases, the degree of deviation from a target region of the diffracted laser beam may increase, thereby possibility of occurring defects such as burrs in the common electrode CE may increase. In the display panel DP according to an embodiment of the inventive concept, as the distance between the outermost conductive pattern GT-D and the end of the light blocking layer BML which is disposed adjacent to the transmission area TP is designed to be sufficiently longer, i.e., about 5 micrometers or longer in the cross section of the portion where the first spacer SPC1 is disposed, it is possible to prevent light from being blocked by the outermost conductive pattern GT-D and to uniformly irradiate the laser beam for patterning the common electrode that includes a laser beam directly radiated and a laser beam diffracted or reflected to the common electrode CE. Accordingly, the occurrence of defects such as burrs is prevented in the common electrode CE, and thus the components disposed on the common electrode CE may be uniformly formed, and the reliability of the display panel DP may be improved.

In addition, in the first area A1 of the display panel DP according to an embodiment, the end of the division layer 310 and the end of the light blocking layer BML which is disposed adjacent to the transmission area TP may be substantially aligned. When the end of the light blocking layer BML which is disposed adjacent to the transmission area TP protrudes more than the end of the division layer 310, reflection may occur by the protruded light blocking layer BML when viewed from above, so that a flare defect that the protruding light blocking layer BML is brightly viewed may occur. When the end of the division layer 310 protrudes more than the end of the light blocking layer BML which is disposed adjacent to the transmission area TP, the thickness of the end of the division layer 310 formed of an organic material becomes smaller, and thus light blocking may not be performed properly, and accordingly, the boundary of the transmissive area TP may be blurred. In the display panel DP according to an embodiment of the inventive concept, as the end of the division layer 310 and the end of the light blocking layer BML which is disposed adjacent to the transmission area TP are substantially aligned, the flare defect and the defect of the blurred boundary of the transmissive area TP may be prevented, and thus, reliability of the display panel DP may be improved.

Figure 12A:
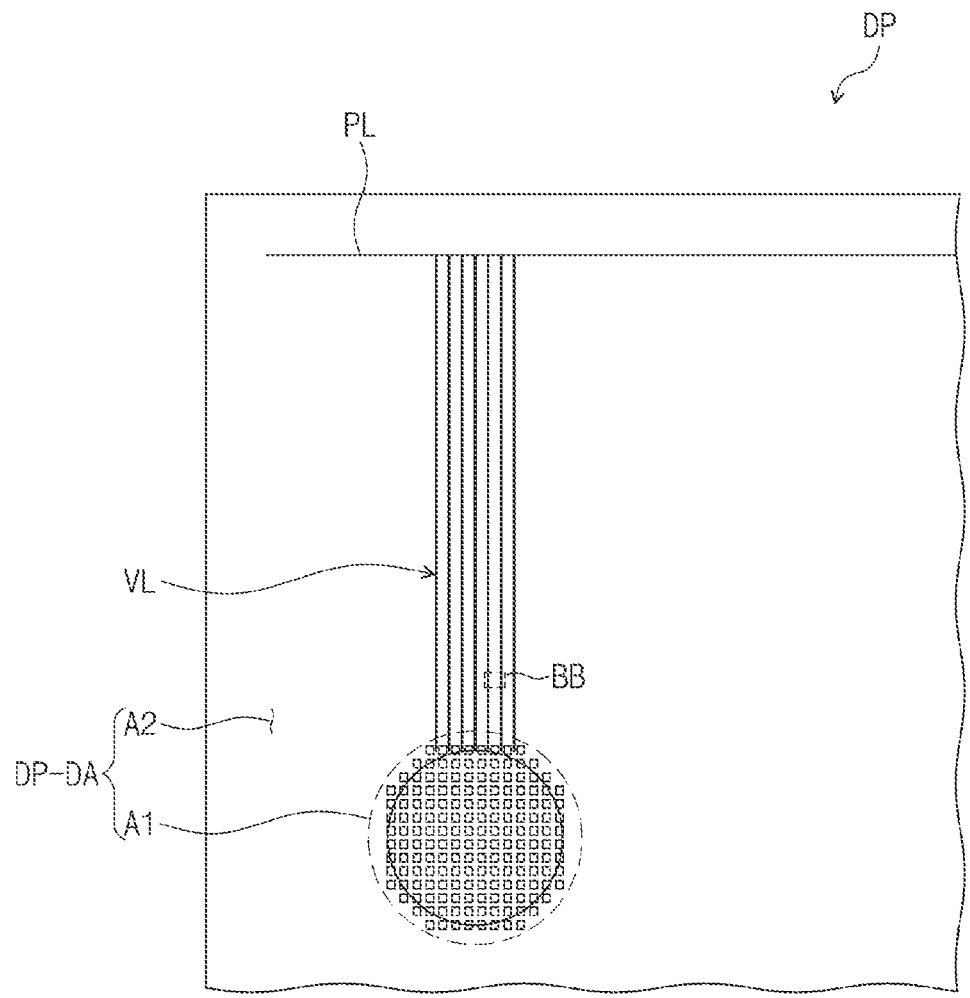
FIG. 12A is a schematic plan view illustrating a partial area of a display panel according to an embodiment of the inventive concept.
Figure 12B:
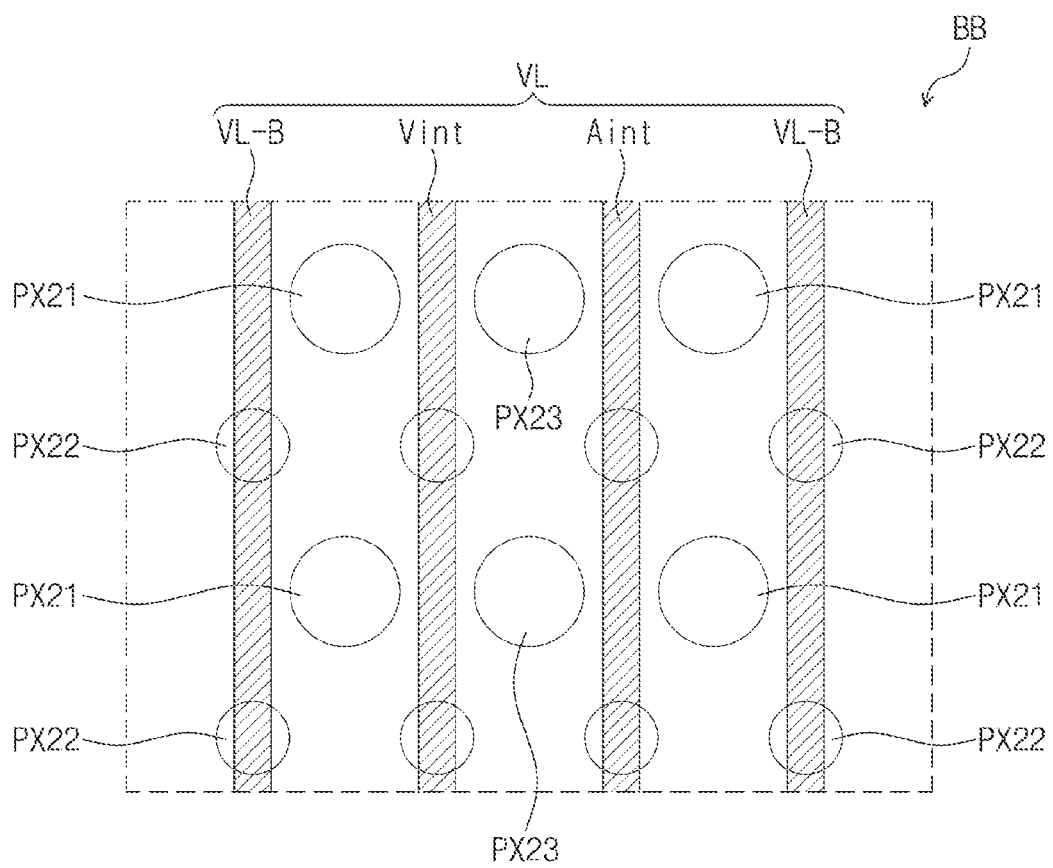
FIG. 12B is an enlarged plan view illustrating a partial area of a display panel.
Figure 12C:
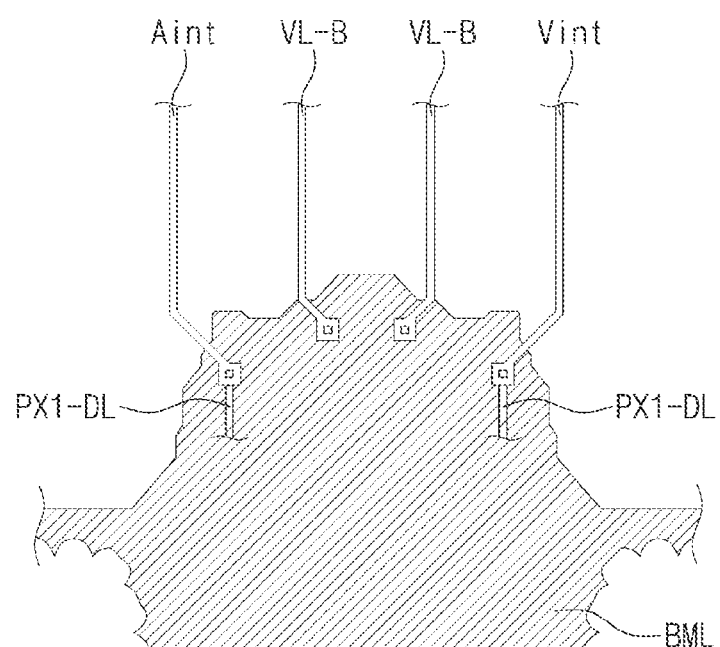
FIG. 12C is a schematic plan view illustrating a line connection relationship of a light blocking layer according to an embodiment of the inventive concept.

FIG. 12A is a schematic plan view illustrating a partial area of the display panel DP according to an embodiment of the inventive concept. FIG. 12B is an enlarged plan view illustrating a partial area of the display panel DP. FIG. 12C is a schematic plan view illustrating a line connection of the light blocking layer BML according to an embodiment of the inventive concept. FIG. 12B is an enlarged view of the area BB of FIG. 12A.

Referring to FIG. 4, FIG. 12A, and FIG. 12B together, the display panel DP may include voltage lines VL connected to the first area A1 of the display area DP-DA, and some of the voltage lines VL may be connected to the light blocking layer BML (see FIG. 9). The voltage lines VL may include a plurality of lines extending in the second direction DR2, and some of the voltage lines VL may be light blocking voltage lines VL-B connected to the light blocking layer BML (see FIG. 9). The voltage lines VL may be connected to the driving voltage line PL.

The voltage lines VL may extend in the second direction DR2 to overlap at least some of the plurality of second pixels PX21, PX22, and PX23. For example, as illustrated in FIG. 12B, the voltage lines VL may be disposed to overlap the second green pixels PX22. The voltage lines VL may be disposed on, for example, the fifth insulating layer 50 (see FIG. 10). The voltage lines VL may be lines disposed on the same layer as the above-described first connection electrode CNE1 (see FIG. 10).

Some of the voltage lines VL may be the light blocking voltage lines VL-B connected to the light blocking layer BML of the first area A1. The voltage lines VL may be lines that transmit the initialization voltage Vint and/or the anode initialization voltage Aint, and some of the voltage lines VL may be light blocking voltage lines VL-B connected to the light blocking layer BML.

Referring to FIGS. 5, 9, 10, and 12A to 12C together, the light blocking voltage lines VL-B may be connected to the light blocking layer BML of the first area A1. The light blocking layer BML may be connected to the light blocking voltage lines VL-B to receive a constant voltage or a signal from the light blocking voltage lines VL-B. More specifically, some of the voltage lines VL transmitting the initialization voltage Vint and/or the anode initialization voltage Aint may be connected to pixel group signal lines PX1-DL to transmit a signal to the first pixel circuit PC1 (see FIG. 9) and the like, and the rest thereof may be connected to the light blocking layer BML to apply the constant voltage or the signal to the light blocking layer BML.

Although FIG. 12C exemplarily illustrates the light blocking voltage lines VL-B connected to the light blocking layer BML disposed to overlap one of the 1-$2^{nd}$ connector pixel groups PX1-C2 (see FIG. 8D), the light blocking voltage lines VL-B may also be connected in the same manner to the light blocking layer disposed to overlap the first central pixel groups PX1-M (see FIG. 8A) and the light blocking layer disposed to overlap the 1-$1^{st}$ connector pixel groups PX1-C1

(see FIG. 8C). Alternatively, the light blocking layer BML disposed to overlap the first central pixel groups PX1-M, the light blocking layer BML disposed to overlap the 1-1$^{st}$ connector pixel groups PX1-C1, and the light blocking layers BML disposed to overlap the 1-2$^{nd}$ connector pixel groups PX1-C2 may be connected to each other to receive the same constant voltage or the same signal from the light blocking voltage lines VL-B.

The light blocking layer BML may be connected to the light blocking voltage lines VL-B to receive the constant voltage or the signal therefrom. For example, the light blocking layer BML may receive the initialization voltage Vint, the anode initialization voltage Aint, the driving voltage ELVDD, and/or a the low power supply voltage ELVSS. In another embodiment, a light blocking layer BML may be provided in a form isolated from other electrodes or lines. As a constant voltage is applied to the light blocking layer BML, it is possible to prevent an electric potential due to a polarization phenomenon of the first sub-base layer 111 or the second sub-base layer 114 from affecting the first pixel circuit PC1.

Although not illustrated, the first light blocking layer BMLa of the second area A2 illustrated in FIG. 10 may be connected to an electrode or a line to receive a constant voltage or a signal therefrom. The voltage or the signal applied to the first light blocking layer BMLa may be different from the voltage or the signal applied to the light blocking layer BML. For example, the first light blocking layer BMLa may receive the driving voltage ELVDD (see FIG. 6). Alternatively, the voltage or the signal applied to the first light blocking layer BMLa may be the same as the voltage or the signal applied to the light blocking layer BML. In another embodiment, a first light blocking layer BMLa may be provided in a form isolated from other electrodes or lines.

As described above, the transmissive area may be defined by the opening of the light blocking layer, and the outermost conductive pattern disposed closest to the transmissive area among the components of the pixel circuit disposed on the light blocking layer may be disposed to be spaced apart from the edge of the light blocking layer by a predetermined distance or longer. As a result, the occurrence of defects such as burrs may be reduced or eliminated in the common electrode of the display panel.

In addition, the anti-reflection layer disposed on the display panel may include the division layer, and the edge of the division layer may be aligned with the edge of the light blocking layer. Accordingly, it is possible to reduce or eliminate the occurrence of a flare defect due to a portion of the light blocking layer viewed from the outside, or the occurrence of a defect that the boundary of the transmissive area becomes blurred.

Meanwhile, FIGS. 9, 10, and 11 illustrate that the anti-reflective layer 300 includes the black matrix 310, the color filter 320, and the planarization layer 330, but the disclosure is not limited thereto. In another embodiment, the anti-reflective layer 300 may include a reflection control layer on the black matrix 310, instead of the color filter 320. The reflection control layer may selectively absorb light of a certain band among pieces of light reflected from the inside of the display panel and/or the electronic device or pieces of light incident from the outside of the display panel and/or the electronic device.

FIGS. 9, 10, and 11 illustrate that the color filter 320 is in the opening of the black matrix 310. A reflection control layer according to another embodiment may be present in the opening of the black matrix 310.

For example, the reflection control layer may absorb a first wavelength band of about 490 nm to about 505 nm and a second wavelength band of about 585 nm to about 600 nm, so that light transmittance in the first wavelength band and the second wavelength band is about 40% or less. The reflection control layer may absorb light of wavelengths out of the wavelength ranges of red light, green light, and blue light respectively emitted from the first display element, the second display element, and the third display element. Because the reflection control layer absorbs light of wavelengths that do not belong to the wavelength ranges the red light, the green light, and the blue light emitted from the display elements, the reduction in the luminance of the display panel and/or the electronic device may be prevented or minimized. Also, the reduction in the luminescence efficiency of the display panel and/or the electronic device may be prevented or minimized, and the visibility of the display panel and/or the electronic device may be improved.

The reflection control layer may include an organic material layer including a dye, a pigment, and/or any combination thereof. The reflection control layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer may have a transmittance of about 64% to about 72%. The transmittance of the reflection control layer may be controlled according to the amount of the pigment and/or the dye included in the reflection control layer. The reflection control layer overlaps the display elements in a plan view, but does not overlap the transmission area TP in a plan view. In a plan view, the transmission area TP may overlap the planarization layer 330 without overlapping the reflection control layer.

According to the embodiment including the reflection control layer, a low reflection layer may be additionally between the common electrode CE and the encapsulation layer 140. The low reflection layer may be between the capping layer CPL and the encapsulation layer 140.

Due to the principle of constructive interference, the capping layer CPL may improve the luminescence efficiency of the display element. The capping layer CPL may include, for example, a material having a refractive index of about 1.6 or greater for light having a wavelength of about 589 nm.

The capping layer CPL may be an organic capping layer including an organic material, an inorganic capping layer including an inorganic material, or a composite capping layer including an organic material and an inorganic material. For example, the capping layer CPL may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer may be on the capping layer CPL. The low reflection layer may include an inorganic material having low reflectance. In an embodiment, the low reflection layer may include a metal or a metal oxide. When the low reflection layer includes a metal, the low reflection layer may include, for example, ytterbium (Yb), bismuth (Bi), cobalt (Co), molybdenum (Mo), titanium (Ti), zirconium (Zr), aluminum (Al), chromium (Cr)), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer includes a metal oxide, the low reflection layer may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and/or any combination.

In an embodiment, the inorganic material included in the low reflection layer may have an absorption coefficient (k) of greater than 0.5 and less than or equal to 4.0 ($0.5<k≤4.0$). Also, the inorganic material included in the low reflection layer may have a refractive index (n) of 1 or more ($n≥1.0$).

The low reflection layer induces destructive interference between light incident on the display panel and/or the electronic device and light reflected from the metal below the low reflection layer, so that external light reflectance may be reduced. Therefore, the display quality and visibility of the display panel and/or the electronic device may be improved.

In some embodiments, the capping layer CPL may be omitted and the low reflection layer may be in contact with the common electrode CE.

Although the embodiments of the inventive concept have been described herein, it is understood that various changes and modifications can be made by those skilled in the art within the spirit and scope of the inventive concept defined by the following claims or the equivalents. Therefore, the embodiments described herein are not intended to limit the technical spirit and scope of the present invention, and all technical spirit within the scope of the following claims or the equivalents will be construed as being included in the scope of the present invention.

What is claimed is:

1. An electronic device comprising:
   a display panel including a first area having a transmissive area and an element area, and a second area disposed adjacent to the first area; and
   an electronic module disposed below the first area of the display panel,
   wherein the display panel comprises:
   a substrate;
   a light blocking layer which is disposed on the substrate and has a first opening defining the transmissive area;
   a plurality of pixel circuits disposed on the light blocking layer; and
   a plurality of light emitting elements electrically connected to the plurality of pixel circuits, respectively,
   wherein the plurality of pixel circuits comprise outermost conductive patterns disposed adjacent to the transmissive area,
   wherein the light blocking layer comprises target portions each having a straight-line shaped edge in a plan view, and
   wherein a distance from an edge of each of the target portions to an edge of a corresponding one of the outermost conductive patterns is between about 5 micrometers and about 20 micrometers.

2. The electronic device of claim 1, wherein each of the plurality of pixel circuits further comprises a thin film transistor connected to a corresponding light emitting element among the plurality of light emitting elements, and wherein each of the outermost conductive patterns is disposed closer to the transmissive area than an active of the transistor.

3. The electronic device of claim 1, wherein the display panel further comprises a plurality of inorganic insulating layers disposed on the light blocking layer, and
   wherein each of the outermost conductive patterns is disposed on any one layer of the plurality of inorganic insulating layers.

4. The electronic device of claim 3, wherein the display panel further comprises a plurality of organic insulating layers disposed on the plurality of inorganic insulating layers,
   wherein a second opening disposed in an area corresponding to the transmissive area is defined in at least some inorganic insulating layers among the plurality of inorganic insulating layers, and
   wherein at least one of the plurality of organic insulating layers cover the second opening.

5. The electronic device of claim 4, wherein the plurality of organic insulating layers comprise:
   a first organic insulating layer disposed in an area corresponding to the second opening; and
   a second organic insulating layer which is disposed on the first organic insulating layer and including a third opening which is disposed in an area corresponding to the transmissive area, and
   wherein a minimum width of the third opening is greater than a minimum width of the first opening.

6. The electronic device of claim 5, wherein the outermost conductive pattern is disposed closer to the transmissive area than an edge of the second organic insulating layer.

7. The electronic device of claim 4, wherein the display panel further comprises:
   a pixel defining film disposed on the plurality of organic insulating layers; and
   a spacer disposed on the pixel defining film.

8. The electronic device of claim 1, wherein the display panel comprises:
   a plurality of first pixel groups disposed in the element area; and
   a plurality of signal lines connected to the plurality of first pixel groups, and
   wherein each of the outermost conductive patterns is disposed at an area where each of the plurality of first pixel groups is connected to an adjacent one of the first pixel groups through the plurality of signal lines.

9. The electronic device of claim 8, wherein each of the target portions is disposed at an area where a first light blocking pattern, which overlaps any one of the plurality of first pixel groups in a plan view, is connected to a light blocking connection part disposed adjacent to the first light blocking pattern.

10. The electronic device of claim 8, wherein the plurality of first pixel groups comprise:
    first connector pixel groups disposed adjacent to the second area among the plurality of first pixel groups; and
    first central pixel groups disposed to be spaced apart from the second area with the first connector pixel groups interposed between the first connector pixel groups and the first central pixel groups, and
    wherein a planar shape of each of first light blocking patterns, which are respectively disposed in the first central pixel groups is different from a planar shape of each of second light blocking patterns which are respectively disposed in the first connector pixel groups.

11. The electronic device of claim 10, wherein the first connector pixel groups comprise:
1-1st connector pixel groups disposed in a corner portion of the first area; and
1-2nd connector pixel groups disposed in a side portion of the first area,
wherein the second light blocking patterns comprise:
2-1st light blocking patterns respectively overlapping the 1-1st connector pixel groups; and
2-2nd light blocking patterns respectively overlapping the 1-2nd connector pixel groups,
wherein, in each of the 2-1st light blocking patterns, protrusion patterns which protrude toward the transmissive area are disposed in one quadrant disposed close to the transmissive area and protrusion patterns are not disposed in remaining three quadrants, and
in each of the 2-2nd light blocking patterns, protrusion patterns which protrude toward a transmissive area are disposed in two quadrants disposed close to the transmissive area and protrusion patterns are not disposed in remaining two quadrants.

12. The electronic device of claim 8, wherein the plurality of signal lines comprise outer signal lines at least one of which extend along an edge of each of the first pixel groups, and
wherein the outermost conductive patterns are included in the outer signal lines.

13. The electronic device of claim 12, wherein the outer signal lines comprise:
a 1-1st outer signal line extending in a horizontal direction and bypassing the pixel circuits over an upper side of the pixel circuits;
a 1-2nd outer signal line extending in the horizontal direction and bypassing the pixel circuits under a lower side of the pixel circuits;
2-1st outer signal lines extending in a vertical direction and bypassing the pixel circuits on a left side of the pixel circuits; and
2-2nd outer signal lines extending in the vertical direction and bypassing the pixel circuits on a right side of the pixel circuits,
wherein an outermost conductive pattern included in the 1-1st outer signal line is disposed on the same layer as an outermost conductive pattern included in the 2-2nd outer signal lines,
wherein an outermost conductive pattern included in the 1-2nd outer signal line is disposed on the same layer as an outermost conductive pattern included in the 2-1st outer signal lines, and
wherein the outermost conductive pattern included in the 1-1st outer signal line and the outermost conductive pattern included in the 1-2nd outer signal line are disposed on different layers.

14. The electronic device of claim 1, wherein a voltage line is connected to at least a portion of the light blocking layer and a driving voltage is applied to the light blocking layer through the voltage line.

15. The electronic device of claim 1, wherein the display panel further comprises:
an encapsulation layer configured to cover the plurality of light emitting elements; and
a sensor layer disposed on the encapsulation layer, and
wherein the sensor layer comprises a sensor base layer disposed on the encapsulation layer, a first sensor conductive layer disposed on the sensor base layer, a sensor insulating layer disposed on the first sensor conductive layer, a second sensor conductive layer disposed on the sensor insulating layer, and a sensor cover layer configured to cover the second sensor conductive layer, wherein the sensor base layer, the sensor insulating layer, and the sensor cover layer cover an area corresponding to the first opening.

16. The electronic device of claim 15, wherein the display panel further comprises an anti-reflection layer disposed on the sensor layer, and
wherein the anti-reflection layer comprises a division layer in which a plurality of division openings respectively disposed in areas corresponding to the plurality of light emitting elements are defined and a plurality of color filters disposed to respectively correspond to the plurality of division openings.

17. The electronic device of claim 16, wherein a transmissive opening overlapping the first opening is defined in the division layer and an edge of the transmissive opening is substantially aligned with an edge of the first opening.

18. The electronic device of claim 17, wherein the light blocking layer comprises a first protrusion pattern protruding toward the transmissive area and the division layer comprises a second protrusion pattern protruding toward the transmissive area, and
wherein an outer contour of the first protrusion pattern and an outer contour of the second protrusion pattern are substantially the same.

19. The electronic device of claim 1, wherein each of the plurality of light emitting elements comprises a pixel electrode, a light emitting layer disposed on the pixel electrode, and a common electrode disposed on the light emitting layer,
wherein the common electrode includes an electrode opening in an area corresponding to the first opening in a plan view, and
wherein a minimum width of the electrode opening is greater than a minimum width of the first opening.

20. The electronic device of claim 19, wherein each of the plurality of light emitting elements further comprises a first functional layer disposed between the pixel electrode and the light emitting layer and a second functional layer disposed between the light emitting layer and the common electrode, and
wherein the first functional layer and the second functional layer cover an area disposed in an area corresponding to the first opening.

21. The electronic device of claim 20, wherein the pixel electrode of each of the plurality of light emitting elements is disposed in the element area or the second area.

22. An electronic device comprising:
a display panel including a first area having a transmissive area and an element area, and a second area disposed adjacent to the first area; and
an electronic module disposed below the first area of the display panel,
wherein the display panel comprises:
a substrate;
a light blocking layer which is disposed on the substrate and has a first opening defining the transmissive area;
a plurality of light emitting elements disposed on the light blocking layer; and
an anti-reflection layer disposed on the plurality of light emitting elements,
wherein the anti-reflection layer comprises:

a division layer in which a plurality of division openings respectively disposed in areas corresponding to the plurality of light emitting elements are defined; and a plurality of color filters disposed in areas respectively corresponding to the plurality of division openings, and wherein the division layer includes a transmissive opening disposed in an area corresponding to the first opening and an edge of the transmissive opening is substantially aligned with an edge of the first opening in a plan view.

23. A display panel comprising a first area including a transmissive area and an element area, and a second area disposed adjacent to the first area, the display panel comprising:

a substrate;

a light blocking layer which is disposed on the substrate and includes a first opening;

a circuit layer which is disposed on the light blocking layer and includes a plurality of insulating layers and a plurality of conductive patterns;

a light emitting element layer which is disposed on the circuit layer and includes a plurality of light emitting layers disposed in an area spaced apart from the first opening in a plan view; and an encapsulation layer configured to cover the light emitting element layer, wherein the plurality of conductive patterns comprise outermost conductive patterns disposed adjacent to the transmissive area, wherein the light blocking layer comprises target portions each having a straight-line shaped edge in a plan view, and wherein a distance from an edge of each of the target portions to an edge of a corresponding one of the outermost conductive patterns is between about 5 micrometers and about 20 micrometers.

24. The display panel of claim 23, wherein each of the target portions is disposed at an area where a first light blocking pattern, which overlaps any one of a plurality of first pixel groups in a plan view, is connected to a light blocking connection part disposed adjacent to the first light blocking pattern.

* * * * *